United States Patent
Arnold et al.

(10) Patent No.: US 12,382,651 B2
(45) Date of Patent: Aug. 5, 2025

(54) POWER SEMICONDUCTOR DEVICE WITH AN AUXILIARY GATE STRUCTURE

(71) Applicant: Cambridge Enterprise Limited, Cambridge (GB)

(72) Inventors: Martin Arnold, Cambridge (GB); Sheung Wai Fung, Cambridge (GB); Loizos Efthymiou, Cambridge (GB); Florin Udrea, Cambridge (GB); John William Findlay, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 465 days.

(21) Appl. No.: 17/977,535

(22) Filed: Oct. 31, 2022

(65) Prior Publication Data

US 2023/0131602 A1    Apr. 27, 2023

Related U.S. Application Data

(63) Continuation-in-part of application No. 17/350,490, filed on Jun. 17, 2021, now Pat. No. 11,955,478,
(Continued)

(51) Int. Cl.
*H10D 30/47*    (2025.01)
*H03K 17/0814*  (2006.01)
(Continued)

(52) U.S. Cl.
CPC ..... *H10D 30/475* (2025.01); *H03K 17/08142* (2013.01); *H03K 17/302* (2013.01);
(Continued)

(58) Field of Classification Search
CPC ............ H01L 27/0727; H01L 27/0605; H01L 29/2003; H01L 29/42316; H01L 29/7786;
(Continued)

(56) References Cited

U.S. PATENT DOCUMENTS 5,939,941 A * 8/1999 Nair .............. H10D 84/01
                                          257/E27.012
6,111,289 A * 8/2000 Udrea ............. H10D 30/65
                                                257/288
(Continued)

FOREIGN PATENT DOCUMENTS

CN    101022128    8/2007
CN    101105518    1/2008
(Continued)

OTHER PUBLICATIONS

European Office Action from corresponding European Application No. 187 45691.8 mailed on Feb. 3, 2022, 17 pages.
(Continued)

*Primary Examiner* — Earl N Taylor
(74) *Attorney, Agent, or Firm* — Tarolli, Sundheim, Covell & Tummino LLP

(57) ABSTRACT

A heterojunction device having at least three terminals, the at least three terminals comprising a high voltage terminal, a low voltage terminal and a control terminal. The heterojunction device further comprises at least one main power heterojunction transistor, an auxiliary gate circuit comprising at least one first low-voltage heterojunction transistor, a pull-down circuit comprising a capacitor and a charging path for the capacitor. The heterojunction device further comprises at least one monolithically integrated component, wherein the capacitor is configured to provide an internal rail voltage for the at least one monolithically integrated component.

20 Claims, 55 Drawing Sheets

Related U.S. Application Data which is a continuation-in-part of application No. PCT/EP2020/062710, filed on May 7, 2020, which is a continuation of application No. 16/405,619, filed on May 7, 2019, now Pat. No. 11,404,565.

(51) Int. Cl.
| | |
|---|---|
| *H03K 17/30* | (2006.01) |
| *H03K 17/687* | (2006.01) |
| *H10D 1/47* | (2025.01) |
| *H10D 8/00* | (2025.01) |
| *H10D 8/60* | (2025.01) |
| *H10D 30/01* | (2025.01) |
| *H10D 62/10* | (2025.01) |
| *H10D 62/17* | (2025.01) |
| *H10D 62/824* | (2025.01) |
| *H10D 62/85* | (2025.01) |
| *H10D 64/23* | (2025.01) |
| *H10D 64/27* | (2025.01) |
| *H10D 84/01* | (2025.01) |
| *H10D 84/05* | (2025.01) |
| *H10D 84/80* | (2025.01) |
| *H10D 84/82* | (2025.01) |
| *H10D 84/84* | (2025.01) |
| *H10D 64/00* | (2025.01) |

(52) U.S. Cl.
CPC .............. *H03K 17/687* (2013.01); *H10D 1/47* (2025.01); *H10D 8/00* (2025.01); *H10D 8/60* (2025.01); *H10D 30/015* (2025.01); *H10D 62/824* (2025.01); *H10D 84/01* (2025.01); *H10D 84/05* (2025.01); *H10D 84/811* (2025.01); *H10D 84/817* (2025.01); *H10D 84/82* (2025.01); *H03K 2017/6875* (2013.01); *H10D 62/115* (2025.01); *H10D 62/343* (2025.01); *H10D 62/8503* (2025.01); *H10D 64/111* (2025.01); *H10D 64/256* (2025.01); *H10D 64/257* (2025.01); *H10D 64/411* (2025.01); *H10D 84/84* (2025.01)

(58) Field of Classification Search
CPC . H01L 29/1066; H01L 29/861; H01L 29/872; H01L 27/0629; H01L 27/0738; H01L 27/085; H10D 30/475; H10D 1/47; H10D 8/00; H10D 8/60; H10D 30/015; H10D 62/824; H10D 84/01; H10D 84/05; H10D 84/811; H10D 84/817; H10D 84/82; H10D 62/115; H10D 62/343; H10D 62/8503; H10D 64/111; H10D 64/256; H10D 64/257; H10D 64/411; H10D 84/84; H03K 2017/6875; H03K 17/08142; H03K 17/136; H03K 17/687; H03K 17/04123; H03K 17/08122; H03K 17/302

See application file for complete search history.

(56) References Cited

U.S. PATENT DOCUMENTS

| | | | |
|---|---|---|---|
| 8,017,978 B2 * | 9/2011 | Lidow ................ | H03K 17/567 257/195 |
| 8,470,652 B1 | 6/2013 | Brown | |
| 8,860,087 B2 | 10/2014 | Park et al. | |
| 9,882,553 B2 | 1/2018 | Kwan et al. | |
| 10,170,973 B1 | 1/2019 | Hirose | |
| 10,374,591 B2 | 8/2019 | Ramabhadran | |
| 10,411,681 B2 | 9/2019 | Kwan et al. | |
| 11,217,687 B2 | 1/2022 | Udrea et al. | |
| 11,257,811 B2 | 2/2022 | Arnold et al. | |
| 11,336,279 B2 | 5/2022 | Udrea et al. | |
| 11,404,565 B2 | 8/2022 | Udrea | |
| 2002/0113274 A1 * | 8/2002 | Iwagami .............. | H03K 17/163 257/213 |
| 2007/0247211 A1 * | 10/2007 | Brindle .............. | H03K 17/6871 327/365 |
| 2009/0065810 A1 * | 3/2009 | Honea ................ | H10D 64/411 257/192 |
| 2009/0072269 A1 * | 3/2009 | Suh ...................... | H10D 84/82 257/136 |
| 2009/0072272 A1 | 3/2009 | Suh et al. | |
| 2010/0258843 A1 * | 10/2010 | Lidow ................ | H10D 30/475 257/E21.403 |
| 2010/0321363 A1 * | 12/2010 | Morita ................ | G09G 3/2965 345/60 |
| 2011/0193171 A1 * | 8/2011 | Yamagiwa ........... | H10D 89/811 257/355 |
| 2011/0210377 A1 * | 9/2011 | Haeberlen ............. | H10D 84/01 257/E21.403 |
| 2011/0248283 A1 * | 10/2011 | Cao ...................... | H10D 64/251 257/E29.089 |
| 2011/0309372 A1 * | 12/2011 | Xin ...................... | H10D 84/811 257/E29.089 |
| 2012/0146051 A1 | 6/2012 | Park et al. | |
| 2012/0176116 A1 | 7/2012 | Kitagawa | |
| 2012/0228625 A1 | 9/2012 | Kentaro | |
| 2012/0292655 A1 | 11/2012 | Alessio et al. | |
| 2012/0292665 A1 | 11/2012 | Marino et al. | |
| 2012/0306545 A1 | 12/2012 | Machida et al. | |
| 2013/0009165 A1 | 1/2013 | Park et al. | |
| 2013/0082277 A1 | 4/2013 | Park et al. | |
| 2013/0092958 A1 | 4/2013 | Chen et al. | |
| 2013/0099247 A1 | 4/2013 | Palacios et al. | |
| 2013/0133358 A1 | 5/2013 | Ito | |
| 2013/0140578 A1 | 6/2013 | Yu et al. | |
| 2013/0181215 A1 | 7/2013 | Adekore et al. | |
| 2013/0241603 A1 | 9/2013 | Chen et al. | |
| 2013/0249622 A1 | 9/2013 | Honea et al. | |
| 2013/0334573 A1 | 12/2013 | Ostermaier et al. | |
| 2014/0001557 A1 | 1/2014 | Mishra et al. | |
| 2014/0015066 A1 | 1/2014 | Wu et al. | |
| 2014/0048850 A1 | 2/2014 | Jeon et al. | |
| 2014/0049296 A1 | 2/2014 | Jeon et al. | |
| 2014/0061647 A1 | 3/2014 | Werner | |
| 2014/0084966 A1 | 3/2014 | Takemae | |
| 2014/0091312 A1 | 4/2014 | Jeon et al. | |
| 2014/0103969 A1 | 4/2014 | Jeon et al. | |
| 2014/0138701 A1 | 5/2014 | Huang et al. | |
| 2014/0159119 A1 | 6/2014 | Derluyn et al. | |
| 2014/0319532 A1 | 10/2014 | Werner | |
| 2014/0319584 A1 | 10/2014 | Cai et al. | |
| 2014/0327043 A1 | 11/2014 | Kim et al. | |
| 2015/0108547 A1 | 4/2015 | Hwang et al. | |
| 2015/0171750 A1 | 6/2015 | Zeng et al. | |
| 2015/0243775 A1 | 8/2015 | Haeberlen et al. | |
| 2015/0255547 A1 | 9/2015 | Yuan et al. | |
| 2015/0357321 A1 | 12/2015 | Ikeda | |
| 2016/0172284 A1 | 6/2016 | Cho | |
| 2016/0308498 A1 | 10/2016 | Helms | |
| 2016/0322466 A1 | 11/2016 | Simin et al. | |
| 2016/0352321 A1 | 12/2016 | Yamaguchi | |
| 2016/0373106 A1 | 12/2016 | Shah | |
| 2017/0025405 A1 | 1/2017 | Jeon et al. | |
| 2017/0098649 A1 | 4/2017 | Ohori et al. | |
| 2017/0110448 A1 | 4/2017 | Prechtl et al. | |
| 2017/0125571 A1 | 5/2017 | Huang et al. | |
| 2017/0133498 A1 | 5/2017 | Okawa | |
| 2017/0148912 A1 | 5/2017 | Chu et al. | |
| 2017/0194477 A1 | 7/2017 | Lin et al. | |
| 2017/0345920 A1 | 11/2017 | Nagahisa et al. | |
| 2018/0145684 A1 | 5/2018 | Chang et al. | |
| 2018/0151568 A1 | 5/2018 | Sato et al. | |
| 2018/0182878 A1 | 6/2018 | Morvan | |
| 2018/0191338 A1 | 7/2018 | Ramabhadran et al. | |
| 2018/0323297 A1 | 11/2018 | Suh et al. | |
| 2018/0374943 A1 | 12/2018 | Liu et al. | |
| 2019/0036519 A1 | 1/2019 | Hu et al. | |

(56) References Cited

U.S. PATENT DOCUMENTS

| | | |
|---|---|---|
| 2019/0096877 A1 | 3/2019 | Kudymov et al. |
| 2019/0312137 A1 | 10/2019 | Ayman et al. |
| 2020/0007119 A1 | 1/2020 | Li et al. |
| 2020/0357906 A1 | 11/2020 | Udrea et al. |
| 2020/0357909 A1 | 11/2020 | Udrea et al. |
| 2021/0226621 A1 | 7/2021 | Chuang |
| 2021/0335781 A1 | 10/2021 | Arnold et al. |

FOREIGN PATENT DOCUMENTS

| | | | |
|---|---|---|---|
| CN | 104377198 | A | 2/2015 |
| EP | 0709962 | B1 | 10/2002 |
| EP | 2390919 | A2 | 11/2011 |
| EP | 2597767 | A2 | 5/2013 |
| EP | 2819164 | A2 | 12/2014 |
| JP | 2010051165 | A | 3/2010 |
| KR | 20160083256 | A | 7/2016 |
| WO | 2012055570 | A1 | 5/2012 |
| WO | 2019012293 | A1 | 1/2019 |

OTHER PUBLICATIONS

O. Ambacher et al., "Two-dimensional electron gases induced by spontaneous and piezoelectric polarization charges 1 n N- and Ga-face AlGaN/GaN heterostructures", Journal of Applied Physics 85, 3222, 1999, http:dx.doi. Jrg/10.1063/1.369664, 13 pages.

Bin Lu et al., "High-Performance Integrated Dual-Gate AlGaN/GaN Enhancement-Mode Transistor", IEEE Electron Device Letters, vol. 31, No. 9, Sep. 2010, pp. 990-992, 3 pages.

Eflhymiou et al., "On the physical operation and optimization of the p-GaN gate in normally-off GaN HEMT devices", Appl. Phys. Lett. 110, 123502, 2017, 6 pages.

Eflhymiou et al., "On the Source of Oscillatory Behaviour during Switching of Power Enhancement Mode GaN HEMTs", Energies, 2017, 11 pages.

Peijie Feng et al., "Design of Enhancement Mode Single-gate and Doublegate Multi-channel GaN HEMT with Vertical Polarity Inversion Heterostructure", Proceedings of The 25th International Symposium on Power Semiconductor Devices & ICs, Kanazawa, 4 pages.

GaN Systems Inc., "GN001 Application Guide Design with GaN Enhacement mode HEMT", Feb. 28, 2018, 45 pages.

GaN Systems Inc., Bottom-side cooled 650 VE-mode GaN transistor Preliminary Datasheet, 2009-2017, 6 pages.

Injun Hwang et al., "1.6kV, 2.9 mo cm2 Normally-0ff p-GaN HEMT Device", Proceedings of the 2012 24th Intemationa Symposium on Power Semiconductor Devices and ICs Jun. 3-7, 2012—Bruges, Belgium, pp. 41-44, 15 pages.

Infineon, "MOSFET Metal Oxide Semiconductor Field Effect Transistor", CoolMOS C7, Apr. 29, 2013, 4 pages.

Man Ho Kwan et al., "CMOS-Compatible GaN-0n-Si Field-Effect Transistors for High Voltage Power Applications", pp. 17.6.1-17.6.4, 2014, 3 pages.

Finella Lee et al., "Impact of Gate Metal on the Performance of p-GaN/AlGaN/GaN High Electron Mobility Transistors", pp. 232-234, IEEE Electron Device Letters, vol. 36, No. 3, Mar. 2015, 3 pages.

Silvia Lenci et al., "Au-Free AlGaN/GaN Power Diode on 8-in Si Substrate With Gated Edge Termination", pp. 1035-1037, IEEE Electron Device Letters, vol. 34, No. 8, Aug. 2013.

Umesh K. Mishra et al., "GaN-Based RF Power Devices and Amplifiers", Proceedings of the IEEE, vol. 96, No. 2, Feb. 2008.

Tohru Oka et al., "AlGaN/GaN Recessed MIS-Gate HFET With High-Threshold-Voltage Normally-Off Operation or Power Electronics Applications", IEEE Electron Device Letters, vol. 29, No. 7, Jul. 2008.

Hideyuki Okita et al., "Through Recessed and Regrowth Gate Technology for Realizing Process Stability of GaN-GITs", Proceedings of the 2016 28th International Symposium on Power Semiconductor Devices and ICs (ISPSD), Jun. 12-16, 2016, Prague, Czech Republic.

Yasuhiro Uemoto et al., "Gate Injection Transistor {GIT)—A Normally-Off AlGaN/GaN Power Transistor Using Conductivity Modulation", IEEE Transactions On Electron Devices, vol. 54, No. 12, Dec. 2007.

Michael J. Uren et al., "Buffer Design to Minimize Current Collapse in GaN/AlGaN HFETs", IEEE Transactions On Electron Devices, vol. 59, No. 12, Dec. 2012.

Wataru Saito et al., "Recessed-Gate Structure Approach Toward Normally Off High-Voltage AlGaN/GaN HEMT for Power Electronics Applications", IEEE Transactions On Electron Devices, vol. 53, No. 2, Feb. 2006.

Yong Cai et al., "High-Performance Enhancement-Mode AlGaN/GaN HEMTs Using Fluoride-Based Plasma Treatment", IEEE Electron Device Letters, vol. 26, No. 7, Jul. 2005.

Tsai Jung-Ruey et al., "Engineered threshold voltage in AlGaN/GaN HEMTs for normally-off operation", 2015 International Symposiun On Next-Generation Electronics (ISNE), IEEE, May 4, 2015, pp. 1-2, XPO32789065, DOI: 10.1109/ISNE.2015.7131989 section "Methodology"; figure 4, 2 pages.

Yu, Guohao, et al., "Dynamic Characterizations of AlGaN/GaN HEMTs with Field Plates Using a Double-Gate Structure", IEEE, vol. 34, No. 2, Feb. 2013, p. 217-219, 3 pages.

International Search Report and Written Opinion from correlating International Application No. PCT/EP2020/062710, mailed Aug. 24, 2020, 5 pages.

Jatal, Wael, et al: AlGaN HEMT based digital circuits on 3C-SiC{111}/Si(111) pseudosubstrates; Phys. Status Soligi A214, No. 4, 1600416; dated 2017, 6 pages.

Li He et al: "Design consideration of high power GaN inverter", 2016 IEEE 4th Workshop on Wide Bandgap Power Devices and Applications (WIPDA), IEEE, Nov. 7, 2016, pp. 23-29, XP033029812, DOI: 10.1109/WIPDA.2016.7799904, retrieved on Dec. 27, 2016, figure 11(b).

Extended European Search Report (EESR) for corresponding EP Patent Application No. 23161149.2, dated Jun. 30, 2023, pp. 1-13.

Extended European Search Report (EESR) for corresponding EP Patent Application No. 23161177.3, dated Jun. 29, 2023, pp. 1-14.

Wang Haiyong et al: "Lateral AlGaN/GaN Schottky Barrier Diode With Arrayed p-GaN Islands Termination", IEEE Transactions on Electron Devices, IEEE, USA, vol. 68, No. 12, Oct. 15, 2021, pp. 6046-6051, XP011890123, ISSN: 0018-9383, DOI: 10.1109/TED.2021.3118326, retrieved on Nov. 30, 2021, figures I(b)-I(e).

Chinese Office Action for CN application No. 202080034026.1, dated Sep. 10, 2024, 16 pages.

European Office Action for EP application No. 20 724 809.7, dated Oct. 21, 2024, 7 pages.

Engineered threshold voltage in AlGaN/GaN HEMTs for normally-off operation. TSAI et al.(2015) ISNE IEEE pp. 1-2 XP032789065.

Chinese Office Action dated Mar. 23, 2023; 25pgs.

International Search Report and Written Opinion from correlating International Application No. PCT/GB2018/051999, mailed Nov. 27, 2018, 19 pages.

Pending claims from U.S. Appl. No. 16/405,619, amended on Nov. 2, 2019, 6 pages.

\* cited by examiner

POWER SEMICONDUCTOR DEVICE WITH AN AUXILIARY GATE STRUCTURE

RELATED APPLICATION DATA

This application is a Continuation-in-Part of U.S. patent application Ser. No. 17/350,490, filed Jun. 17, 2021, which is a Continuation-in-Part of PCT Application No. PCT/EP2020/062710, filed on May 7, 2020, which claims priority from U.S. patent application Ser. No. 16/405,619, filed on May 7, 2019, the entireties of which are hereby incorporated herein by reference.

TECHNICAL FIELD

The present disclosure relates to a power semiconductor device, for example to a hetero-structure aluminium gallium nitride/gallium nitride (AlGaN/GaN) high electron mobility transistor (HEMT) or rectifier.

BACKGROUND

A power semiconductor device is a semiconductor device used as a switch or rectifier in power electronics (e.g., dc to ac inverter for motor control or dc to dc converter for switched-mode power supplies). A power semiconductor device is usually used in "commutation mode" (i.e., it is either on or off), and therefore has a design optimized for such usage.

In general, a power device has a rated voltage (i.e. the potential difference that the device has to withstand in the off-state between its main terminals) of over 20 V and conducts more than 100 mA during on-state. More commonly the rating of a power device is above 60V and above 1A. These values make the power devices very different from the low power devices, which operate with voltages below 5V and typical currents of under 1 mA and more commonly in the range of μAs or sub μAs. Another differentiation between power devices and other types of devices such as low power or RF, is that they operate mainly with large signals and they behave like switches. An exception to that is found in high voltage or power amplifiers, which use specialised power transistors.

Silicon bipolar junction transistors (BJT), metal-oxide-semiconductor field effect transistors (MOSFET) and insulated gate bipolar transistors (IGBT) are common types of power semiconductor switching devices. Their application areas range from portable consumer electronics, domestic appliances, hybrid and electric cars, motor control and power supplies to RF and microwave circuits and telecommunication systems.

Gallium Nitride (GaN) has increasingly been considered as a very promising material for use in the field of power devices with the potential to lead to increased power density, reduced on-resistance, and high frequency response. The wide band gap of the material ($E_g$=3.39 eV) results in high critical electric field ($E_c$=3.3 MV/cm) which can lead to the design of devices with a shorter drift region, and therefore lower on-state resistance, if compared to a silicon-based device with the same breakdown voltage [1]. The use of an AlGaN/GaN heterostructure also allows the formation of a two-dimensional electron gas (2 DEG) at the hetero-interface where carriers can reach very high mobility (μ=2000 $cm^2/(Vs)$) values [1]. In addition, the piezopolarization charge present at the AlGaN/GaN heterostructure, results in a high electron density in the 2 DEG layer (e.g. $1\times10^{13}$ $cm^{-2}$). These properties allow the development of High Electron Mobility Transistors (HEMTs) and Schottky barrier diodes with very competitive performance parameters [2], [3]. An extensive amount of research has focused on the development of power devices using AlGaN/GaN hetero-structures.

However, the 2DEG which inherently exists at the AlGaN/GaN hetero-interface creates a challenge when attempting the design of normally-off rather than normally-on devices. Nonetheless, as normally-off transistors are preferable in most power electronic applications several methods have been proposed which can lead to enhancement mode devices, among them the use of metal insulator semiconductor structures [4], use of fluorine treatment [5], recessed gate structures [6] and use of a p-type cap layer [7][8]. Due to the relative maturity and controllability in the epitaxial growth of pGaN layers compared to the other techniques, pGaN/AlGaN/GaN HEMTs are considered the leading structure for commercialization.

FIG. 1 shows schematically the cross section in the active area of a state of the art pGaN HEMT. The device shown is a lateral three-terminal device with an AlGaN/GaN hetero-structure grown epitaxially on a standard silicon wafer 4. A transition layer 3 is used to allow a high quality GaN layer 2 to be grown despite the significant lattice mismatch between GaN and Si. Carbon p-type doping is often added in the GaN layer [9]. Finally, a thin cap GaN layer 11 is typically added to form the gate with a Magnesium (Mg) p-type doping density greater than $1\times10^{19}$ $cm^{-3}$.

A typical pGaN gate device has a threshold voltage of ~1.5-2V and gate opening bias voltage of ~8V. Threshold voltage and gate opening voltage in enhancement mode GaN devices are of great interest as problems such as unwanted device turn-on when the device is supposed to be off may occur in operation if threshold voltage is low. Secondly, gate turn-on may be a problem due to the non-insulated gate structure. It is therefore apparent that the pGaN gate device operates with a gate voltage in the range of 2V to 8V and preferably between 5 to 7V, to minimise the on-state resistance of the device while ensuring a low leakage through the gate (below the opening voltage).

In the state of the art device a trade-off exists between the threshold voltage of the device and the carrier density in the 2 DEG of the device and consequently the device on-state resistance. A previous study has shown that for a pGaN doping greater than $1\times10^{19}$ $cm^{-3}$ the threshold voltage cannot be significantly altered by the use of a different gate metal or the thickness of the pGaN layer [10]. A narrow window of operation is therefore specified in these devices (with gate voltages in the range of 4V to 7V with respect to the source) [11] unlike their silicon counterparts [12]. The lower boundary is defined by the gate bias needed to fully form the channel (2 DEG) below the gate (this is referred to as the threshold voltage, Vth), and the upper boundary is limited by the point at which the gate turns on and considerable current starts flowing through it.

Another area of interest in AlGaN/GaN HEMTs is their fast switching capability. The high mobility of carriers in the 2 DEG and a shorter drift region for a given breakdown due to higher critical electric field can lead to very low drift region charge, Qgd. Furthermore, the device gate charge Qg is about an order of magnitude lower than corresponding state of the art silicon devices [11], [12]. Therefore, the GaN HEMTs can switch at much higher speeds than silicon MOSFETs. While this is beneficial in many applications, it can lead to unwanted oscillations due to parasitic components present both at the device and circuit level [13]. A possible solution proposed in order to avoid the oscillatory behaviour is to add an external gate resistance to the device in order to reduce the dV/dt and dI/dt rate observed [13].

In [14], an attempt to enlarge the window of operation defined by the threshold voltage and the opening of the pGaN/AlGaN junction has been made by varying the composition of the gate metal. This attempt resulted to be unsuccessful as discussed in [10] where it is showed that for a pGaN doping greater than $1 \times 10^{19}$ cm$^{-3}$ the threshold voltage cannot be significantly altered using a different gate metal or by altering the thickness of the pGaN layer.

In [16] a higher Vth on a P-gate technology has been obtained via 'Through Recessed and Regrowth Gate (TRRG)' technique. This process technology is based on a complete removal of the AlGaN barrier layer and subsequent regrowth of it by epitaxial regrowth. This demonstrates more stable threshold voltages at increasing temperatures and the possibility to reach Vth as high as 2.3V by controlling the thickness of the AlGaN layer. Although this is an interesting process technology to obtain a stable threshold voltage, it does affect the Ron when a Vth>2V is achieved. Moreover, the high Vth solution presented in [16] does not address the problem of the Rg-related oscillations during the fast switching of the high voltage transistor, nor the high gate leakage of the pGaN gate technology.

In [17] an integrated double-gate technology for achieving high Vth (>2.8V) is demonstrated. The double-gate technology suggested in [17] is based on the integration of a high voltage normally-on (D-Mode) and low voltage normally-off (E-Mode) GaN transistors. In this configuration however, the two transistors are in series and the overall on-state resistance will therefore be affected by the series contribution of the on-state resistance of the low voltage device.

Other proposed double-gate technologies are present in literature and they are so called as they feature a second gate electrode either on top of the gate passivation layer [18] or buried into the heterostructures stack [19]. These devices mainly aim at improving the dynamic performance of the transistors by alleviating the current collapse phenomenon. The current collapse phenomenon is in fact a current reduction in the on-state, when the device is repeatedly stressed to high voltages in the off-state.

An attempt to increase the Vth of a normally-off (enhancement mode—E-Mode) GaN transistor using a circuit configuration with diodes and a second gate electrode is made in [20]. In this document the diodes are used as voltage shifters and are connected in series with the gate of the high-voltage GaN devices. A device where the voltage shifter is achieved with a transistor is also described. In this particular case, however, the drain terminal of the voltage-shifter-transistor is connected with the high-voltage drain terminal of the GaN device. The implication of such connection is that the driving device will have to sustain the high voltage in blocking mode and therefore be designed as a high voltage transistor with a longer drift region than for a low-voltage device. The device will therefore have increased area consumption and reliability of this additional transistor has to be taken into account. In addition in [20] no mention is made of the upper boundary limitation.

Resistive loads connected between the gate and source of GaN HEMTs or Power MOSFETs in general are also known and their aim can vary from reducing the oscillations during high voltage switching, protecting the device against electro-static discharge and in general ensuring a robust operation. For example, in the data sheet of the GaN Systems parts [21] a 3 kΩ resistor is recommended to be added between the gate terminal (gate bus) and the source (or ground).

In US 9882553B2 and US10411681B2 a device which enlarges the operation window of a III-V semiconductor device is described.

In US10374591B2 a gate drive circuit is described for controlling operation of a wide bandgap semiconductor switch.

In US2020007119A1 a voltage regulating circuit implemented in GaN HEMT technology in order to provide a stable output voltage suitable for use in applications such as GaN power transistor gate drivers and low voltage auxiliary power supplies for GaN integrated circuits is described.

SUMMARY

According to an aspect of this invention, we herein describe a heterojunction device having at least three terminals, the at least three terminals comprising a high voltage terminal, a low voltage terminal and a control terminal, wherein the heterojunction device further comprises;

at least one main power heterojunction transistor, wherein the at least one main power heterojunction transistor comprises an internal gate terminal, a source terminal and a drain terminal, wherein the source terminal of the at least one main power heterojunction transistor is operatively connected to the low voltage terminal and the drain terminal of the at least one main power heterojunction transistor is operatively connected to the high voltage terminal;

an auxiliary gate circuit comprising at least one first low-voltage heterojunction transistor, wherein the auxiliary gate circuit is operatively connected to the internal gate terminal of the at least one main power heterojunction transistor and to the control terminal;

a pull-down circuit operatively connected to an internal gate terminal of the at least one first low-voltage heterojunction transistor and to the source terminal of the at least one main power heterojunction transistor, the pull-down circuit comprising:

a capacitor; and a charging path for the capacitor;

the heterojunction device further comprising at least one monolithically integrated component, wherein the capacitor is configured to provide an internal rail voltage for the at least one monolithically integrated component.

The pull-down circuit may comprise at least one non-linear element and at least one second low-voltage heterojunction transistor, the non-linear element comprising a potential divider for driving the gate terminal of the at least one second low-voltage heterojunction transistor. Additionally or alternatively, the pull-down circuit may comprise at least one source-gate connected or drain-gate connected low voltage enhancement mode heterojunction transistor.

In embodiments, the capacitor is operatively connected to the control terminal by the charging path, and the charging path comprises at least one of a current source and a resistor. In other embodiments, the capacitor is operatively connected to the drain terminal of the at least one main power heterojunction transistor by the charging path, and the charging path comprises at least one depletion mode transistor.

The internal rail voltage may be controlled by a voltage across the capacitor. Optionally, the voltage across the capacitor may be limited by the pull-down circuit, and/or the capacitor may be operatively connected to the high voltage terminal by a second charging path, and the second charging path comprises at least one depletion mode transistor. If charging only occurs through the second charging path, the voltage across the capacitor may be limited by an absolute value of a threshold voltage of the depletion mode transistor.

In embodiments, the heterojunction device further comprises an external rail voltage terminal, wherein a rail voltage may be provided.

In other embodiments, the heterojunction further comprises a gate voltage to logic signal clamping circuit configured to receive an input signal and provide a magnitude limited output signal, wherein a magnitude of the output signal is limited to a set maximum voltage. The gate voltage to logic clamping circuit may also be referred to as a logic clamping circuit.

Various implementations may be provided for the logic signal clamping circuit. In a first implementation, the logic signal clamping circuit may comprise a current source operatively connected in series between an input source and the output, and one or more enhancement mode transistors operatively connected in series between the current source and a ground terminal, wherein the set maximum voltage of the output signal is based on a number of the one or more enhancement mode transistors.

In another implementation, logic signal clamping circuit may comprise a current source operatively connected in series between an input source and the output, and a threshold multiplier circuit operatively connected between the current source and a ground terminal, and wherein the set maximum voltage of the output signal is based on a ratio of resistors forming the threshold multiplier circuit. Optionally, the device may also comprise a second capacitor operatively connected in parallel to the current source.

In a further implementation, the logic signal clamping circuit may comprise a current source operatively connected in series between an input source and the output, an enhancement mode transistor comprising a second source terminal connected to the current source and a second gate terminal connected to a fixed voltage source, and a resistor operatively connected between a second drain terminal of the enhancement mode transistor and a ground terminal. The gate voltage to logic signal clamping circuit may be configured such that the magnitude of a difference between the output signal voltage and the fixed voltage cannot be greater than an absolute value of a threshold voltage of the enhancement mode transistor.

The heterojunction device may additionally comprise a DC to DC converter circuit, e.g. forming a linear voltage regulator.

The DC to DC converter block may comprise:
an input terminal;
an output terminal;
a first transistor;
a current source connected between the input terminal and a second drain terminal of the first transistor;
a potential divider circuit, wherein a midpoint of the potential divider is connected to a second gate terminal of the first transistor; and
a second transistor connected in series between the input terminal and the output terminal, wherein a third gate terminal of the second transistor is connected to the second drain terminal of the first transistor.

At least one of the first and second transistors may be an enhancement or depletion mode transistor.

Alternatively, the DC to DC converter block may comprise:
an input terminal;
an output terminal;
one or more first enhancement mode transistors connected in series and configured to form a voltage multiplier structure;
a current source connected between the input terminal and a second drain terminal of the first enhancement mode transistors;
a second transistor connected in series between the input terminal and the output terminal, wherein a third gate terminal of the second transistor is connected to the second drain terminal of the one or more first enhancement mode transistors.

The one or more first enhancement mode transistors may be source-gate connected or drain-gate connected.

In embodiments, the heterojunction device comprises a multi-stage inverter, wherein the multi-stage inverter comprises:
a first stage configured to receive the internal rail voltage as an input voltage, the first stage comprising:
a first stage enhancement mode transistor; and
a current source operatively connected between a source terminal of the enhancement mode transistor and a fixed voltage source; and
a second stage comprising:
a second stage enhancement mode transistor, wherein a gate terminal of the enhancement mode transistor is connected to an output of the first stage;
a second stage capacitor; and
a further second stage transistor, wherein the capacitor and the further second stage transistor are connected in parallel to the first stage, and wherein a gate terminal of the first stage enhancement mode transistor and a gate terminal of the further second stage transistor are operably connected;
the inverter further comprising one or more source-gate connected transistors in series between the voltage source and the current source, the one or more transistors configured to level shift a voltage from the voltage source.

The at least one monolithically integrated component of the heterojunction device may comprise the multi-stage inverter. In this case, the fixed voltage source may be the internal rail voltage provided by the capacitor.

According to a further aspect of the invention, we herein describe a GaN chip or GaN integrated circuit comprising the heterojunction device described above.

According to a further aspect of the invention, there is provided a heterojunction chip having at least three terminals, the at least three terminals comprising a high voltage terminal, a low voltage terminal and a control terminal, wherein the heterojunction chip further comprises;
at least one main power heterojunction transistor, wherein the at least one main power heterojunction transistor comprises an internal gate terminal, a source terminal and a drain terminal, wherein the source terminal of the at least one main power heterojunction transistor is operatively connected to the low voltage terminal and the drain terminal of the at least one main power heterojunction transistor is operatively connected to the high voltage terminal;
an auxiliary gate circuit comprising at least one first low-voltage heterojunction transistor, wherein the auxiliary gate circuit is operatively connected to the internal gate terminal of the at least one main power heterojunction transistor and to the control terminal;
a pull-down circuit comprising at least one non-linear element and at least one second low-voltage heterojunction transistor, the non-linear element comprising a potential divider for driving the gate terminal of the at least one second low-voltage heterojunction transistor, wherein the pull-down circuit is operatively connected to an internal gate terminal of the at least one first low-voltage heterojunction transistor and to the source terminal of the at least one main power heterojunction transistor;

a current control circuit comprising at least one resistor, wherein the current control circuit is operatively connected to the control terminal and to the pull-down circuit; and wherein the auxiliary gate and current control circuits at least partially control a voltage and a current into the internal gate of the at least one main power heterojunction transistor; and at least one monolithically integrated component, the at least one monolithically integrated component being one or more of a DC to DC converter circuit, a voltage regulator, and a gate voltage to logic signal clamping circuit;

wherein the gate voltage to logic signal clamping circuit is configured to receive an input signal and provide a magnitude limited output signal, wherein a magnitude of the output signal is limited to a set maximum voltage, and wherein the gate voltage to logic signal clamping circuit comprises a current source operatively connected in series between an input source and the output; and wherein the current control circuit at least partially controls a current into the pull down circuit and at least partially determines a control terminal voltage level at which the pull-down circuit actively pulls down a gate voltage of the at least one first low-voltage heterojunction transistor to clamp a voltage of the internal gate of the at least one main power heterojunction transistor.

Various implementations may be provided for the gate voltage to logic signal clamping circuit. In a first implementation, the gate voltage to logic signal clamping circuit may further comprise one or more enhancement mode transistors operatively connected in series between the current source and a ground terminal, wherein the set maximum voltage of the output signal is based on a number of the one or more enhancement mode transistors.

In another implementation, gate voltage to logic signal clamping circuit may further comprise a threshold multiplier circuit operatively connected between the current source and a ground terminal, and wherein the set maximum voltage of the output signal is based on a ratio of resistors forming the threshold multiplier circuit. Optionally, the device may also comprise a second capacitor operatively connected in parallel to the current source.

In a further implementation, the gate voltage to logic signal clamping circuit may further comprise an enhancement mode transistor comprising a second source terminal connected to the current source and a second gate terminal connected to a fixed voltage source, and a resistor operatively connected between a second drain terminal of the enhancement mode transistor and a ground terminal. The gate voltage to logic signal clamping circuit may be configured such that the magnitude of a difference between the output signal voltage and the fixed voltage cannot be greater than an absolute value of a threshold voltage of the enhancement mode transistor.

Further disclosed herein is provided a solution for a p-gate GaN E-Mode transistor for concomitantly (i) leads to a reduction in the gate leakage current (ii) an increase in the threshold voltage, and (iii) an increase in the gate voltage operation window. The result of these three features are (i) avoidance of turn-on retriggering during the turn-off and limitations of oscillations in certain turn-off conditions where high dV/dt rates are present (ii) improves the switching performance of the overall configuration via an integrated pull-down network.

This disclosure proposes a GaN power device that has the ability of a high threshold voltage, a significantly large gate voltage operation range with less or no risk of p-GaN junction opening, and oscillation-free or oscillation-reduced switching behaviour. The details of this invention will be discussed considering but not limited to a pGaN gate E-Mode technology.

GaN transistors that utilise this disclosure are intended but not limited to applications in low to medium voltage range. The lower voltage capability devices (<200V but higher than 20V) would be suitable for point-of-load applications i.e. low voltage DC-DC converters for IT or consumer electronics applications. Such devices can also be used in linear electronics to increase efficiency, a large market potential however exists at the 600V range for applications such as power factor correction (PFC), un-interrupted power supplies (UPS), motor drives, and photovoltaic (PV) system inverters. 600V GaN devices can also find use as chargers in hybrid electric vehicles (HEV) and/or electric vehicles (EV), a market which is growing at an enormous pace. GaN transistors with breakdown capabilities up to 1.2 kV and power ratings which can reach 7.2 kW can lead to GaN transistors being used in EV and HEV converters and inverters where the high frequency of operation will allow a reduction in system size, a parameter which is significant when considering mobile systems. Ultimately, if the power rating is extended enough GaN transistors could find application in wind turbines (1.7 kV). Recent applications which require reliable operation in the MHz regime such as wireless charging in both IT (mobile phones, laptop) and automotive (EV, HEV) sectors may be very suitable for this disclosure. Additionally, applications beyond power conversion are also envisioned such as class D audio amplifiers.

Broadly speaking, the disclosure relates to power semiconductor devices using GaN technology. The disclosure proposes an integrated auxiliary gate terminal and a pull-down network to achieve a normally-off (E-Mode) GaN transistor with threshold voltage higher than 2V, low gate leakage current and possibly enhanced switching performance. The high threshold voltage GaN transistor has a high-voltage active GaN device and an auxiliary GaN device, which could be preferably a low-voltage device, wherein the high-voltage GaN device has the gate connected to the source of the integrated auxiliary GaN transistor and the drain being the external high-voltage drain terminal and the source being the external source terminal, while the auxiliary GaN transistor has the gate (first auxiliary electrode) connected to the drain (second auxiliary electrode) functioning as an external gate terminal. In other embodiments a pull-down network for the switching-off of the high threshold voltage GaN transistor is formed by a diode, a resistor, or a parallel connection of both connected in parallel with the auxiliary GaN transistor.

In other embodiments a pull down network for the switching off of the active (high voltage) GaN transistor is formed by additional auxiliary low-voltage GaN transistors and resistive elements connected in parallel or in series with the low-voltage auxiliary GaN transistor.

In other embodiments, a pull down network for the switching off of the active (high voltage) GaN transistor is formed by an active Miller clamp.

In other embodiments, an overvoltage protection circuit is formed by resistors or resistive elements and a low voltage enhancement mode (or depletion mode) transistor to limit the maximum potential at the gate of the active (high voltage) transistor.

In other embodiments, an over-current protection circuit is formed by a current sensing resistor or resistive element and a low voltage enhancement mode (or an active depletion mode) transistor to act as protection from over-current events.

Further described herein is a heterojunction (Gallium Nitride) chip (also named or termed as GaN chip or GaN power integrated circuit or GaN smart device or a GaN high voltage integrated circuit) having at least three terminals, a high voltage terminal, a low voltage terminal and a control terminal, and containing at least one high-voltage active GaN device (also referred to as main power heterojunction transistor) having an internal gate and, its source and drain connected to the low voltage and high voltage terminals of the GaN chip respectively, a pull-down circuit, an auxiliary gate circuit containing at least one low-voltage heterojunction transistor, and a current control circuit where:

the auxiliary gate circuit has one connection to the internal gate of the said at least one main power heterojunction transistor, a second connection to the control terminal, and at least one more connection which links the gate of the at least one low-voltage heterojunction transistor to the pull down circuit;

the pull-down circuit has at least one connection to the current control circuit and one connection to the source terminal of the said at least one main power heterojunction transistor;

the current control circuit has one connection to the control terminal and where the auxiliary gate partly controls the voltage and the current levels into the internal gate of the at least one main power heterojunction transistor, the current control circuit controls the current level into the pull down circuit and in conjunction with the pull down circuit design determines the voltage level applied to the control terminal at which the pull-down circuit actively pulls down the gate voltage of the said at least one low-voltage heterojunction transistor to clamp the voltage of the internal gate of the at least one main power heterojunction transistor.

The integrated auxiliary gate block (circuit) in the GaN chip is composed of an auxiliary GaN transistor, which could be preferably a low-voltage device, wherein the high-voltage active GaN device (main power heterojunction transistor) has the gate connected to the source of the integrated auxiliary GaN transistor and the auxiliary GaN transistor has the drain connected to the GaN chip control terminal.

The integrated current control block (circuit) is connected between the drain and gate terminal of the auxiliary GaN transistor.

An integrated pull-down circuit block (circuit) is connected between the gate terminal of the auxiliary GaN transistor and the source terminal of the high voltage active GaN device.

The threshold voltage of the GaN chip (the potential applied to the control terminal of the GaN chip with respect with its low voltage terminal at which the main power heterojunction transistor starts conducting current) could be higher than the intrinsic threshold voltage of the main power heterojunction transistor alone. This could be achieved by an additional voltage drop across the integrated auxiliary gate block when a voltage signal is applied on the control terminal of the GaN chip (also termed the external gate terminal). The potential on the internal gate (also termed active gate terminal) is therefore lower than the potential applied to the control terminal of the GaN chip.

The voltage drop across the auxiliary gate block (circuit) is non-linear when the voltage signal on the external gate terminal (control terminal) increases linearly.

The low gate leakage current for the high voltage active GaN device (main power heterojunction transistor) is achieved by limiting the potential on the internal gate (active gate) terminal. This is achieved by allowing for a voltage drop across the integrated auxiliary gate block. The limit on the potential of the active gate terminal is defined by designing the current control block and pull-down circuit block appropriately such that the gate of the auxiliary gate transistor is pulled down when the gate signal on the external gate terminal (control terminal of the GaN chip) increases beyond a certain level. The gate voltage operation window of the GaN chip (i.e. the voltage operation window applied to the control terminal) is therefore increased compared to that of a conventional GaN HEMT.

The maximum voltage signal that can be applied to the external gate of the device (the control terminal of the GaN chip) can be designed to be above 10V (e.g. 20V) such that conventional Silicon gate drivers and controllers can be used to drive the GaN chip.

Furthermore, the current control block (and other circuits) need to be appositely designed such that a balance between fast turn-on, avoiding overshoot of the active gate terminal (internal gate terminal) during turn-on and a low gate driver power consumption during the on-state operation of the device is achieved.

The integrated current control circuit (current control block) may be a resistive element or incorporate a resistive element. Alternatively, the current control circuit may be or comprise a current source. The current source may be composed of a low-voltage depletion mode HEMT and a resistive element. The resistive element can be connected between the gate and source terminal of the low-voltage depletion mode HEMT. The drain terminal of the depletion mode HEMT is connected to the drain terminal of the auxiliary gate HEMT and the gate terminal of the depletion mode HEMT is connected to the gate terminal of the auxiliary gate HEMT.

In similar embodiments, an RCL network could be included in parallel to the resistive element or the current source to improve the dynamic characteristic during the device turn-on or turn-off transients.

The current control block may further include a circuit creating an additional voltage drop. The current control block may further include a circuit that adapts the current in the current control block depending on the operating condition, such as switching, on or off condition. Such a current adaption circuit may include a depletion mode HEMT or an enhancement mode HEMT in series or in parallel with the resistive element in the current source.

In some embodiments the integrated pull-down circuit (block) can be or comprise one or several HEMTs in parallel or in series. The gate potentials of said pull-down HEMTs are controlled to set the voltage drop across the pull-down HEMT and therefore setting the gate voltage of the auxiliary gate block and the voltage drop across the auxiliary gate block.

The pull-down circuit block may further comprise elements to compensate or reduce the effect of temperature on the voltage drop across the pull-down circuit block.

The pull-down circuit may comprise one or more diodes in series with a DC or actively switched voltage source. The diodes may be HEMT-diodes.

The diodes may comprise HEMT transistors having a source and gate connected together. In this case, a gate voltage of the auxiliary gate block is given by the voltage source and a voltage drop across the one or more diodes.

In another embodiment, the auxiliary gate may include a low voltage depletion mode transistor rather than a low voltage enhancement mode transistor. This embodiment might not be as effective in achieving an increased threshold voltage for the GaN chip but can achieve an increased operation range by allowing an increase in the maximum allowable control signal (external gate signal) level. The depletion mode GaN transistor might be used as part of the turn-off network of the device as the channel in the depletion mode transistor is present when the potential on the active gate is high and the potential at the external gate terminal is low.

In other embodiments, some or all of the functional blocks described can be used together to add enhanced functionality.

Since the auxiliary GaN Transistor would preferably be a low voltage device, its source and drain terminal could be interchanged as they are commonly made in a symmetrical (or similar) way. By a low-voltage device, we mean a device that can typically have a rated breakdown below 20V and limited current capability (under 100 mA). However, it should be understood that the auxiliary gate could also be a high power or high voltage device, although this may add cost and complexity.

Most of the embodiments according to this disclosure described here are concerned with an integrated auxiliary transistor, whereby the auxiliary transistor and the active transistor are made on the same substrate (in the same chip). While the integration of the two could be advantageous for several reasons, such as fewer pads, low area consumption, compact size, lower cost and lower complexity, the auxiliary transistor could also be made on a separate substrate and connected to the active transistor in a discrete or hybrid way. The auxiliary and the active transistors could be placed side by side in the same package or module or discretely connected on a board and not necessarily integrated within the same GaN chip.

This could also apply to the other functional blocks described.

Further described herein is a III-nitride semiconductor based heterojunction power device, comprising:
an active heterojunction transistor formed on a substrate, the active heterojunction transistor comprising:
a first III-nitride semiconductor region comprising a first heterojunction comprising an active two dimensional carrier gas of second conductivity type;
a first terminal operatively connected to the III-nitride semiconductor region;
a second terminal laterally spaced from the first terminal and operatively connected to the III-nitride semiconductor region;
an active gate region formed over the III-nitride semiconductor region, the active gate region being formed between the first terminal and the second terminal;
an auxiliary heterojunction transistor formed on the said substrate or a further substrate, the auxiliary heterojunction transistor comprising:
a second III-nitride semiconductor region comprising a second heterojunction comprising an auxiliary two dimensional carrier gas of second conductivity type;
a first additional terminal operatively connected to the second III-nitride semiconductor region;
a second additional terminal laterally spaced from the first additional terminal and operatively connected to the second III-nitride semiconductor region;
an auxiliary gate region formed over the second III-nitride semiconductor region, the auxiliary gate region being formed between the first additional terminal and the second additional terminal;
wherein the first additional terminal is operatively connected with the auxiliary gate region, and wherein the second additional terminal is operatively connected with the active gate region,
wherein the auxiliary heterojunction transistor is a first auxiliary heterojunction transistor, and wherein the heterojunction power device further comprises a second auxiliary heterojunction transistor which is operatively connected in parallel with the first auxiliary transistor, and wherein the first additional terminal of the first auxiliary heterojunction transistor is operatively connected to a source terminal of the second auxiliary heterojunction transistor, and the second additional terminal of the first auxiliary heterojunction transistor is operatively connected to a drain terminal of the second auxiliary heterojunction transistor,
wherein the auxiliary heterojunction transistor is configured to (or the addition of the auxiliary heterojunction transistor) result in an increase in a threshold voltage of said heterojunction power device and/or an increase in an operation voltage range of the first additional terminal.

Here the term "operatively connected" means the terminals are electrically connected. In other words, the first additional terminal and the auxiliary gate are electrically connected, and the second additional terminal and the active gate region are electrically connected. Furthermore, in one embodiment, the first terminal is a source terminal of the active transistor, and the second terminal is a drain terminal of the active transistor. On the other hand, the first additional terminal is a drain terminal of the auxiliary transistor and the second additional terminal is a source terminal of the auxiliary transistor. In embodiments, the connected first additional terminal and the auxiliary gate region form a high voltage terminal (or form an external gate terminal) in which a relatively higher voltage is applied compared to the second additional terminal. Therefore, the second additional terminal can be termed as a low voltage terminal of the auxiliary transistor. Here the term "III-nitride semiconductor region" generally refers to an entire region comprising a GaN layer and an AlGaN layer formed on the GaN layer. The two dimensional carrier gas is generally formed at the interface between the GaN layer and the AlGaN layer within the III-nitride semiconductor region. In embodiments, the two dimensional carrier gas refers to two dimensional electron gas (2 DEG) or two dimensional hole gas (2 DHG).

When integrated on the same substrate (monolithic integration), the heterojunction power device may further comprise an isolator region between the active heterojunction transistor and the auxiliary heterojunction transistor. The isolator region separates the active two dimensional carrier gas and the auxiliary two dimensional carrier gas. Isolator region may separate the first and second III-nitride semiconductor regions.

In use, when the first additional terminal and the auxiliary gate region may be biased at a potential (or a voltage), a carrier density in a portion of the auxiliary two dimensional carrier gas underneath the auxiliary gate region is controlled such that an auxiliary two dimensional carrier gas connection is established between the first and second additional terminals. Generally, there is a two dimensional electron gas (2DEG) formed underneath the first and second additional terminals. When a voltage is applied to the auxiliary gate region (or the high voltage terminal), it controls the carrier density in the 2DEG underneath the auxiliary gate so that a 2DEG connection is formed between the 2DEG underneath the first and second additional terminals.

The active gate region may be configured to be switched on through the auxiliary two dimensional carrier gas (e.g. 2DEG) connection between the first and second additional terminals. The resistance variation from the 2DEG connection underneath the auxiliary gate region enables to turn on the active gate as well. The auxiliary 2DEG connection may serve as an internal resistance to the active gate region. Such an internal gate resistance could be useful to slow down the fast dV/dt during switching or prevent high oscillations caused by di/dt effects.

The first additional terminal and the auxiliary gate region may be configured such that a part of the potential is used to form the auxiliary 2DEG connection and a further part of potential is used to switch on the active gate region.

The first III-nitride semiconductor region may comprise an active aluminium gallium nitride (AlGaN) layer directly in contact with the first terminal, the active gate region and the second terminal.

The second III-nitride semiconductor region may comprise an auxiliary aluminium gallium nitride (AlGaN) layer directly in contact with the first additional terminal, the auxiliary gate region and the second additional terminal.

The thickness of the active AlGaN layer and the auxiliary AlGaN layer may be the same or different.

The doping concentration of the active AlGaN layer and the auxiliary AlGaN layer may be the same or different.

The aluminium mole fraction of the active AlGaN layer and the auxiliary AlGaN layer may be the same or different.

The active gate region may comprise a p-type gallium nitride (pGaN) material. The metal contact on the active pGaN gate could be Schottky or ohmic. Alternatively, the active gate region may comprise a recessed Schottky contact.

The first terminal, the second terminal, the first additional terminal and the second additional terminal may each comprise a surface ohmic contact. Alternatively, the first terminal, the second terminal, the first additional terminal and the second additional terminal may each comprise a recessed ohmic contact.

The auxiliary gate region may comprise a field plate extending towards the first additional terminal and wherein the field plate extends over a field oxide region.

The power device may have an interdigitated layout in which a gate metal pad is directly connected with the auxiliary gate region and the first additional terminal, and the active gate region comprises gate fingers connected with the second additional terminal. Alternatively, the device may have an interdigitated layout in which the auxiliary gate region, the first additional terminal and the second additional terminal are placed below a source metal pad. Advantageously, no additional wafer area would be needed to include the auxiliary gate structure compared to a state of the art design.

In embodiments, the second additional terminal and the active gate region may be connected in a third dimension of the device.

The active heterojunction transistor may be a high voltage transistor and the auxiliary heterojunction transistor may be a low voltage transistor compared to the active heterojunction transistor.

The heterojunction power device may further comprise a diode connected in parallel between the first and second additional terminals of the auxiliary heterojunction transistor. The parallel diode acts as a pull-down network during the turn-off of the overall configuration connecting to ground from the gate terminal of the active GaN transistor. When a positive bias (on-state) is applied to the auxiliary gate, the diode will be reverse-biased and zero current will flow through it, leaving unaffected the electrical behaviour of the overall high-voltage configuration. When a zero bias (off-state) will be applied to the auxiliary gate the diode will forward bias and the turn-off current flowing through it will discharge the gate capacitance of the active transistor, thus enabling the switching off of the overall configuration. In off-state, the gate of the active transistor will remain biased to a minimum voltage equal to the turn-on voltage of the diode. The diode will therefore be designed in such a way that its turn-on voltage will be as low as possible, ideally few mV. The diode may be formed monolithically with the device. The diode could be a simple Schottky diode. The diode generally pulls down the active gate during turn-off to the diode $V_th$, therefore the diode needs to be designed to have as low a threshold voltage as possible. A feature which can achieve this is the use of a recessed anode such that the contact is made directly to the 2DEG.

Alternatively, a normally-on (depletion mode) GaN power device not in prior art may be utilized. This normally-on device may contain a gate structure based on discontinuous p-GaN layer (or discontinuous regions of first conductivity type) containing islands within stripes or closed shapes around the cells that act to modulate the conductive path, given by the 2D electron gas (or the 2D carrier gas of the second conductivity type) between the high voltage terminal and low voltage terminal, when a gate voltage is provided. All such islands may be connected to the same gate electrode. It will be appreciated that by discontinuous islands we mean that between adjacent islands there is no p-GaN layer present, and as such, there is a direct, unobstructed conductive path between the source and the drain terminals, provided by the 2D electron gas. However, adjacent islands are placed closed together across (orthogonal to) the current path such that the potential applied to the p-GaN gate islands modulate the conductive region between the islands and thus modulate the direct path between the source and the drain. The p-GaN layers in the continuous and discontinuous gate structures are done in the same process step and the difference between continuous and discontinuous is realized by a layout change of the same mask.

The operation of this normally on (depletion mode) device may be characterised by the existence of two threshold voltages. The first threshold voltage may be negative and is equivalent to that of a classical normally-on transistor, indicating the transition from the off to on-state. The second threshold voltage is preferably positive and is characterised by a steep current increase. The second threshold voltage can occur at the same value as that of an integrated normally-off device featuring a continuous p-GaN gate.

Two threshold voltages are clearly discussed and identified below in greater detail.

The first threshold voltage referred to here as the device threshold voltage may be adjusted through layout modifications in addition to epitaxy/process modifications. Furthermore, the depletion mode (normally on) device proposed here may allow for an increased positive gate bias voltage to be applied (>7V) before the main on-state conduction channel changes from drain-source to gate-source. Such a device can be implemented in a fabrication process which does not offer a Schottky contact on the surface of the AlGaN layer.

Alternatively, the normally on depletion device using discontinuous pGaN islands could be used in a diode mode, by connecting the gate and source together, which becomes the anode terminal (or because of the symmetry by connecting the drain and gate together). The distance (pitch) between the pGaN islands could be used to adjust the voltage level at which the diode conducts current in the forward mode. This is particularly advantageous over the prior art where a continuous pGaN layer is used which could result in a large forward voltage. For example, the pitch between pGaN islands (or multiple stripes of pGaN islands) could be used to adjust this opening forward voltage to be 0.3 to 0.5V, which is specific to Schottky diodes in silicon. To avoid a negative opening voltage, which is undesirable for a diode, the pitch between the pGaN islands should be very small (orders of tens or hundreds of nanometres), or the source of the HEMT connected in the diode configuration can feature a Schottky contact.

A second increase in the current is present at a higher voltage level (higher than the opening voltage level) during forward conduction, when the 2DEG under the pGaN layer is formed. It is desirable that in forward conduction, the diode operates beyond this second voltage level to minimise the on-state resistance.

In all embodiments, the contact to the pGaN islands could be made of ohmic or Schottky metallisation.

The depletion mode III-nitride semiconductor based heterojunction device may further comprise at least two rows of active gate regions each formed over the at least two highly doped semiconductor regions; wherein the depletion mode III-nitride semiconductor based heterojunction device has two threshold levels, and wherein the depletion mode III-nitride semiconductor based heterojunction device is configurable to actively switch between: (i) an off-state, wherein the gate voltage with respect to the source voltage is lower than the first threshold; (ii) a high resistance mode, wherein the gate voltage with respect to the source voltage is between the first and second threshold levels; and (iii) a low resistance mode, wherein the gate voltage with respect to the source voltage is higher than the second threshold.

In an embodiment, the described p-GaN islands are arranged in such a way that the conductive path at a gate voltage between the first and second threshold levels follows a meander shape or labyrinth shape to increase the length of the path and therefore the resistance between the main terminals (source and drain) in a given area. When the potential applied to the gate with respect to the source exceeds the second threshold, the meander shape or labyrinth shape is removed by activating the 2DEG underneath the p-GaN islands, leading to a strong decrease in the resistance between source and drain. In this case the current flows straight (in one dimension) from the drain to the source and no longer in a meander shape (two dimensions). Therefore, this transistor can actively switch between an (i) off-state (e.g. negligible current flowing through the source and drain) when the gate voltage with respect to the source voltage is lower than the first threshold, to (ii) a high resistance mode (meander shape of the current) when the gate voltage with respect to the source voltage is between the first and second threshold levels to (iii) a low resistance mode when the gate voltage with respect to the source voltage is higher than the second threshold.

The described D-HEMT with p-GaN islands, when in the high resistance mode described above (when the gate-source voltage is higher than the first threshold voltage, but lower than the second threshold voltage), may feature a saturation (or quasi-saturation) current behaviour limiting the current at strong forward bias. The extent to which the current saturates may be affected by the distance between the pGaN islands where the smaller the distance between the pGaN islands, the stronger the current saturation observed. An example of this saturation is illustrated in FIG. 71. As the drain increases, the electric filed increases, forming a depletion region which limits the current flowing in the meander shape, as the current is now constricted by the depletion region. The obstruction of current is even more prominent between the gaps of the p-GaN islands.

A D-HEMT of this type may be used as an active Miller clamp transistor connected between the gate and source terminal of the active heterojunction transistor. When the active heterojunction transistor is in the on-state, the Miller clamp may be in the high resistance mode described. At strong forward bias of the Miller clamp transistor (that is when the gate-source bias of the active heterojunction transistor is for example at 6V) the current saturation observed may be desirable as it can limit the current from the gate terminal to the source terminal of the active heterojunction transistor and thus limit gate driver losses. The resistance of the Miller clamp transistor may be lower (but still in high resistance mode) at weak forward bias and therefore may serve as protection during transient or switching events. The Miller clamp transistor may be in the low resistance mode described above when the active heterojunction transistor is in the off-state.

The first additional terminal (or the drain (gate) terminal) and the second additional terminal (or the source terminal) of the (first) auxiliary heterojunction transistor may each act as external gate terminals.

The heterojunction power device may further comprise measures to reduce unwanted electrical coupling or electrical interference between the active heterojunction power transistor (active GaN device or main power HEMT) and the auxiliary heterojunction transistor (auxiliary gate structure). Such interference can be in the form of leakage currents, displacement currents, capacitive or inductive coupling from the active GaN device to the auxiliary gate structure.

Accordingly, the heterojunction power device may further comprise a shielding and/or decoupling structure formed between the active heterojunction transistor and the auxiliary heterojunction transistor.

The shielding and/or decoupling structure may comprise any of: one or more layers of two-dimensional carrier gas of the first and/or second conductivity type; one or more metal layers; and/or one or more conductive layers; and the shielding and/or decoupling structure may be operatively connected to one of: the first terminal; a potential; or ground.

The shielding and/or decoupling structures may comprise one or more layers of two-dimensional carrier gas of the first and/or second conductivity type; one or more metal layers; and/or one or more conductive layers between the active heterojunction power transistor (active GaN device) and the auxiliary heterojunction transistor (auxiliary structures). The shielding and/or decoupling structures may be connected to the first terminal or any other suitable electrical potential (such as ground). The shielding and/or decoupling structures may be placed around, below, above, on the sides and/or in the vicinity of any of the auxiliary heterojunction transistors (auxiliary gate structures) or the active heterojunction power transistor (GaN active device).

Said conductive layers may comprise two-dimensional carrier gases (e.g. 2DEG), metals, poly-silicon, III-nitride semiconductors, other semiconductors or any other conductive materials. In an example, the heterojunction power device may comprise a 2DEG structure operatively connected to the first terminal and placed at least partially around the auxiliary GaN structure. In this example the 2DEG is connected to an appropriate potential (e.g. ground) in order to reduce the resistive and capacitive coupling from the active GaN HEMT through the substrate or III-nitride semiconductor region to the auxiliary gate structure or circuitry.

Shielded structures may be capacitors, resistors, HEMTs or any other active and passive devices on the chip.

The shielding and/or decoupling structures may be formed between any blocks of the circuit to isolate the respective blocks from the influence of each other.

In the present disclosure, the auxiliary heterojunction transistor is a first auxiliary heterojunction transistor, and the heterojunction device further comprises a second auxiliary heterojunction transistor which is operatively connected in parallel with the first auxiliary transistor, and the first additional terminal (or the drain (gate) terminal) of the first auxiliary heterojunction transistor may be connected to a source terminal of the second auxiliary heterojunction transistor, and the second additional terminal (or the source terminal) of the first auxiliary heterojunction transistor may be operatively connected to a drain (gate) terminal of the second auxiliary heterojunction transistor.

The pull-down network through the second auxiliary heterojunction transistor may further comprise of a resistor added in series with the second auxiliary transistor between the gate and drain terminal of the second auxiliary transistor. The resistor is between the gate and drain terminals of the second auxiliary transistor. Therefore, the resistor does not form a common junction between the first auxiliary transistor and the gate of the active transistor. The resistor acts to reduce the active gate capacitance discharge time through the pull-down network during the turn-off of the heterojunction power device. The additional resistive element performs this function by leading to an increased potential, during turn-off, of the second auxiliary transistor gate terminal compared to the second auxiliary transistor drain terminal. An additional resistor could be connected between the drain terminal of the second auxiliary transistor and the source terminal of the active power transistor. The additional resistor acts as a parallel pull-down network during the active device turn-off. Therefore, it will be understood that the additional resistor is not connected through a common junction connecting the source of the first auxiliary transistor and the gate of the active transistor. During the active device turn-on and on-state the additional resistor can act as a voltage limiting component to protect the gate terminal of the active device.

The pull-down network through the second auxiliary heterojunction transistor may further comprise of a third auxiliary transistor added in series with the second auxiliary transistor between the gate and drain terminal of the second auxiliary transistor. The third auxiliary transistor acts to reduce the active gate capacitance discharge time through the pull-down network during the turn-off of the heterojunction power device. The third auxiliary transistor performs this function by leading to an increased potential, during turn-off, of the second auxiliary transistor gate terminal compared to the second auxiliary transistor drain terminal. The third auxiliary transistor may be a depletion mode low-voltage transistor. The depletion mode device could be made using p-GaN islands as shown in FIG. 18, or could be a diode as shown in FIG. 19. The gate terminal of the third auxiliary transistor may be connected to either the source or drain terminal of the third auxiliary transistor. An additional resistor could be connected between the drain terminal of the second auxiliary transistor and the source terminal of the active (high voltage) transistor. In other words, it will be understood that the additional resistor is not connected through a common junction connecting the source of the first auxiliary transistor and the gate of the active transistor. The additional resistor acts as a parallel pull-down network during the active device turn-off. During the active device turn-on and on-state the additional resistor can act as a voltage limiting component to protect the gate terminal of the active device.

The heterojunction power device may further comprise a voltage limiting circuit composed of two resistors forming a potential divider and an actively switched low voltage enhancement mode transistor. The drain source path of the actively switched low voltage enhancement mode transistor is connected between the gate and source of the active power transistor. The potential divider is connected between the first additional terminal (or the drain (gate) terminal) of the first auxiliary heterojunction transistor and the source terminal of the active (high voltage) transistor. The mid-point of the potential divider is connected to the gate terminal of the low voltage enhancement mode transistor. The enhancement mode transistor can turn-on, and thus adjust the resistance between the active device gate terminal and the active (high voltage) device source terminal, when the voltage of the first additional terminal (or the drain (gate) terminal) of the first auxiliary heterojunction transistor is raised above a certain value which can be controlled by the choice of resistors in the potential divider described. This function can protect the active gate terminal from over-voltage events.

The heterojunction power device may further comprise a voltage limiting circuit as described above where the low voltage enhancement mode transistor is replaced with a low voltage depletion mode transistor. In this embodiment, the resistance of the depletion mode transistor can be reduced, and thus adjust the resistance between the active (high voltage) device gate terminal and the active device source terminal, when the potential of the first additional terminal (or the drain (gate) terminal) of the first auxiliary heterojunction transistor is increased. The potential divider formed by the resistors determines the potential on the gate terminal of the depletion mode transistor. The circuit described can protect the active gate terminal from over-voltage events.

The heterojunction power device may further comprise an over-current protection circuit composed of a current sensing resistor and an actively switched low voltage enhancement mode transistor. The active area of the active (high voltage) transistor is divided into two regions forming two transistors in parallel. The drain and gate terminals of the two transistors are electrically connected. The two transistors in parallel are a low resistance (main power) transistor and a high resistance (current sensing) transistor comparatively. The first terminal of the current sensing resistor is connected to the source terminal of the high resistance transistor. The actively switched enhancement mode transistor is connected between the gate terminal of the active (high voltage) transistors and the second terminal of the current sensing resistor. The gate terminal of the low voltage enhancement mode transistor is connected to the first terminal of the current sensing resistor. As current through the high resistance transistor increases, the potential drop across the current sensing resistor increases, raising the potential on the gate of the low voltage enhancement mode resistor and thus adjusting its resistance. A critical current through the low voltage transistor can turn on the low voltage enhancement mode transistor limiting the potential on the gate of the active power transistors. The circuit described can protect the circuit from over-current events. The components described can be included in the design monolithically.

The heterojunction power device may further comprise an over-current protection circuit as described above where the low voltage enhancement mode transistor is replaced with a low voltage depletion mode transistor. Similarly, the potential at the gate terminal of the depletion mode transistor is increased as the current through the current sensing resistor is increased. As the current through the current sensing resistor increases the resistance of the depletion mode transistor can decrease providing a reduction in the resistance of the path between the gate and source of the active (high voltage) devices thus limiting the potential on the active gate terminal. The circuit described can protect the circuit from an over-current event.

The heterojunction power device may further comprise an active Miller clamp to offer an additional pull-down network for the active (high voltage) device gate terminal during the device turn-off transient. The active Miller clamp consists of a logic inverter and an actively switched transistor which acts as the pull down network. The logic inverter could be composed of a resistor or resistive element (i.e. load transistor) and an enhancement mode transistor.

In some embodiments, the logic inverter may comprise a current source circuit in series with an enhancement mode transistor in which the current source may comprise a depletion mode transistor and a resistive element.

In some embodiments, the logic inverter may comprise of two or more stages. In a multi-stage inverter, all stages comprise an enhancement transistor on the low side with the gate connected to the input signal. All stages comprise a pull-up circuit, of which all but the one of the first stage are at least partially controlled by the previous stages. In one embodiment of a multi-stage inverter, the pull-up circuit of the first stage comprises a current source as described above. The pull-up circuit of the second stage comprises a resistive element and a depletion-mode transistor in series where the gate of the depletion-mode transistor is connected to the output of a previous stage. In such a multi-stage inverter, the first stage can be realised with small components, leading to small capacitance and therefore a fast switching time even at small currents. Therefore, the gate of the depletion-mode transistor of the pull-up circuit of the subsequent stage may rise faster than in a current source arrangement. Therefore, this arrangement may lead to a faster switching time at a given load and a given current consumption.

In a further embodiment of a multi-stage inverter, an additional depletion or enhancement transistor is connected to the pull-up circuit of the second or subsequent stages. This additional transistor has the gate connected to the output of a previous stage. The additional transistor may be connected in parallel to the pull-up circuit or in parallel to the resistive element of the pull-up circuit and may further increase the current during switching when the output of one stage is higher than the output of the subsequent stage.

The increased current during switching leads to a faster switching time for a given load, such as the actively switched transistor of a Miller clamp.

The actively switched transistor could be an enhancement mode or depletion mode transistor. In operation the active Miller clamp uses the voltage bias of the external gate terminal (i.e. the terminal connected to the gate driver) to adjust the resistance of the actively switched transistor such that a low resistance pull-down path is provided when the main power device is turning-off or is in the off-state. When the gate driver signal is high, the bias on the gate of the actively switched transistor in the Miller clamp is low (therefore its resistance is high) and vice versa.

The logic inverter of the active Miller clamp may be connected to a DC voltage source through a decoupling circuit.

The decoupling circuit may comprise one or more resistors, capacitors, current sources, or other low voltage transistors The role of the decoupling circuit is to protect the inverter from current spikes or voltage excursions induced from the voltage source. These current spikes or voltage excursions may be a result of capacitive or magnetic coupling of the circuit to other elements of the chip or the system and exacerbated by fast transient voltages and/or currents.

In one embodiment, the decoupling circuit may comprise of a series resistor and a capacitor across the input voltage of the inverter. In another embodiment, the decoupling circuit comprise a current source formed of a depletion HEMT and a resistive element. In other embodiments, a transistor may be added to the current source in parallel to the current source or in parallel to the resistive element to adjust the current limit through the current source. In another embodiment, a transistor may be added in parallel to the capacitor to sink the current in case of a current spike.

The described decoupling circuits may be used not only to protect the inverter but other circuits within the auxiliary gate interface.

The heterojunction chip may comprise at least one low voltage transistor that is configured to ENABLE or DIASBLE the heterojunction chip, wherein the ENABLE function permits the operation of the heterojunction chip as normal, and wherein the DISABLE function transforms the chip into a high impedance mode state, disabling the operation of the heterojunction chip.

In a power electronics application, there may be the need to permanently or temporarily disable or enable the active HEMT, independent of the control signal applied. Examples for the use of a disable or enable function are gate drivers, external controllers, under voltage lock-out, start-up conditions, zero-voltage switching, overvoltage protection, overcurrent protection or other safety features. Some embodiments of this invention comprise an enable or disable function. The input signal to the disable or enable function could be generated internally on the chip or externally and may be the output of a sensing function.

The ENABLE function permits the operation of the heterojunction chip as normal, while the DISABLE function transform the chip into a high impedance mode state (HiZ), disabling its operation.

In one embodiment, the enable or disable function may be realised by a transistor connected between the gate and source of the active HEMT. Turning on said transistor disables the active HEMT.

In another embodiment, the enable function may be realised by a transistor connected in series with the Miller clamp transistor. This creates a logic NAND function in the sense that both the Miller clamp transistor and the additional series transistor need to be on to turn off the active HEMT.

In another embodiment, the enable or disable function may be realised as part of the inverter connected to the Miller clamp transistor. A disable or enable transistor may be connected in series or in parallel with the low-side enhancement transistors of the inverter. Further, the disable or enable function may be integrated with any other buffer or inverter block of the circuit, transforming them into logic gates.

In another embodiment of the disable or enable function a disable or enable transistor is connected to the gate of the auxiliary HEMT. The additional transistor would short out partially or completely the pull-down circuit when in the low-resistive state and therefore keeping the active HEMT off. Or, in other words, only when the additional transistor is in a high resistive state the active HEMT is enabled.

In all embodiments of the enable or disable function, the gate of the enable or disable transistor may be driven by an external signal directly or through a signal conditioning circuit such as inverter, buffer, voltage follower, Schmidt trigger, amplifier, voltage divider, protection circuit or latching circuit. Further, the gate of the enable or disable transistor may be driven by a signal generated on the chip such as signal conditioning or a sensing signal. Further, one or several transistors in series or in parallel may be used.

The resistor (in any of the embodiments shown here) could be made of a metal layer in the process, the AlGaN layer or preferably of the 2DEG. The resistor could be shaped in a meander for high packing density. The functional blocks described above may be included in the design discreetly, monolithically or in a hybrid package.

The depletion mode transistor in the functioning blocks described may be a Schottky gate HEMT described in prior art.

Additionally, the normally on (depletion mode) transistor in the functioning blocks described may be the pGaN islands transistor described above.

It will be appreciated that, as already mentioned, the auxiliary heterojunction transistor may have the source and drain interchanged. Unlike in the active (high voltage) transistor, the source and drain in the auxiliary heterojunction may be symmetrical or made and arranged in a similar way, so that the source can take the role of the drain and vice-versa.

According to a second aspect of the present disclosure, there is provided a Gallium Nitride (GaN) chip comprising a III-nitride semiconductor based heterojunction power device as according to the previous aspect, and an auxiliary low-voltage transistor as according to the previous aspect but wherein the auxiliary gate region terminal is operatively connected to a current control circuit (block) and a pull-down circuit (block). The current control block may be connected between the first additional terminal and the auxiliary gate region. The pull-down circuit block may be connected between the auxiliary gate terminal and the first terminal (source) of heterojunction power device (which is the same as the low voltage terminal of the GaN chip). A circuit comprising at least an auxiliary low-voltage transistor, current control circuit (block) and pull-down circuit (block) may be referred to as a gate interface circuit.

The GaN chip may further comprise an over-current protection circuit as described above where the low voltage transistor is in parallel with the pull-down circuit.

The GaN chip may further comprise an integrated current control circuit (block). As described above, the current control block provides the current to charge and discharge the gate of the auxiliary HEMT in the auxiliary gate circuit.

The current control block may be connected between the first additional terminal and the gate of the auxiliary HEMT.

In some embodiments, the integrated current control block may be a resistive element. This resistive element can be made using metal layers or the 2DEG layer.

In other embodiments the current control block may be or comprise a current source. The current source may be composed of a low-voltage depletion mode HEMT and a resistive element. The drain of the low-voltage HEMT may be connected to the first additional terminal, the source to the first terminal of the resistive element and the gate to the second terminal of the resistive element. The second terminal of the resistive element may be further connected to the gate terminal of the auxiliary HEMT.

In similar embodiments, an RCL network could be included in parallel or in series with the resistive element or the current source to improve the characteristics of the current control block.

The current control block may further include a circuit creating an additional voltage drop. Such circuit could be one or several low-voltage diodes, one or several low-voltage HEMT with gate connected to source or a low-voltage enhancement mode HEMT with a potential divider connected between the drain and source terminal of the HEMT where the midpoint of the potential divider is connected to the gate terminal of the HEMT.

In a further embodiment of the current control block, the voltage drop in the current block may be created using a similar circuit as the one used to create a voltage drop between the external gate of the GaN chip (also described as control terminal) and the gate of the active GaN HEMT (also described as the power transistor or high voltage transistor).

This circuit, referred to as a gate interface circuit above, has been described as comprising an auxiliary transistor, a current control circuit and a pull-down circuit. Such a circuit (and any other embodiments described herein) could be implemented within the current control block to provide the additional voltage drop described. Further, the current control block may be connected to an additional separate internal or external control signal.

In one embodiment of the current control block connected to an internal control signal, the current control block may be connected to the output of a buffer, single-stage or multi-stage inverter or transistor switch.

In any embodiment, one or several current control blocks may be used.

The current control block may further include a circuit that adapts the current in the current control block. Such a current reduction circuit may include a depletion mode HEMT or enhancement mode HEMT in series or in parallel to the resistive element in the current source. The gate of said HEMT may be connected to a voltage divider between the gate of the auxiliary HEMT and the first terminal or to a node within the integrated pull-down circuit.

Alternatively, the current control circuit may comprise at least one low voltage transistor (HEMT) having at least one terminal connected to a constant or variably controlled voltage level. For example, the gate of said HEMT may be connected to a constant or variably controlled voltage level. This voltage level can be supplied from an on-chip circuit (such as a regulator or start-up), an external source or a combination of the two. As either the electric potential of said voltage level or the potential of the source of said HEMT changes the current level in the current source changes.

Further, said HEMT may be connected in parallel to the current control block.

The heterojunction GaN chip may further comprise an integrated pull-down circuit block. The pull-down circuit block may be connected between the gate of the auxiliary HEMT and the first terminal (source terminal of the main power heterojunction transistor—the same as the low-voltage terminal of the GaN chip).

In some embodiments, the integrated pull-down circuit block can be one or several normally-on or normally-off HEMTs in parallel or in series. There may be additional capacitors or resistors in series with the HEMTs. The gate potentials of said pull-down HEMTs are controlled to set the voltage drop across the pull-down HEMT and therefore setting the gate voltage of the auxiliary gate block and the voltage drop across the auxiliary gate block.

In one embodiment, the gate terminal of the pull-down HEMT may be connected to the output of a voltage divider between the gate terminal of the auxiliary HEMT and the first terminal.

In another embodiment, the gate terminal of the pull-down HEMT may be connected to the output of a voltage (or potential) divider between the source terminal of the HEMT in the current source of the current control block and the first terminal.

In a further embodiment, the gate terminal of the pull-down HEMT may be connected to the output of a voltage divider between the active gate and the first terminal.

In a fourth embodiment, the gate terminal of the pull-down HEMT may be connected to the output of a voltage divider between the first additional terminal and the first terminal.

In a further embodiment, an additional current control block is connected to the first additional terminal. This additional current control block is connected to an additional pulldown circuit which is connected to the first terminal. In this embodiment, the gate terminal of the first pull-down HEMT may be connected to the output of a voltage divider across the additional pull-down circuit.

In all these embodiments of a pull-down circuit, a voltage divider may consist of resistive elements such as resistors formed of metal or 2DEG; capacitors; current sources formed of a depletion-mode HEMT and with the source connected to the first terminal of a resistive element and the gate connected to the second terminal; Schottky diodes, enhancement mode HEMTs with the gate terminal connected to their source terminal; HEMTs with the gate terminal connected to the output of a voltage divider between their drain and source; or similar voltage divider circuits.

The pull-down circuit or the current control or the auxiliary gate circuit may further comprise an element to compensate or reduce the effect of temperature. This element is a particular embodiment of the voltage divider which is part of the pull-down circuit. The first part of the voltage divider may comprise an integrated resistor and the second part of the voltage divider may comprise a current source consisting of a normally-on HEMT with the source connected to the first terminal of an additional resistor and the gate connected to the second terminal of the resistor. The first part of the voltage divider may further comprise a similar current source in parallel to the resistor. The second part of the voltage divider may further comprise a resistor in parallel to the current source.

Both parts of the voltage divider will increase the voltage drop at a given current with increasing temperature. But the current sources and resistors change the voltage drop at a dissimilar rate. By designing the sizes of the normally-on HEMTs and the resistances, the output of the voltage divider can be set by the design in such a way that the voltage drop across the pull-down circuit and/or the voltage drop across the auxiliary HEMT has a much smaller temperature dependence.

In a further embodiment, the gate of the pull down HEMT is controlled by an over current protection or over temperature protection circuit.

In a further embodiment, the gate of the pull down HEMT is controlled directly or indirectly by an external circuit or by an additional circuit integrated on the GaN devices.

The GaN chip may incorporate more than one main power device. For example, half bridge configurations where the low-side power device is connected in series with a high-side main power device are possible. Full bridge consisting of two arms of half bridges or a three phase GaN chip configuration are also possible. According to this aspect of the invention at least one main power device in these configurations (half-bridge or full bridge or three phase) comprises an auxiliary gate circuit, a pull-down circuit and a current control-circuit as described above.

In an arrangement where more than one main power device is used (such as when parallel main power transistors are used), the described blocks such as auxiliary gate circuit, pull-down circuit and current control-circuit or parts thereof may be shared among the several main power devices to achieve more compact solutions. For example, DC voltage rails or disable signal can be shared in this way to avoid duplication and save area.

The heterojunction chip (GaN chip) may further comprise a shielding and/or decoupling structure disposed between any two or more of: the at least one main power heterojunction transistor; the auxiliary gate circuit; the pull-down circuit; and/or the current control circuit (block).

The shielding and/or decoupling structure may comprise any of: one or more layers of two-dimensional carrier gas of the first and/or second conductivity type; one or more metal layers; and/or one or more conductive layers; and the shielding and/or decoupling structure may be operatively connected to one of: the first terminal; a potential; or ground.

The heterojunction chip may further comprise measures to reduce unwanted electrical coupling or electrical interference between the active heterojunction power transistor (active GaN device or main power HEMT) and any of the auxiliary heterojunction transistors (auxiliary gate structures) as well as between elements of the circuits of the auxiliary heterojunction transistors (auxiliary gate structures). Such interference can be in the form of leakage currents, displacement currents, capacitive or inductive coupling from the active GaN device to the auxiliary gate structure.

According to this disclosure there may be provided shielding and/or decoupling structure(s) to eliminate or reduce such electrical interference.

The shielding and/or decoupling structures may comprise one or more layers of two-dimensional carrier gas of the first and/or second conductivity type; one or more metal layers; and/or one or more conductive layers between the active heterojunction power transistor (active GaN device) and the auxiliary heterojunction transistor (auxiliary structures). The shielding and/or decoupling structures may be connected to the first terminal or any other suitable electrical potential (such as ground). The shielding and/or decoupling structures may be placed around, below, above, on the sides and/or in the vicinity of any of the auxiliary heterojunction transistors (auxiliary gate structures) or the active heterojunction power transistor (GaN active device).

Said conductive layers may comprise two-dimensional carrier gases (e.g. 2DEG), metals, poly-silicon, III-nitride semiconductors, other semiconductors or any other conductive materials. In an example, the heterojunction chip may comprise a 2DEG structure operatively connected to the first terminal and placed at least partially around the auxiliary GaN structure. In this example the 2DEG is connected to an appropriate potential (e.g. ground) in order to reduce the resistive and capacitive coupling from the active GaN HEMT through the substrate or III-nitride semiconductor region to the auxiliary gate structure or circuitry.

Shielded structures may be capacitors, resistors, HEMTs or any other active and passive devices on the chip.

The shielding and/or decoupling structures may be formed between any blocks of the circuit to isolate the respective blocks from the influence of each other.

In a further embodiment, the pull-down circuit may comprise of a voltage source in series with one or more enhancement HEMTs with their gate terminal connected to their source terminal. The voltage source may be the output of an on-chip or external voltage regulator. The voltage source can be constant or variably controlled. This circuit block can be placed in parallel to any other pull-down circuit block to make the overall function of the pull-down more effective.

Alternatively, the pull-down circuit may comprise a voltage source in series with one or more enhancement HEMTs in a threshold multiplier arrangement or any other circuit with a diode-like characteristic; wherein the voltage source is configured to be constant or variable; and, optionally wherein the voltage source is connected to an on-chip or external voltage regulator. In some implementations, the pull-down circuit may comprise an active transistor switch instead of the one or more enhancement HEMTs with a gate terminal connected to the source terminal.

According to a further aspect of the present disclosure, there is provided a method of manufacturing a III-nitride semiconductor based heterojunction power device, the method comprising:

forming an active heterojunction power transistor on a substrate, the active heterojunction transistor comprising:
a first III-nitride semiconductor region comprising a first heterojunction comprising an active two dimensional carrier gas;
a first terminal operatively connected to the III-nitride semiconductor region;
a second terminal laterally spaced from the first terminal and operatively connected to the III-nitride semiconductor region;
an active gate region formed over the III-nitride semiconductor region, the active gate region being formed between the first terminal and the second terminal;

forming a first auxiliary heterojunction transistor on the substrate or on a further substrate, the auxiliary heterojunction transistor comprising:
a second III-nitride semiconductor region comprising a second heterojunction comprising an auxiliary two dimensional carrier gas;
a first additional terminal operatively connected to the second III-nitride semiconductor region;
a second additional terminal laterally spaced from the first additional terminal and operatively connected to the second III-nitride semiconductor region;
an auxiliary gate region formed over the second III-nitride semiconductor region, the auxiliary gate region being formed between the first additional terminal and the second additional terminal;

forming a second auxiliary heterojunction transistor on the substrate or the further substrate,
operatively connecting the first additional terminal with the auxiliary gate region, and
operatively connecting the second additional terminal with the active gate region,
operatively connecting the second auxiliary heterojunction transistor in parallel with the first auxiliary transistor,
operatively connecting the first additional terminal of the first auxiliary heterojunction transistor to a source terminal of the second auxiliary heterojunction transistor, and
operatively connecting the second additional terminal of the first auxiliary heterojunction transistor to a drain terminal of the second auxiliary heterojunction transistor.

The method may further comprise forming an isolator region between the active heterojunction transistor and auxiliary heterojunction transistor separating the active two dimensional carrier gas and the auxiliary two dimensional carrier gas.

The method may further comprise forming the first III-nitride semiconductor region at the same time as forming the second III-nitride semiconductor region.

The method may further comprise forming the active gate region at the same time as forming the auxiliary gate region.

The method may further comprise forming a metallization layer for the first terminal, the second terminal, the first additional terminal, and the second additional terminal at the same time.

The method may further comprise measures to reduce unwanted electrical coupling or electrical interference between the active heterojunction power transistor (active GaN device or main power HEMT) and any of the auxiliary heterojunction transistors (auxiliary gate structures) as well as between elements of the circuits of the auxiliary heterojunction transistors (auxiliary gate structures). Such interference can be in the form of leakage currents, displacement currents, capacitive or inductive coupling from the active GaN device to the auxiliary gate structure.

According to this disclosure there may be provided shielding and/or decoupling structure(s) to eliminate or reduce such electrical interference.

The method of manufacturing a III-nitride semiconductor-based heterojunction power device may further comprise forming shielding and/or decoupling structures. Forming shielding and/or decoupling structures may comprise connecting one or more layers of two-dimensional carrier gas of the first and/or second conductivity type; one or more metal layers; and/or one or more conductive layers between the active heterojunction power transistor (active GaN device) and any of the auxiliary heterojunction transistors (auxiliary structures). The shielding and/or decoupling structures may be connected to the first terminal or any other suitable electrical potential (such as ground). The shielding and/or decoupling structures may be placed around, below, above, on the sides and/or in the vicinity of any of the auxiliary heterojunction transistors (auxiliary gate structures) or the active heterojunction power transistor (GaN active device).

Said conductive layers may comprise two-dimensional carrier gases (e.g. 2DEG), metals, poly-silicon, III-nitride semiconductors, other semiconductors or any other conductive materials. In an example, the method may comprise forming a 2DEG structure operatively connected to the first terminal and placed at least partially around the auxiliary GaN structure. In this example the 2DEG is connected to an appropriate potential (e.g. ground) in order to reduce the resistive and capacitive coupling from the active GaN HEMT through the substrate or III-nitride semiconductor region to the auxiliary gate structure or circuitry.

Shielded structures may be capacitors, resistors, HEMTs or any other active and passive devices on the chip.

The shielding and/or decoupling structures may be formed between any blocks of the circuit to isolate the respective blocks from the influence of each other.

BRIEF DESCRIPTION OF THE PREFERRED EMBODIMENTS

The present disclosure will be understood more fully from the detailed description that follows and from the accompanying drawings, which however, should not be taken to limit the disclosure to the specific embodiments shown, but are for explanation and understanding only.

Figure 6:
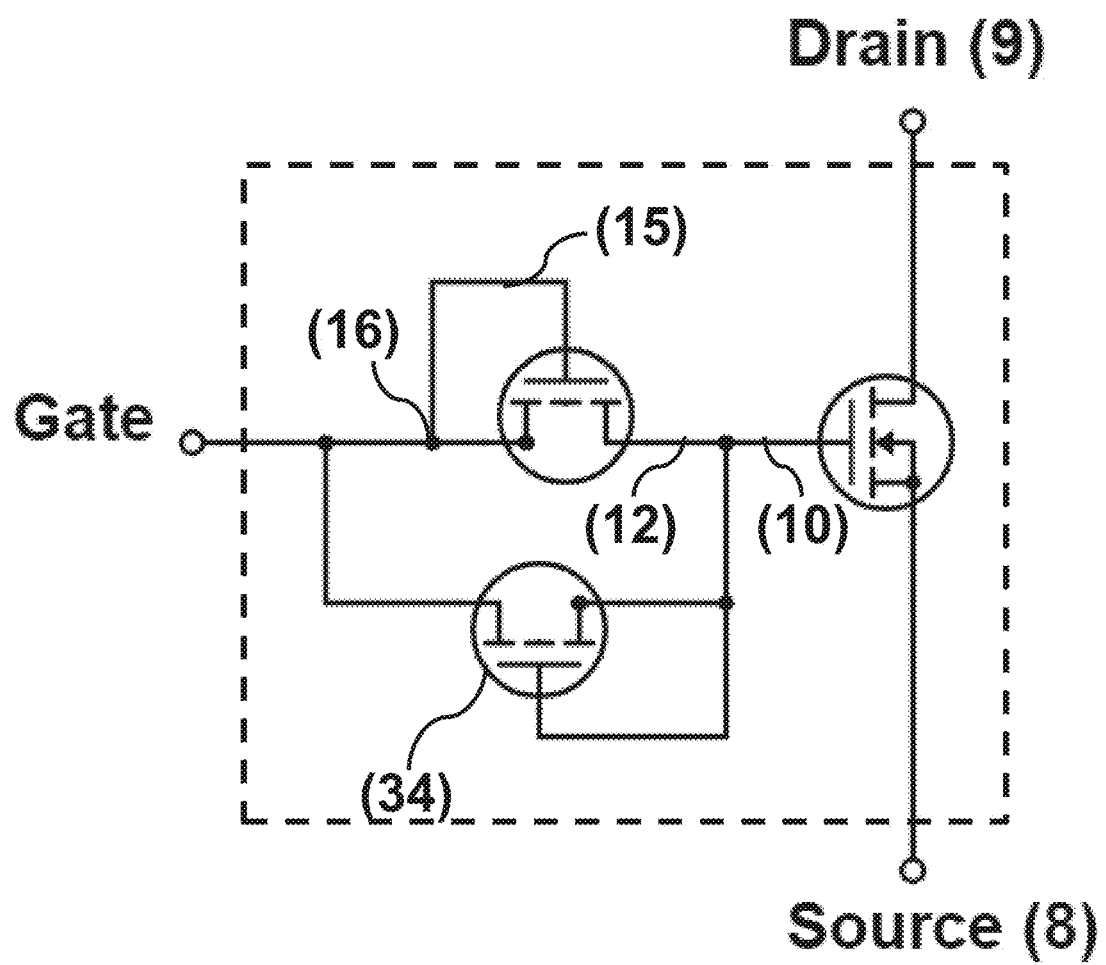
Figure 7:
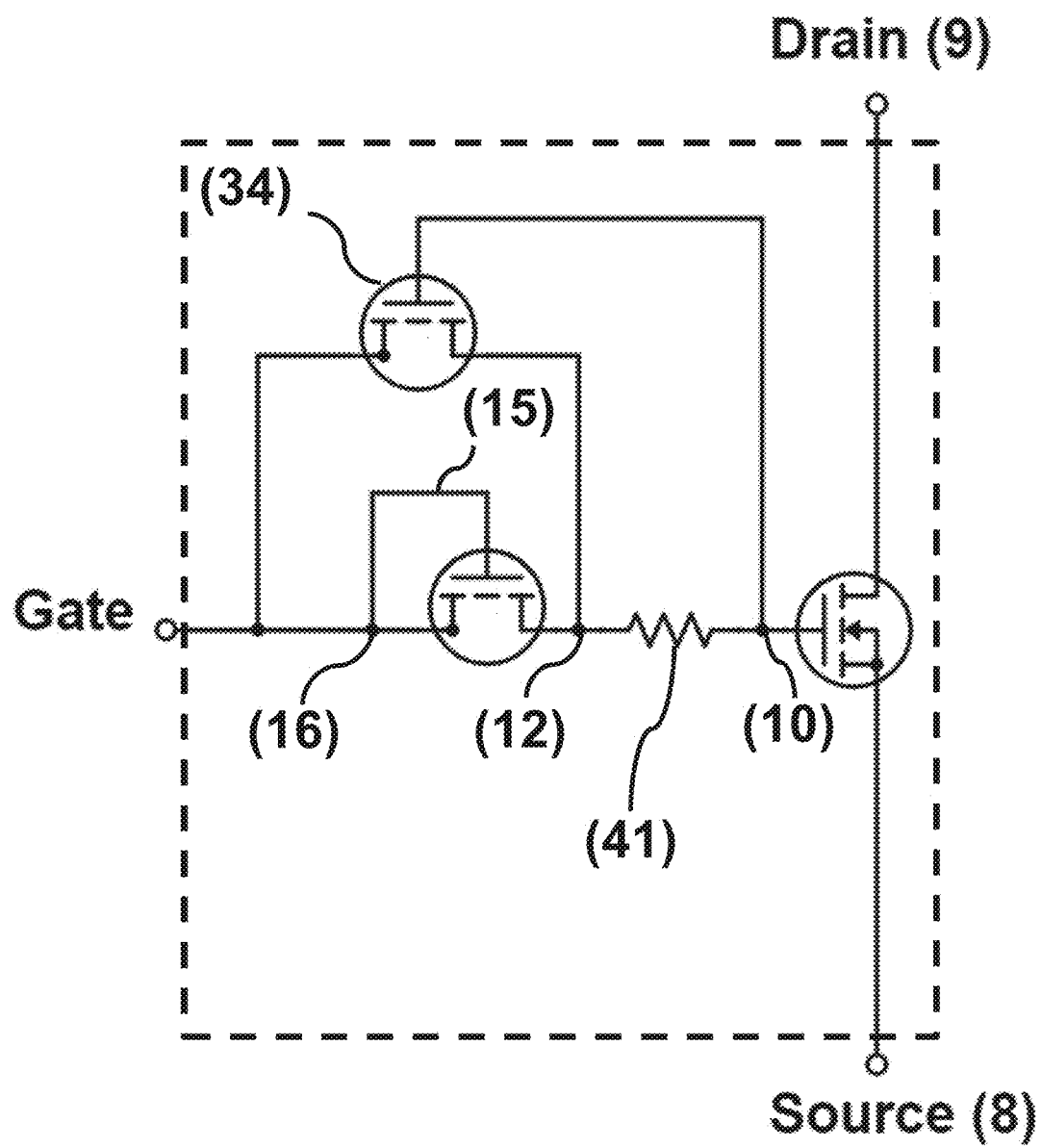
Figure 8:
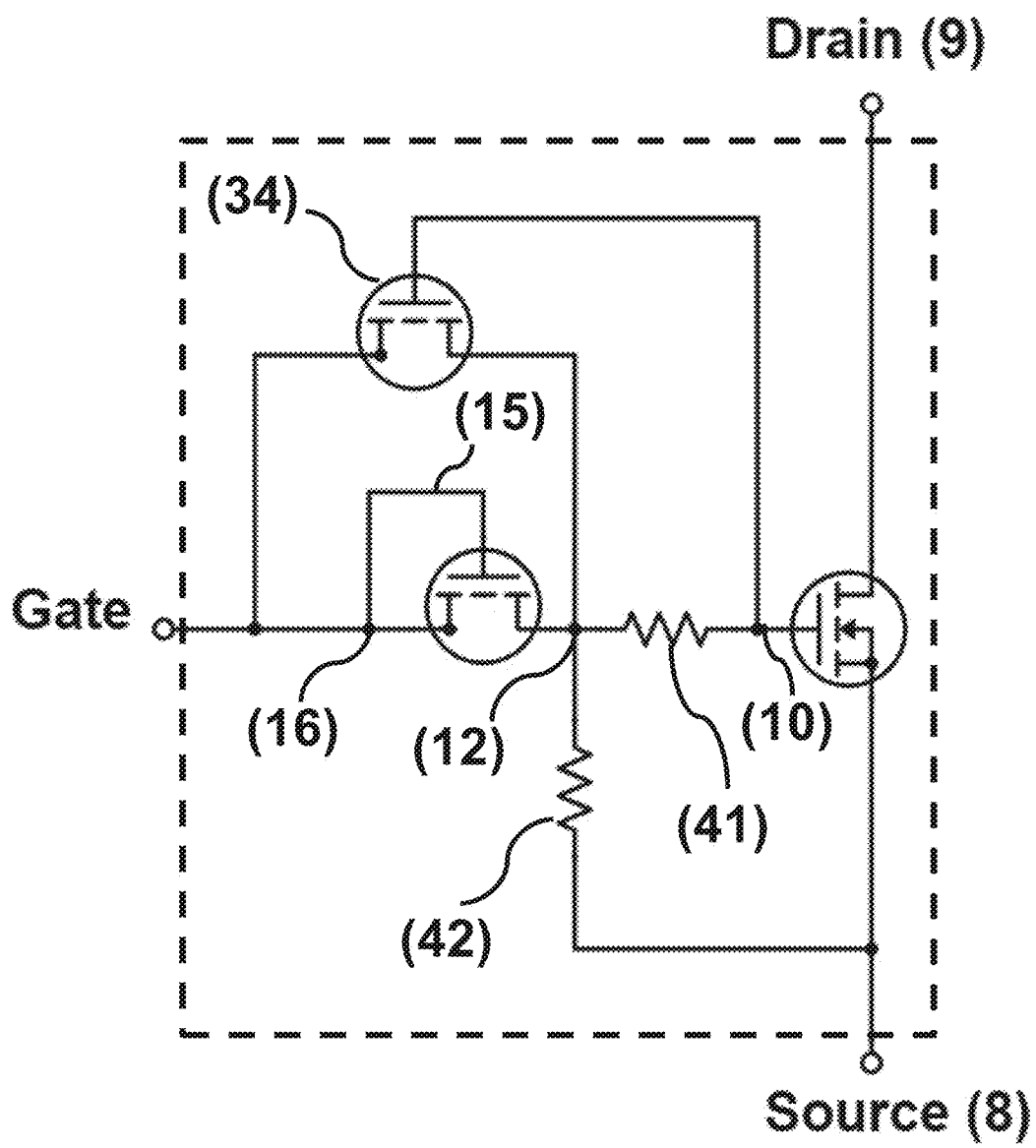
Figure 9:
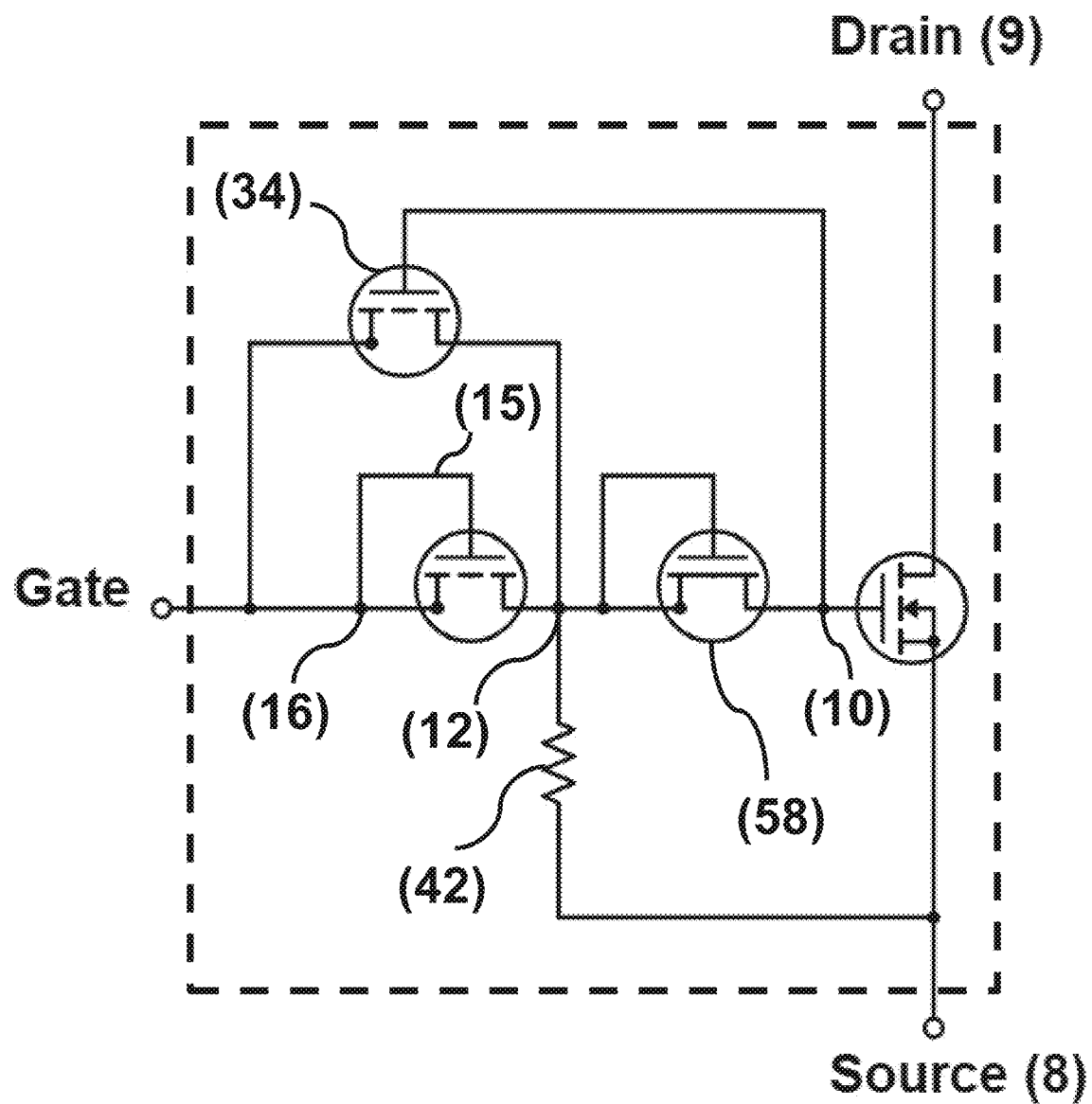
Figure 10:
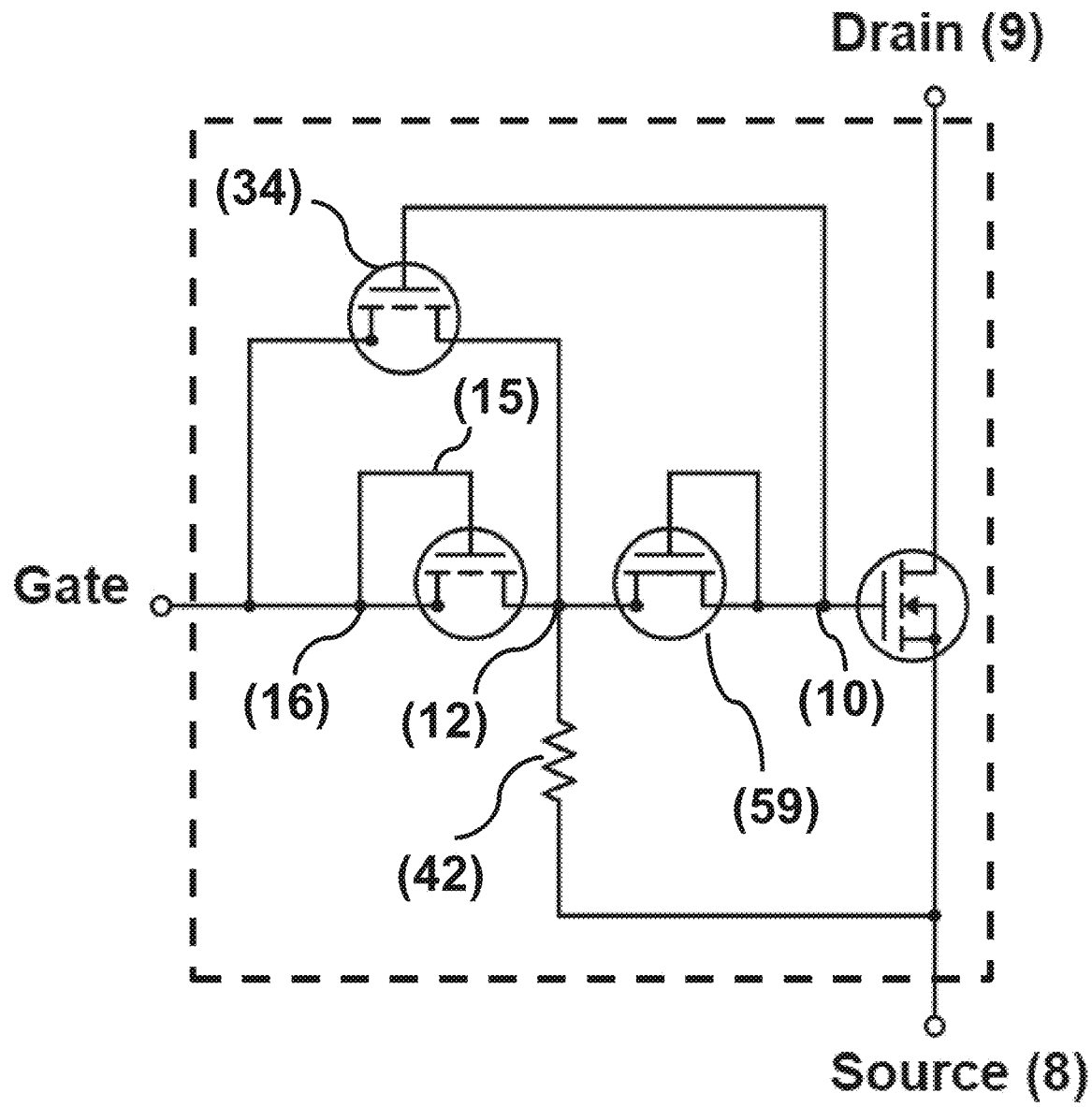
Figure 11:
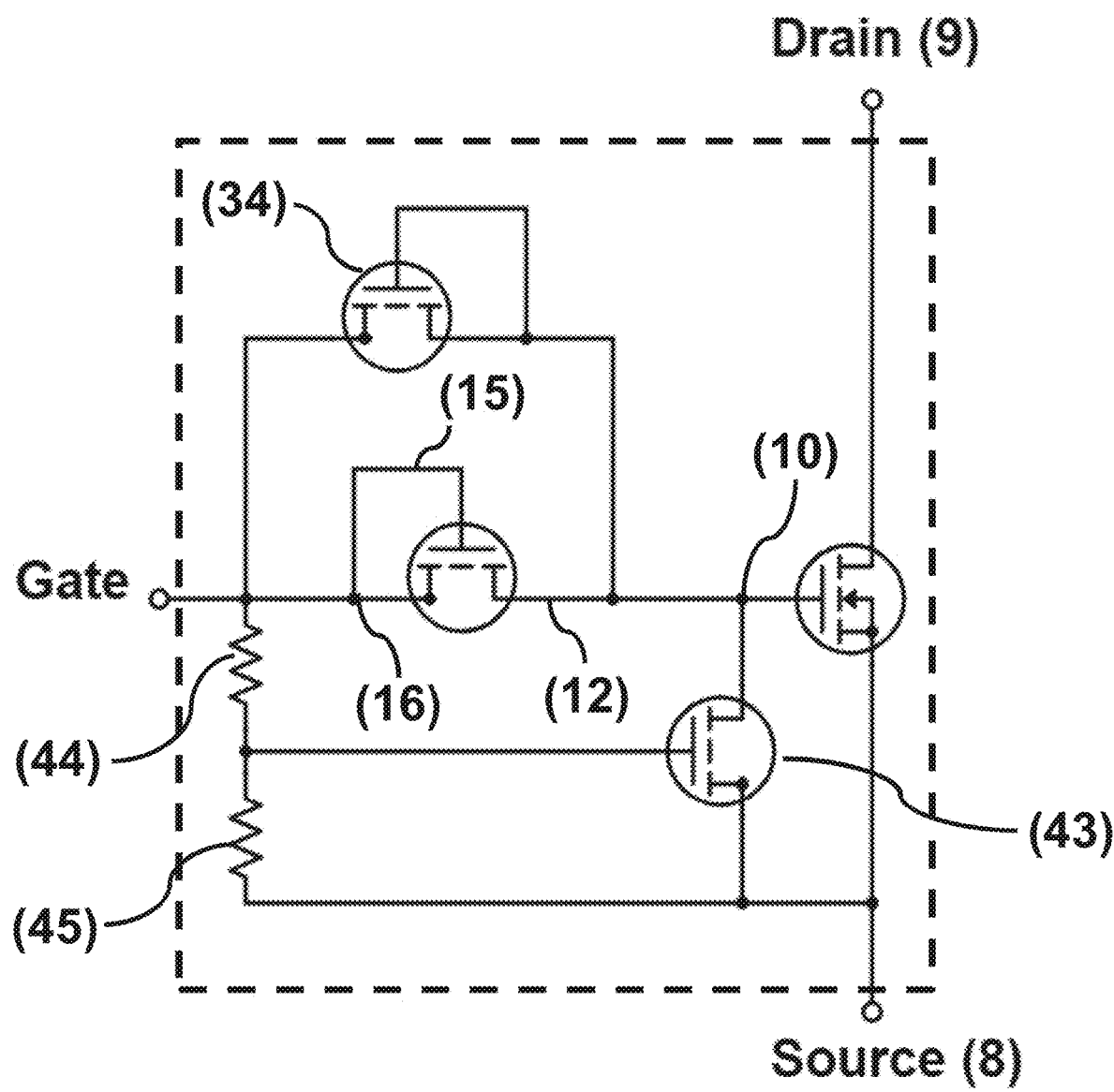
Figure 12:
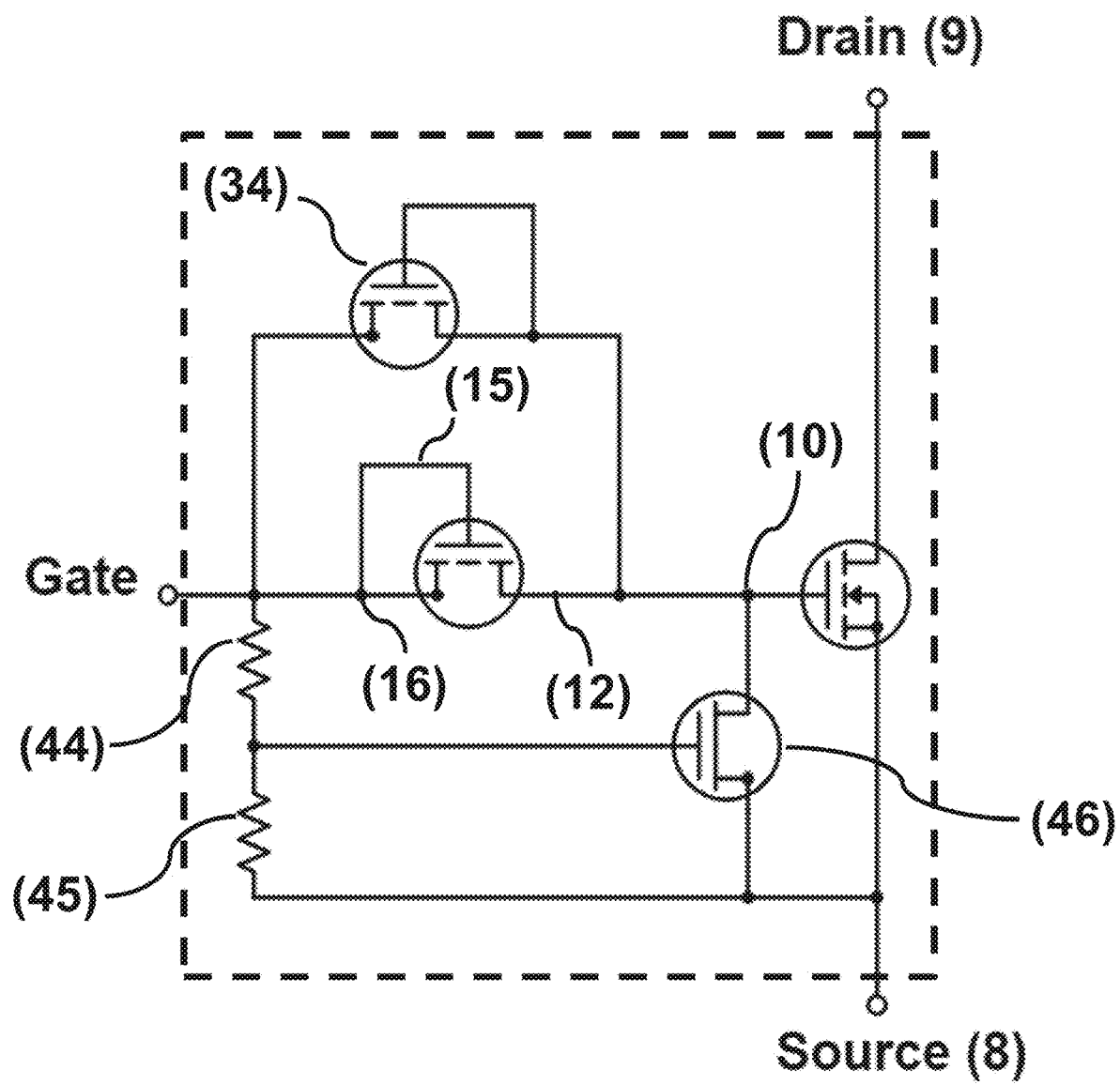
Figure 13:
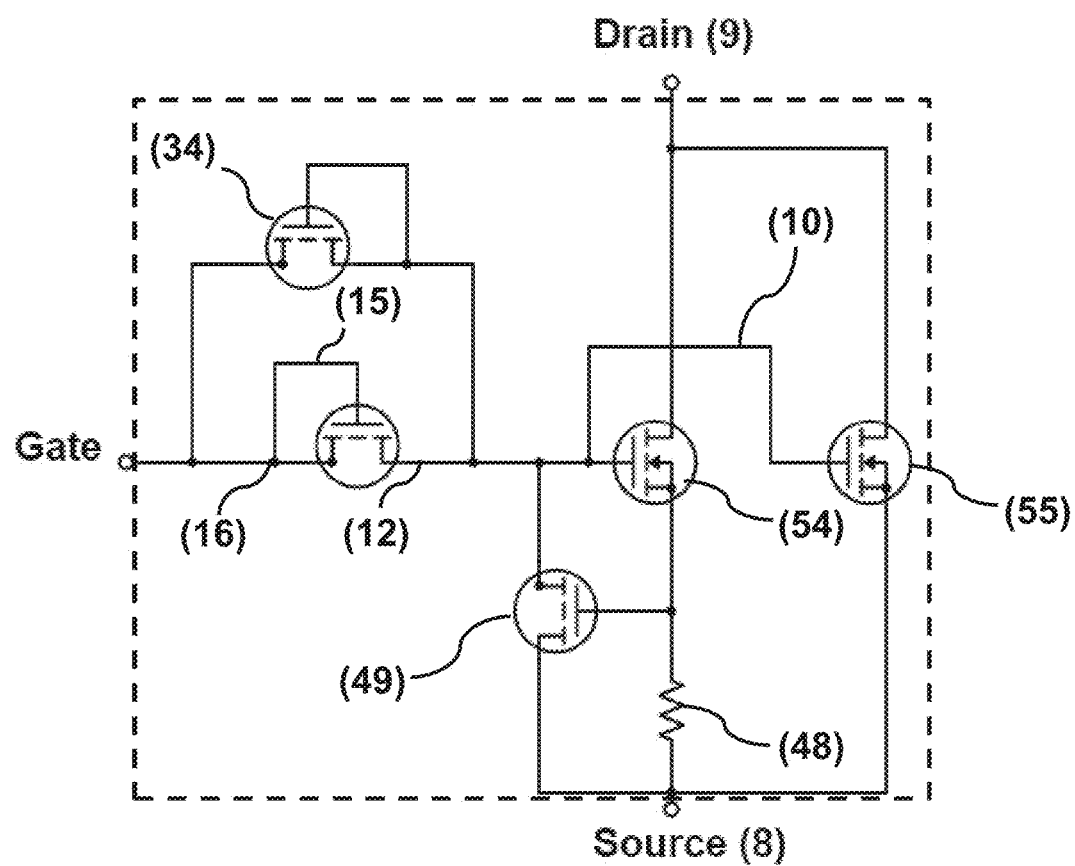
Figure 14:
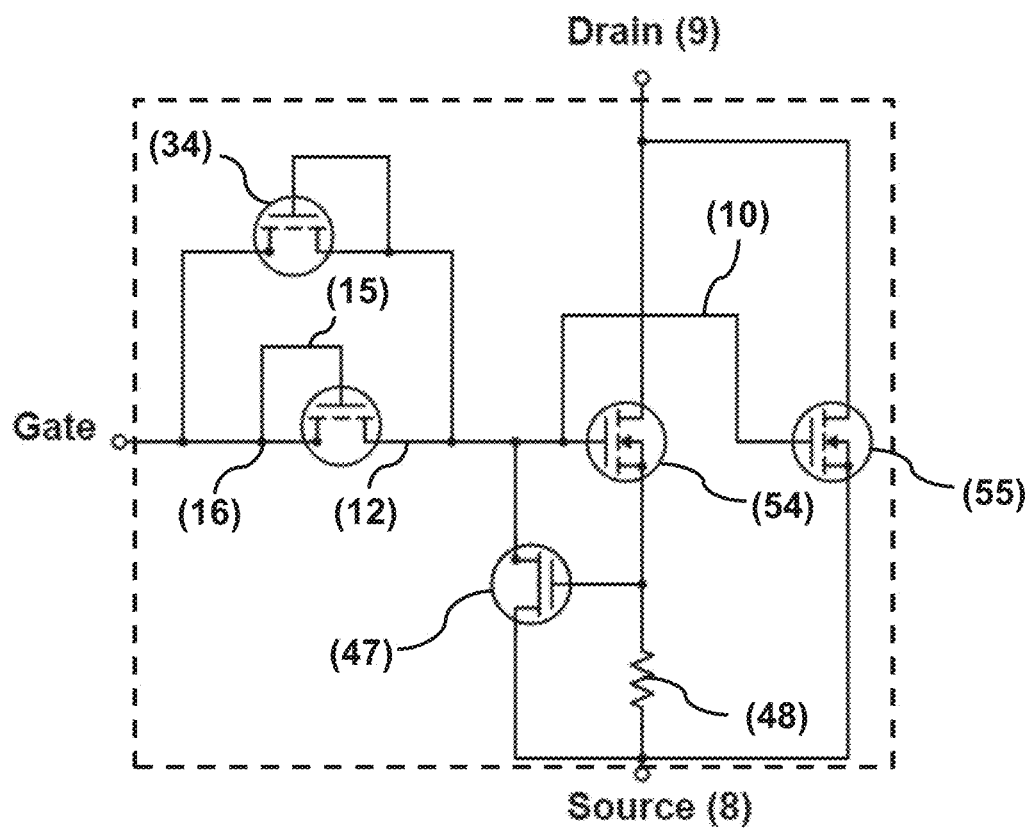
Figure 15:
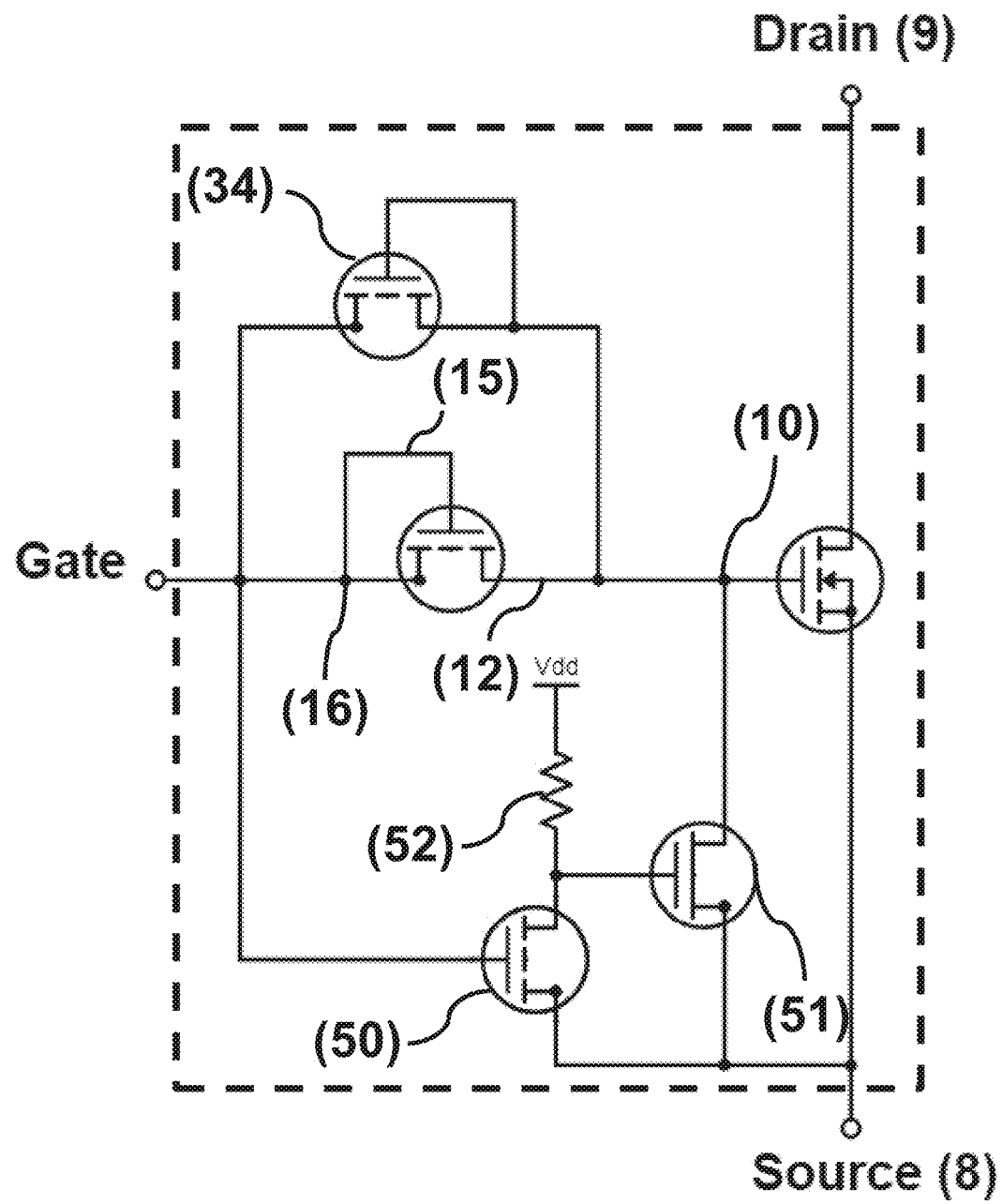
Figure 16:
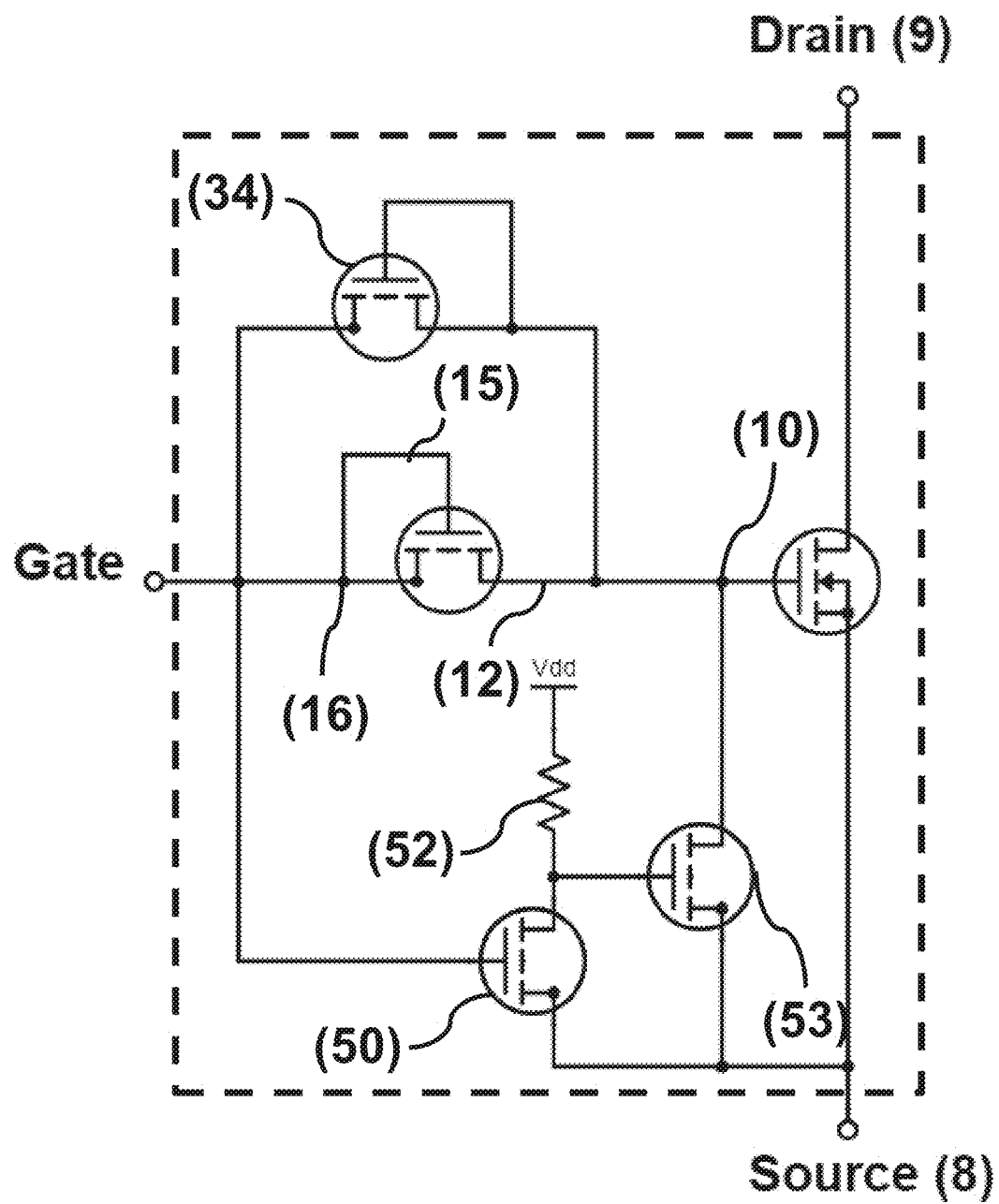
Figure 17:
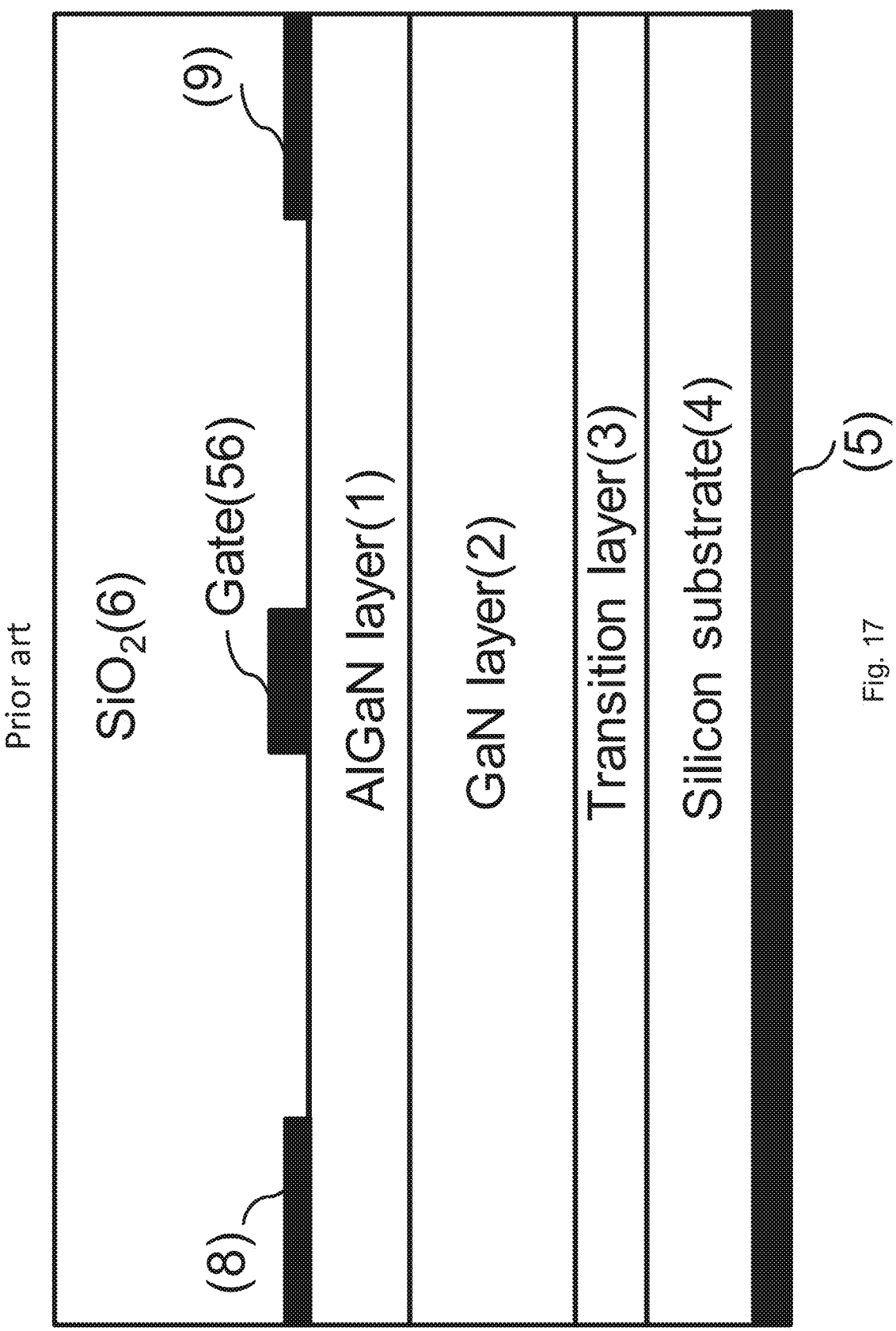
Figure 18:
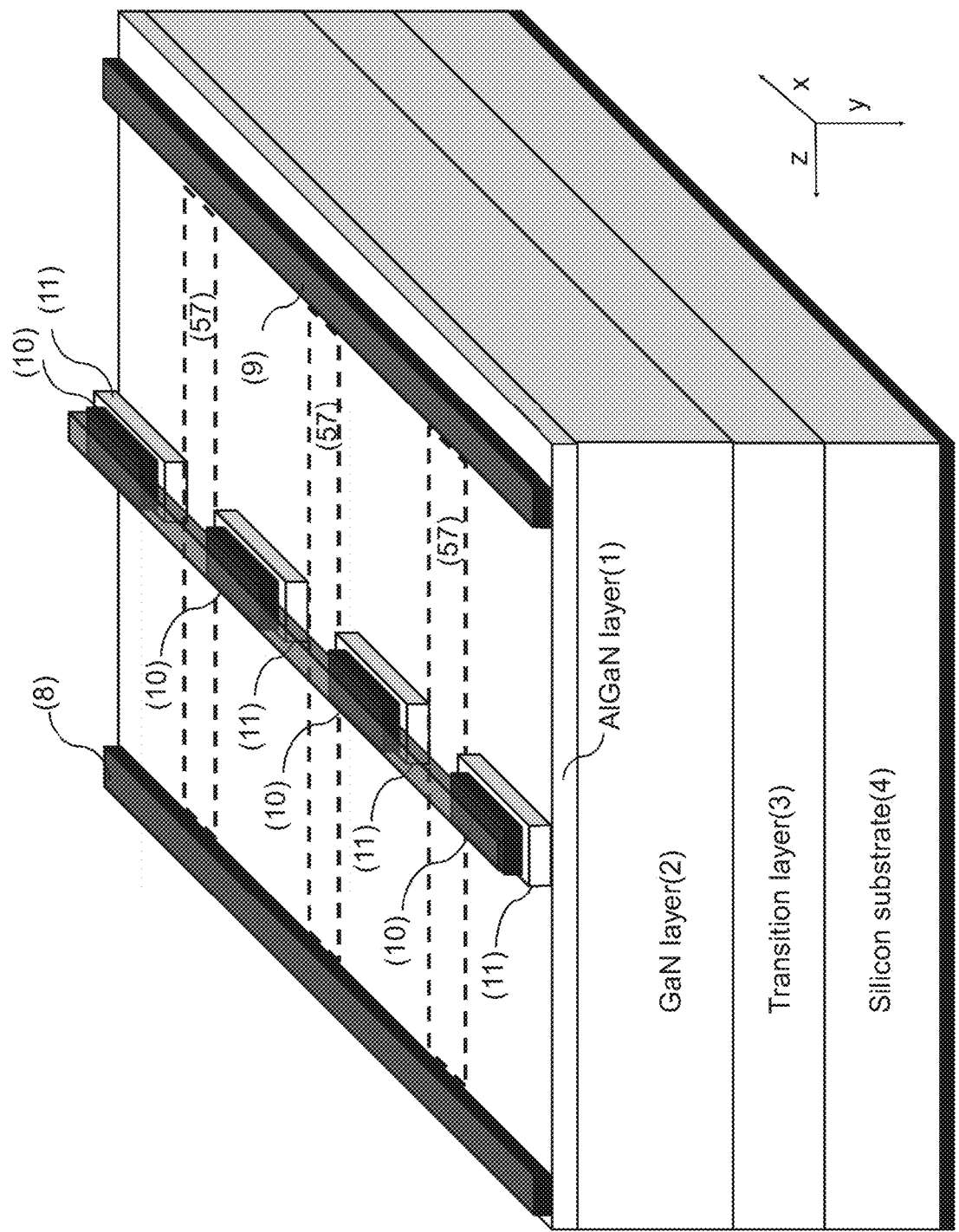
Figure 19:
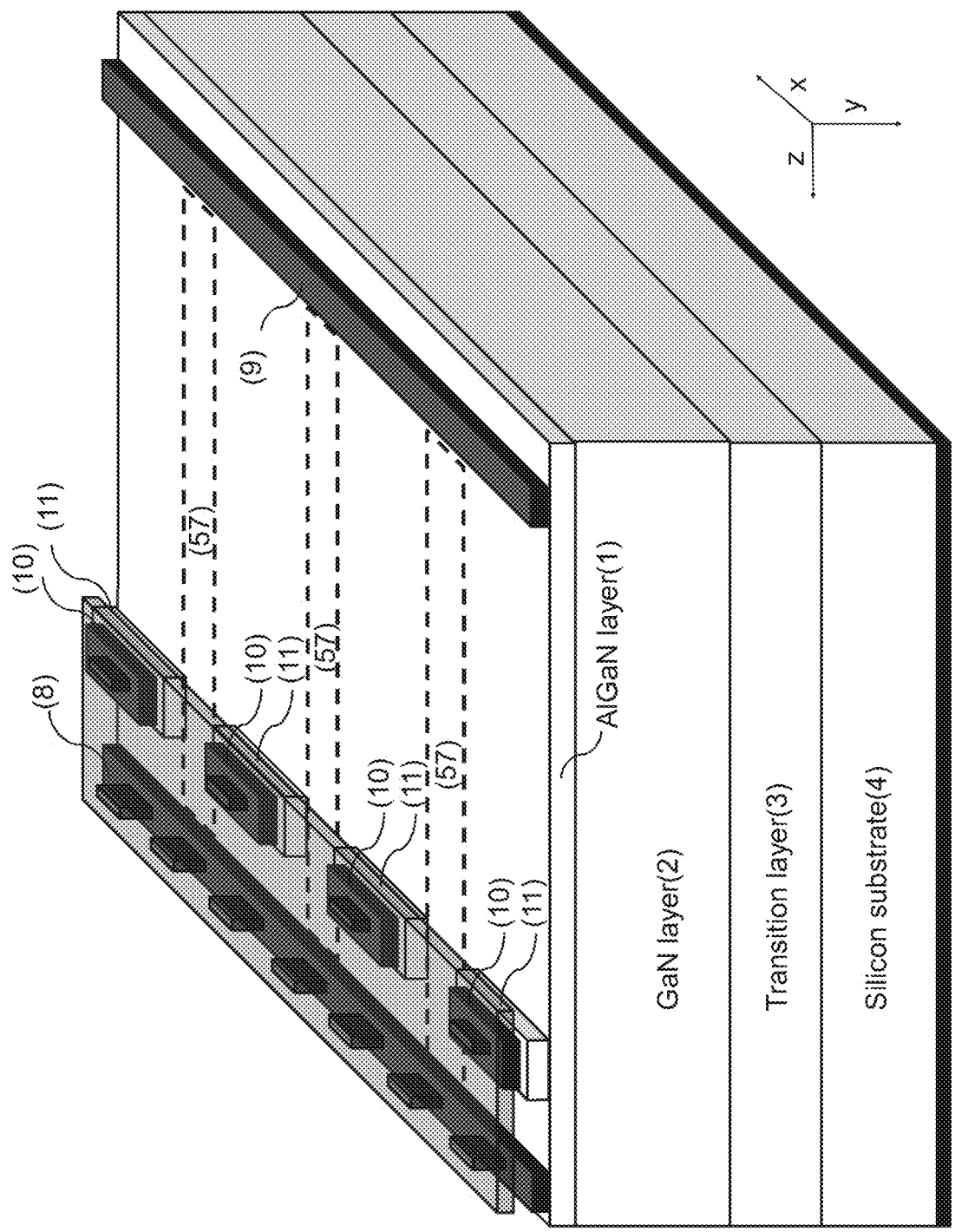
Figure 20:
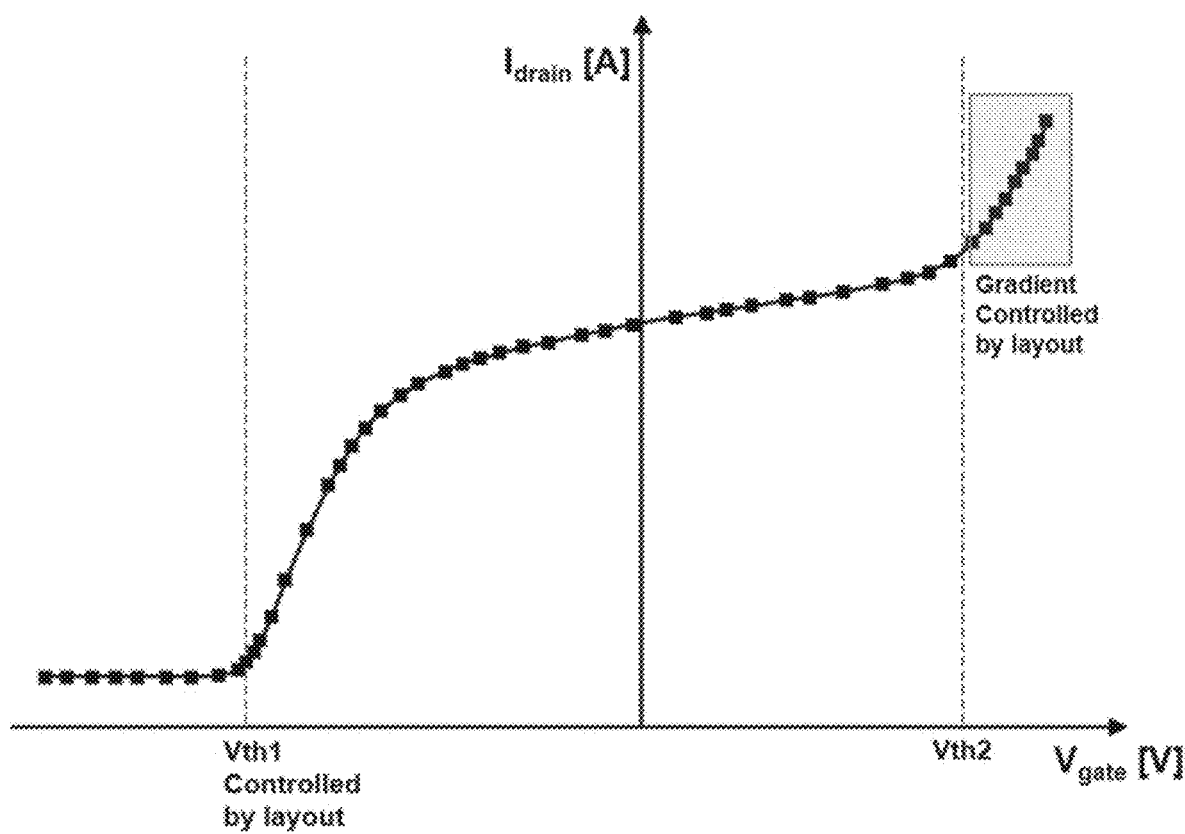

FIG. 6 shows a circuit schematic representation of a further embodiment of the proposed disclosure where a second auxiliary transistor is connected in parallel with a first auxiliary transistor where the drain (gate) terminal of the first low auxiliary transistor is connected to the source terminal of the second auxiliary transistor and the source terminal of the first auxiliary transistor is connected to the drain (gate) terminal of the second auxiliary transistor;

FIG. 7 shows a circuit schematic representation of a further embodiment of the proposed disclosure where a resistor is added between the drain terminal and gate terminal of the second auxiliary transistor;

FIG. 8 shows a circuit schematic representation of a further embodiment of the proposed disclosure where an additional resistor is added between the source terminal of the auxiliary transistor (drain terminal of the second auxiliary transistor) and source terminal of the active device;

FIG. 9 shows a circuit schematic representation of a further embodiment of the proposed disclosure where a third auxiliary transistor is added between the drain terminal and gate terminal of the second auxiliary transistor. The gate terminal of the third auxiliary transistor is connected to the source terminal of the third auxiliary transistor;

FIG. 10 shows a circuit schematic representation of a further embodiment of the proposed disclosure where a third auxiliary transistor is added between the drain terminal and gate terminal of the second auxiliary transistor. The gate terminal of the third auxiliary transistor is connected to the drain terminal of the third auxiliary transistor;

FIG. 11 shows a circuit schematic representation of a further embodiment of the proposed disclosure where a voltage limiting circuit is implemented composed of two resistors forming a potential divider and an actively switched low voltage enhancement mode transistor;

FIG. 12 shows a circuit schematic representation of a further embodiment of the proposed disclosure where a voltage limiting circuit is implemented composed of two resistors forming a potential divider and an actively switched low voltage depletion mode transistor;

FIG. 13 shows a circuit schematic representation of a further embodiment of the proposed disclosure where an over-current protection circuit is implemented composed of a resistor and an actively switched low voltage enhancement mode transistor;

FIG. 14 shows a circuit schematic representation of a further embodiment of the proposed disclosure where an over-current protection circuit is implemented composed of a resistor and an actively switched low voltage depletion mode transistor;

FIG. 15 shows a circuit schematic representation of a further embodiment of the proposed disclosure where an active Miller clamp circuit is implemented composed of a resistor, an actively switched low voltage enhancement mode transistor and an actively switched depletion mode transistor;

FIG. 16 shows a circuit schematic representation of a further embodiment of the proposed disclosure where an active Miller clamp circuit is implemented composed of a resistor, an actively switched low voltage enhancement mode transistor and an actively switched enhancement mode transistor;

FIG. 17 illustrates a schematic representation of a cross section of the active area of a proposed depletion mode device in prior art which can be used as an actively switched transistor;

FIG. 18 illustrates a three dimensional schematic representation of the active area of a proposed depletion mode device with pGaN islands (not found in prior art) which can be used as an actively switched transistor;

FIG. 19 illustrates a three dimensional schematic representation of the active area of the depletion mode device with pGaN islands shown in FIG. 18 operated in diode mode; and FIG. 20 shows the transfer characteristic of the proposed depletion mode device shown in FIG. 18.

Figure 21:
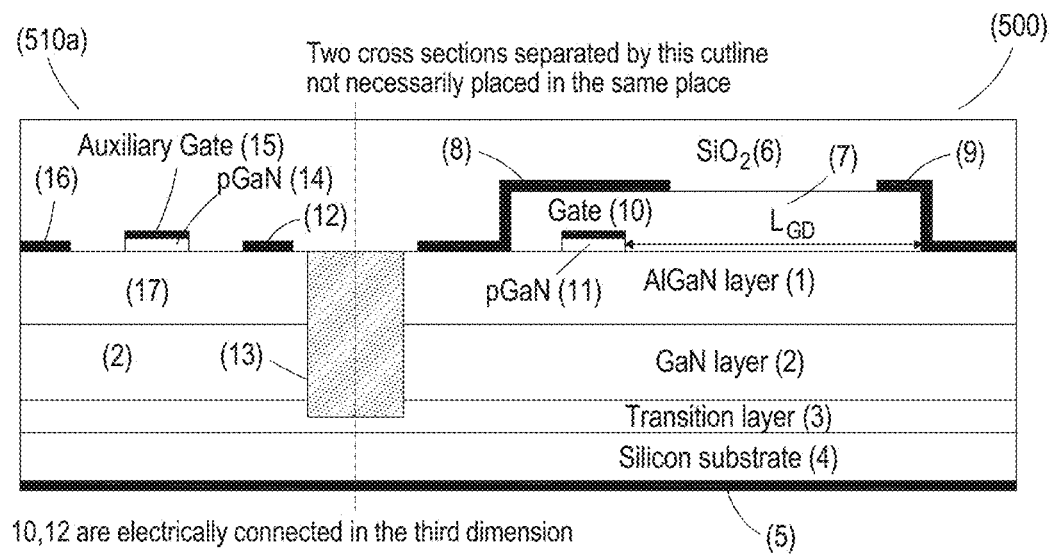

FIG. 21 illustrates a schematic representation of a cross-section of the active area of the proposed disclosure according to another embodiment of the disclosure. In this embodiment, the first additional terminal 16 and the auxiliary gate terminal 15 are not operatively connected.

Figure 22:
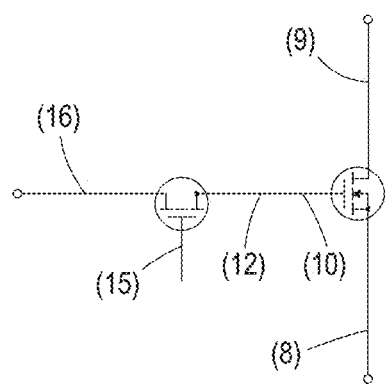

FIG. 22 shows a circuit schematic representation of one embodiment of the proposed disclosure as shown in the schematic cross-section of FIG. 21.

Figure 23:
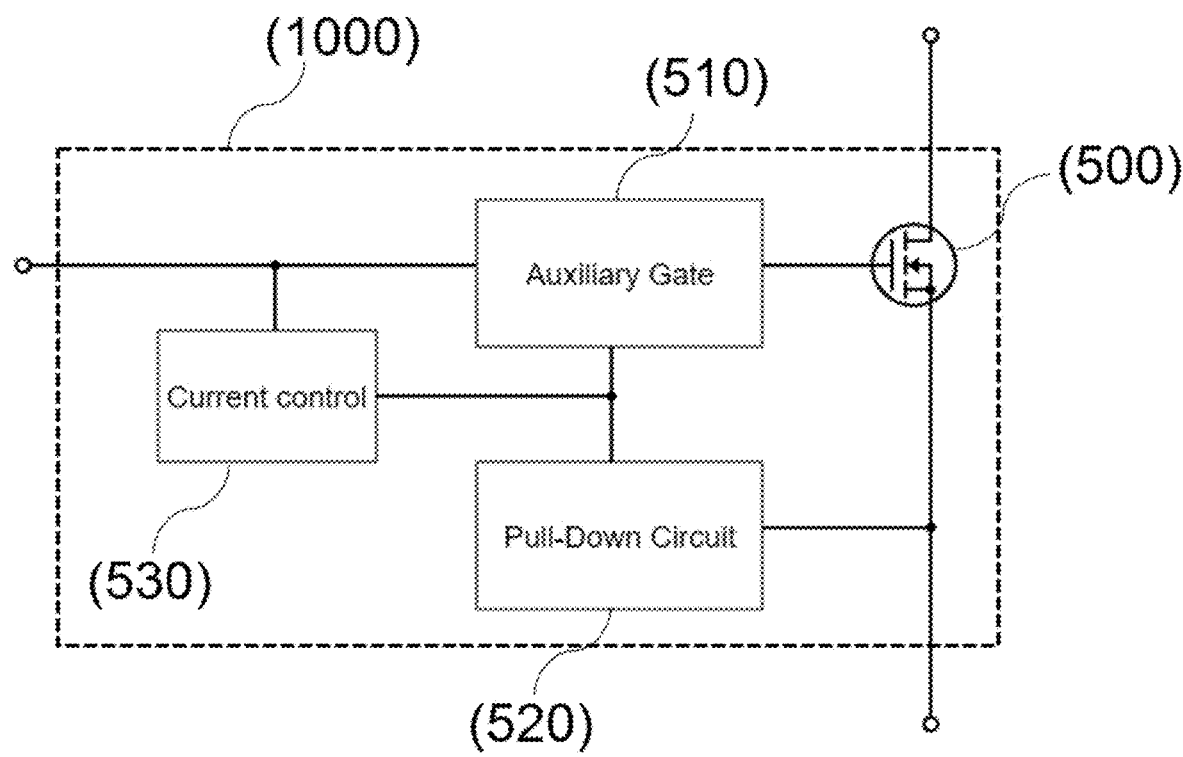

FIG. 23 shows a schematic representation of the second aspect of the one embodiment of the proposed disclosure where the gate terminal of the auxiliary gate block is controlled by a current control block and a pull-down circuit block.

Figure 24:
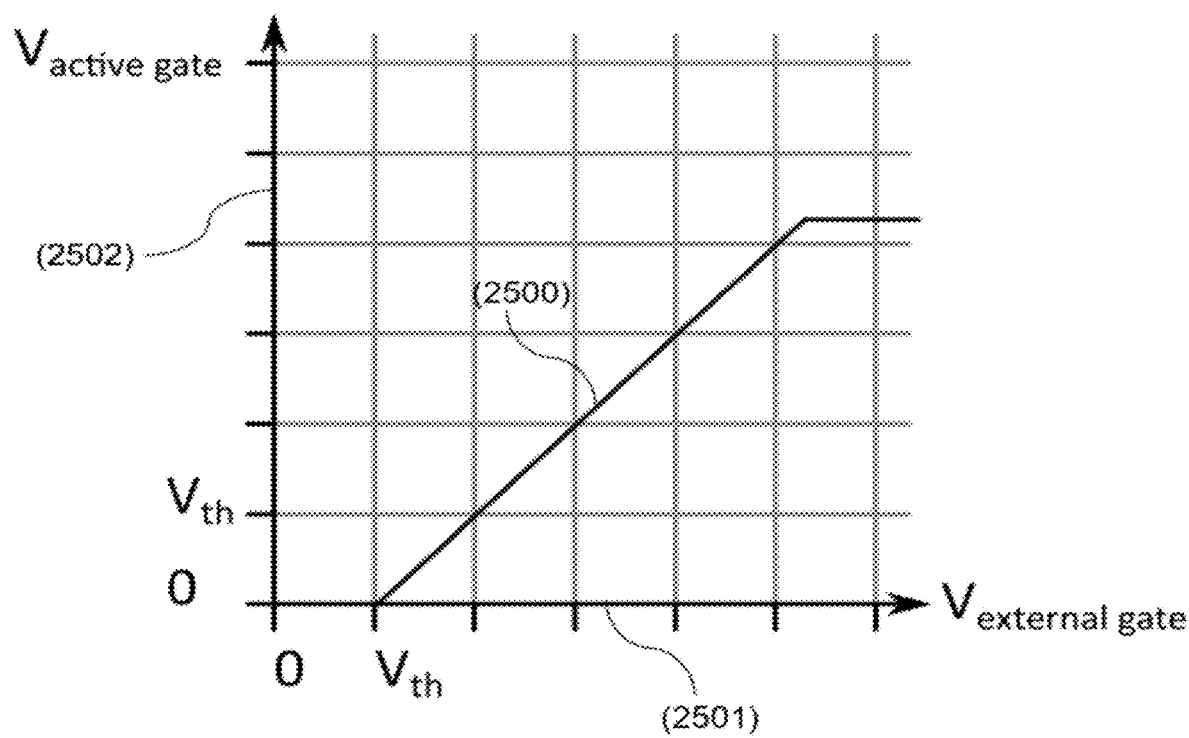

FIG. 24 shows the relationship between the external gate voltage bias and the active gate voltage.

Figure 25:
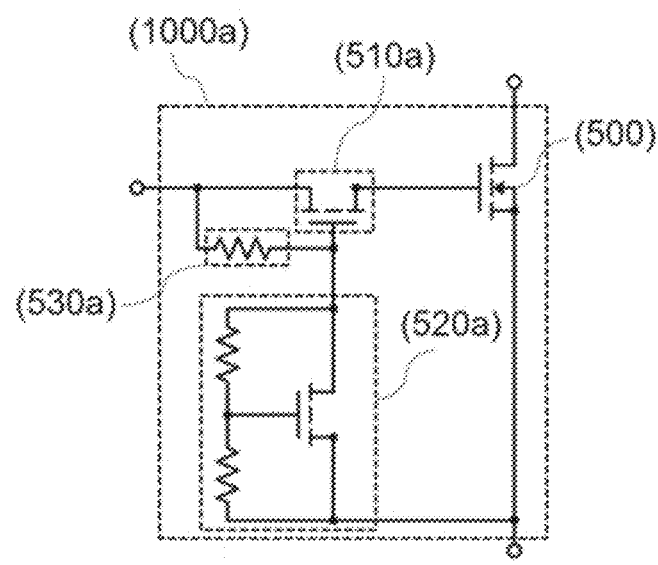

FIG. 25 shows a circuit schematic representation of a further embodiment of the proposed disclosure where the current control block consists of a resistive element and the pull-down circuit comprises a HEMT in threshold multiplier configuration.

Figure 26:
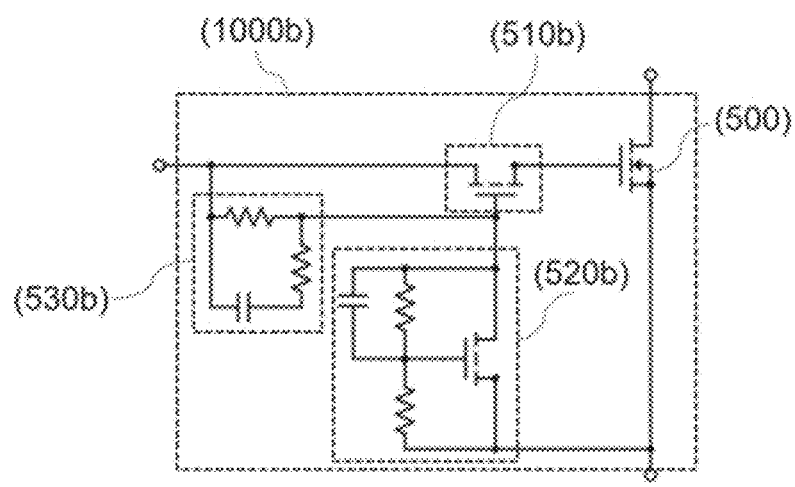

FIG. 26 shows a circuit schematic representation of a further embodiment of the proposed disclosure where the current control block comprises a resistive element with resistive and capacitive elements in parallel and where the pull-down circuit comprises a HEMT in threshold multiplier configuration, with additional capacitive elements.

Figure 27:
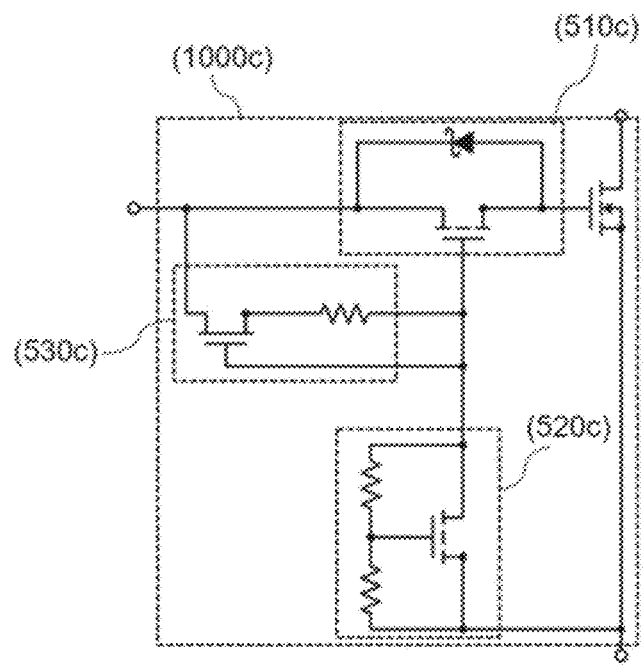

FIG. 27 shows a circuit schematic representation of a further embodiment of the proposed disclosure where the current control block comprises a normally-on HEMT and a resistive element in series where the gate of the normally-on HEMT is connected to the second terminal of the resistive element; and where the pull-down circuit comprises a HEMT in threshold multiplier configuration. In this embodiment, the auxiliary gate block comprises an enhancement mode low voltage HEMT and a Schottky diode in parallel.

Figure 28:
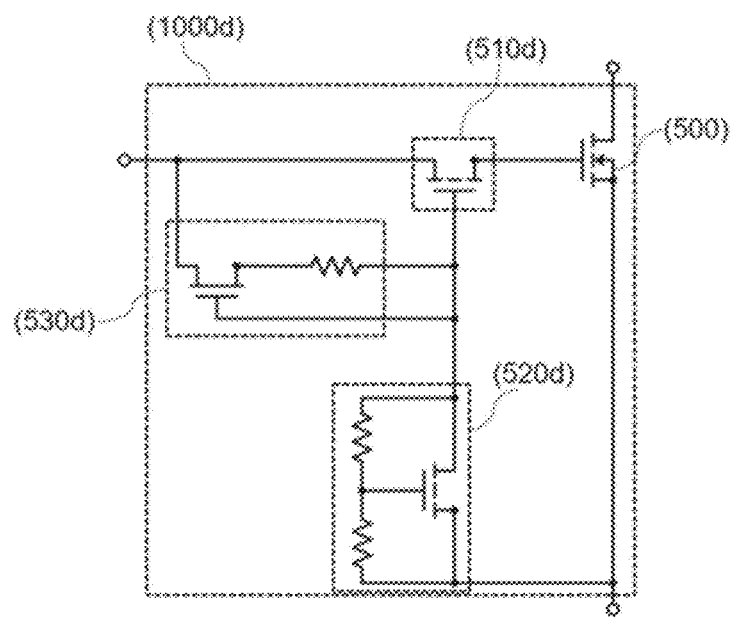

FIG. 28 shows a circuit schematic representation of a further embodiment of the proposed disclosure where the current control block comprises a normally-on HEMT and a resistive element in series where the gate of the normally-on HEMT is connected to the second terminal of the resistive element; and where the pull-down circuit comprises a HEMT in threshold multiplier configuration.

Figure 29:
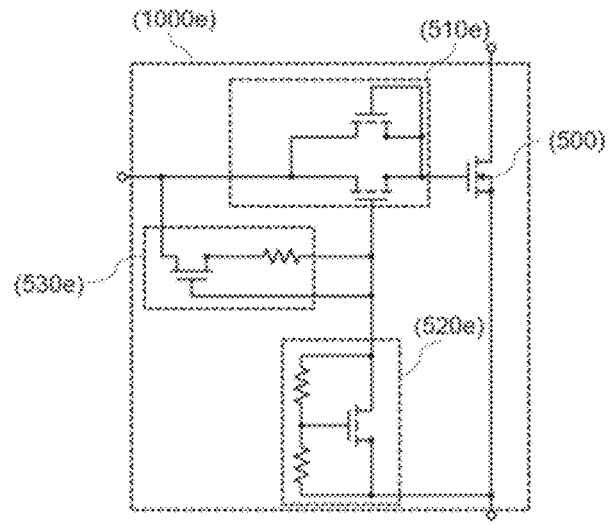
Figure 30:
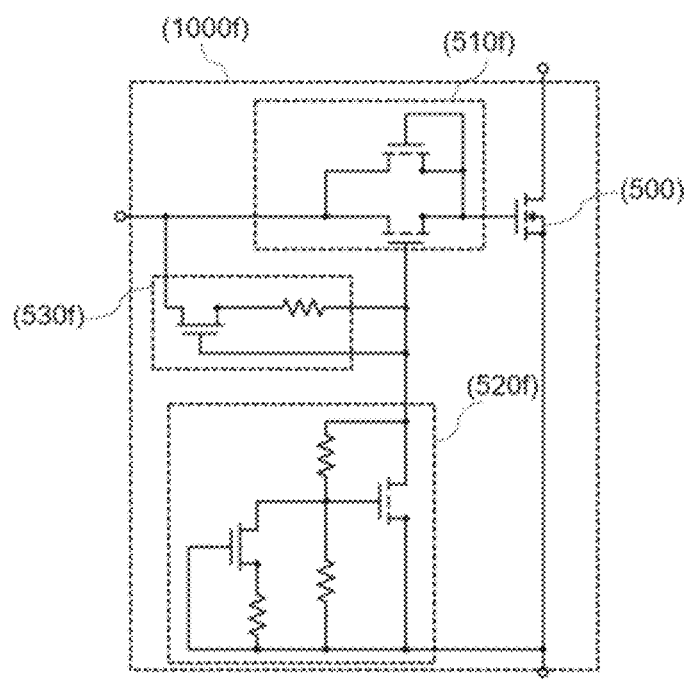

FIG. 29 shows a circuit schematic representation of a further embodiment of the proposed disclosure where the auxiliary gate block comprises a second auxiliary transistor connected in parallel with a first auxiliary transistor where the gate terminal of the second auxiliary transistor is connected to the source terminal of the first auxiliary transistor;

FIG. 30 shows a circuit schematic representation of a further embodiment of the proposed disclosure where the pull-down circuit comprises a HEMT in threshold multiplier configuration. In this embodiment, the voltage divider of the pull-down circuit comprises a temperature compensation circuit comprising a current source in parallel with a resistive element.

Figure 31:
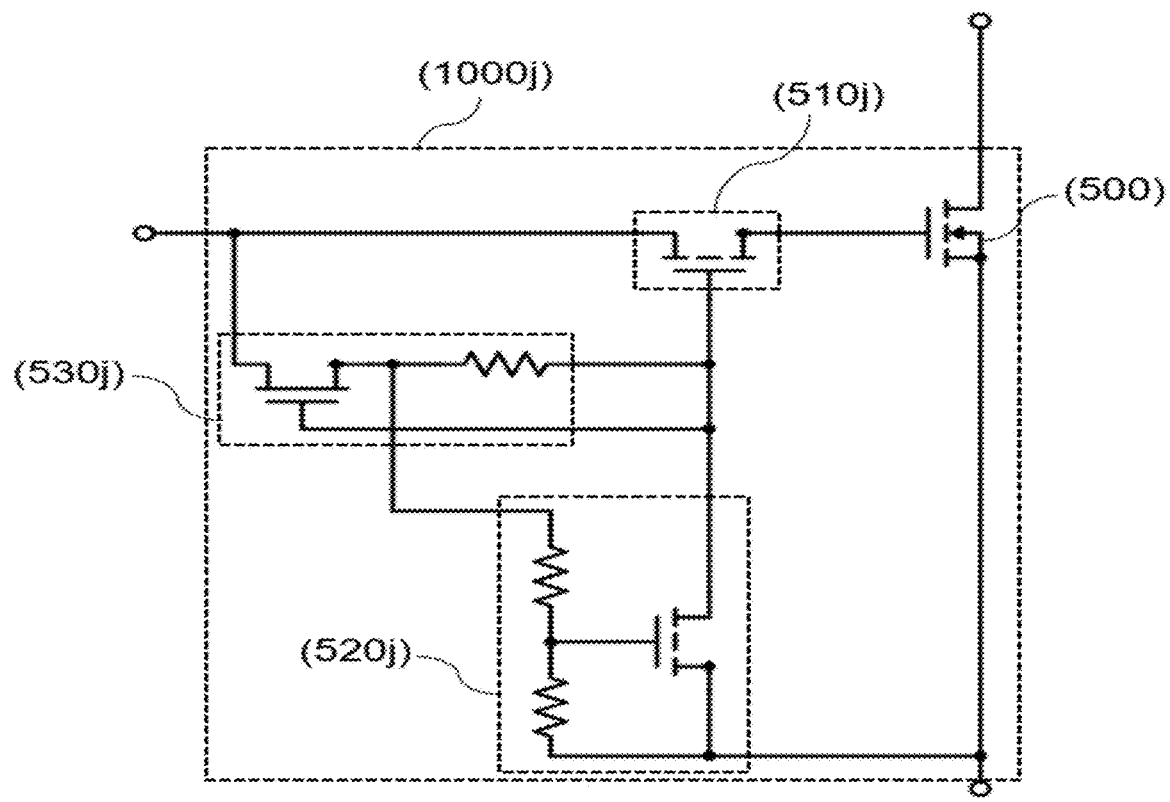

FIG. 31 shows a circuit schematic representation of a further embodiment of the proposed disclosure where the voltage divider of the pull-down circuit is connected to the source terminal of the HEMT of the current control block.

Figure 32:
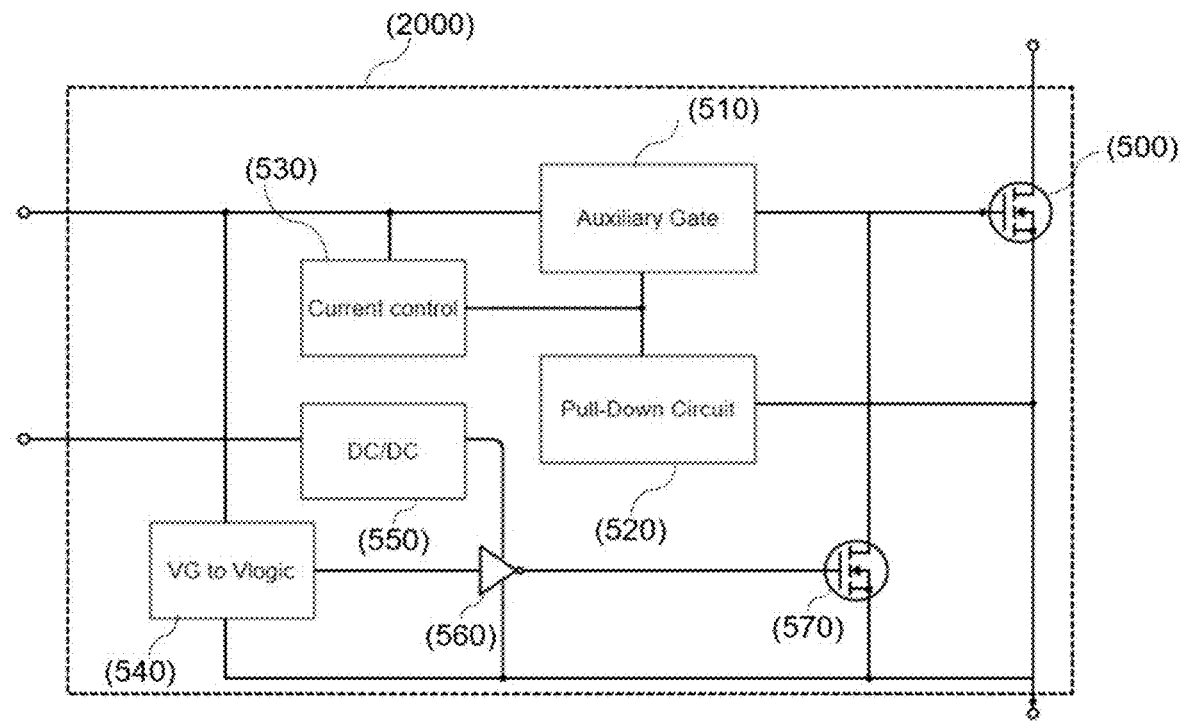

FIG. 32 shows a schematic representation of one embodiment of the proposed disclosure where the gate terminal of the auxiliary gate block is controlled by a current control block and a pull-down circuit block; and where the Miller clamp HEMT is controlled by a logic inverter. The logic inverter is supplied by the output voltage of an integrated DC/DC voltage regulator. Further, the input of the logic inverter is the output of a VG to Vlogic voltage regulator, limiting the voltage from the first additional terminal to a level that is optimised for the integrated GaN HEMT included in the inverter circuit.

Figure 33:
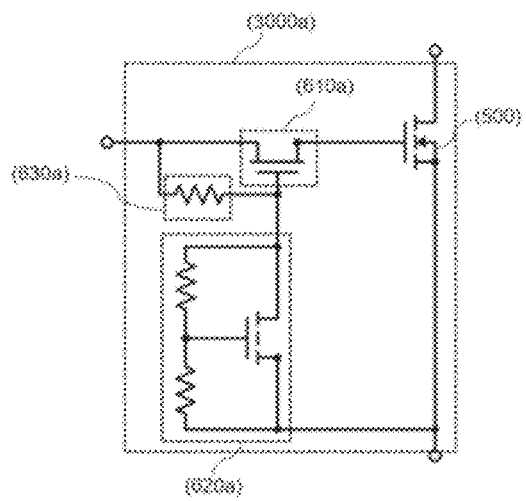

FIG. 33 shows a circuit schematic representation of a further embodiment of the proposed disclosure where the auxiliary gate block comprises a normally-on HEMT.

Figure 34:
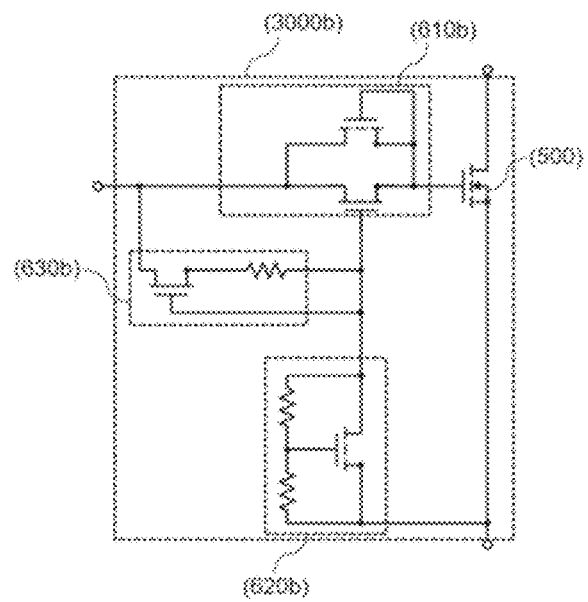
Figure 35:
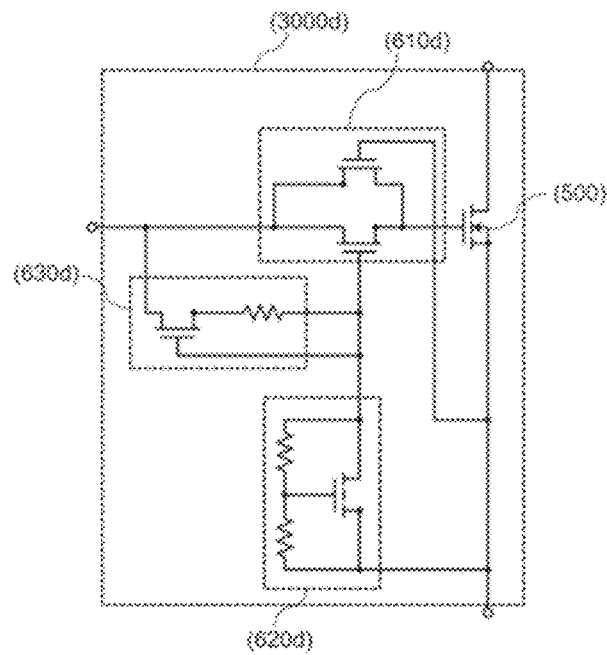
Figure 36:
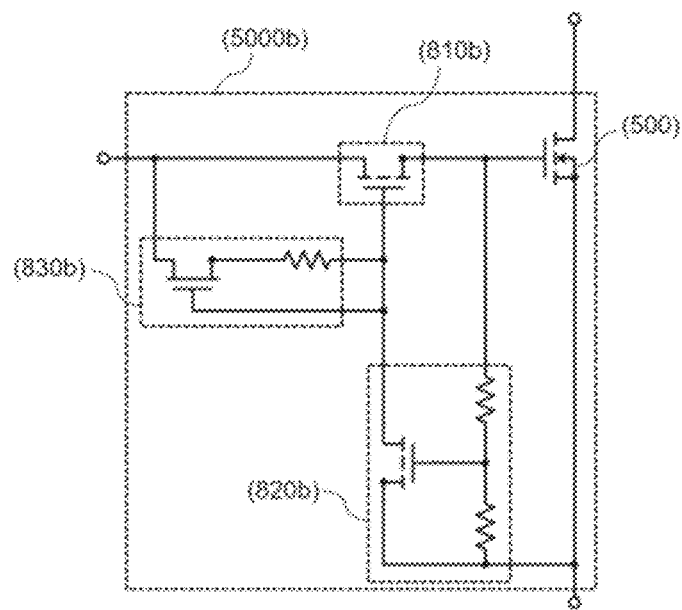

FIG. 34 shows a circuit schematic representation of a further embodiment of the proposed disclosure where the auxiliary gate block comprises a normally-on HEMT and where the auxiliary gate block comprises a second auxiliary transistor connected in parallel with a first auxiliary transistor where the gate terminal of the second auxiliary transistor is connected to the source terminal of the first auxiliary transistor;

FIG. 35 shows a circuit schematic representation of a further embodiment of the proposed disclosure where the auxiliary gate block comprises a normally-on HEMT and where the auxiliary gate block comprises a second auxiliary normally-on HEMT connected in parallel with a first auxiliary transistor where the gate terminal of the second auxiliary transistor is connected to the first terminal;

FIG. 36 shows a circuit schematic representation of a further embodiment of the proposed disclosure where the voltage divider of the pull-down circuit is connected to the active gate terminal.

Figure 37:
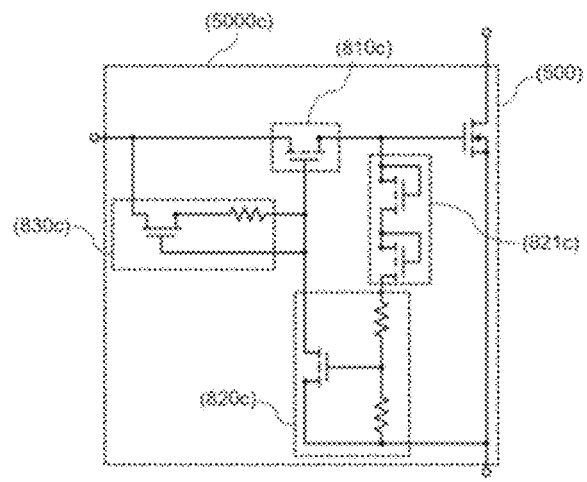

FIG. 37 shows a circuit schematic representation of a further embodiment of the proposed disclosure where the voltage divider of the pull-down circuit is connected to the active gate terminal and where the voltage divider comprises a series of source-gate connected E-HEMTs.

Figure 38:
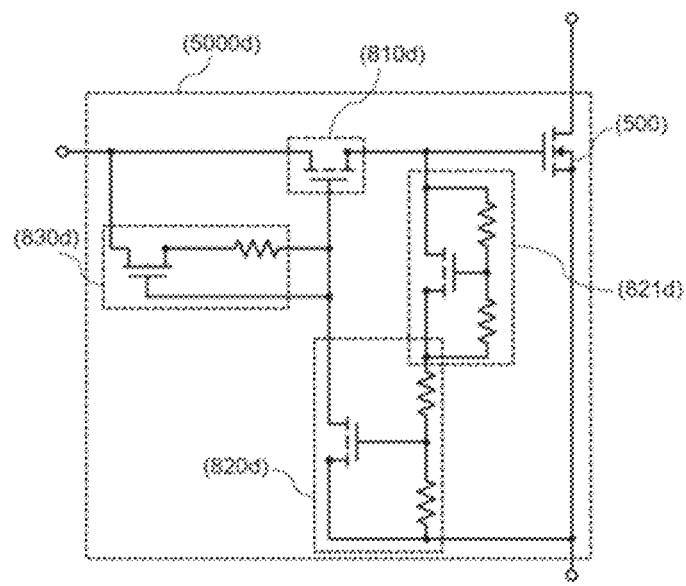

FIG. 38 shows a circuit schematic representation of a further embodiment of the proposed disclosure where the voltage divider of the pull-down circuit is connected to the active gate terminal and where the voltage divider comprises a HEMT in a threshold multiplier configuration.

Figure 39:
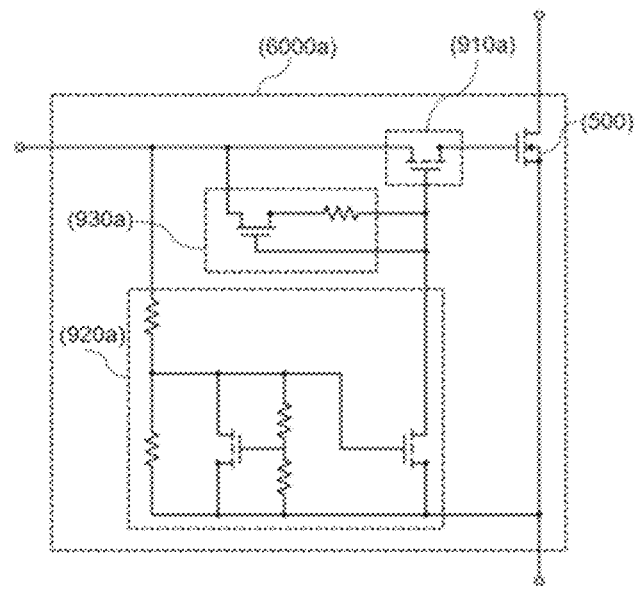

FIG. 39 shows a circuit schematic representation of a further embodiment of the proposed disclosure where the voltage divider of the pull-down circuit is connected to the first additional terminal and where the voltage divider comprises a HEMT in a threshold multiplier configuration.

Figure 40:
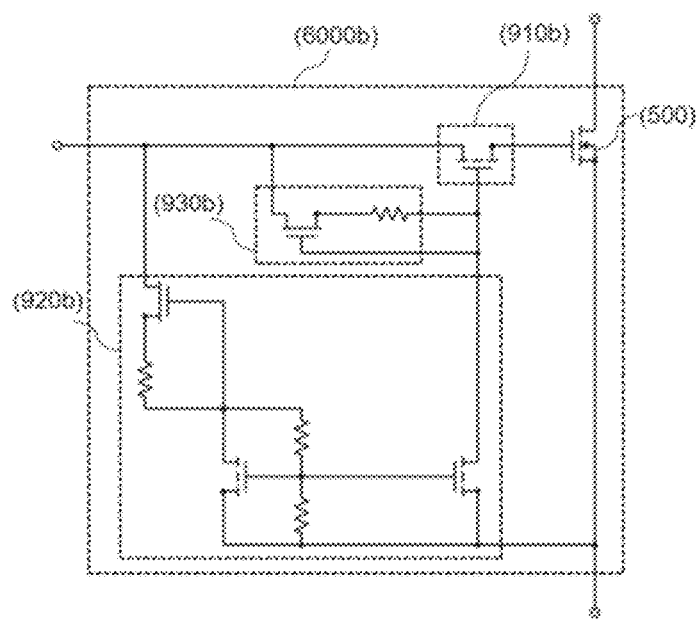

FIG. 40 shows a circuit schematic representation of a further embodiment of the proposed disclosure where the voltage divider of the pull-down circuit is connected to the first additional terminal and where the voltage divider comprises a current source, formed of a normally-on HEMT and a resistor, and a HEMT in a threshold multiplier configuration. In this embodiment, the output of the voltage divider is the gate terminal of the HEMT which is in threshold multiplier configuration.

Figure 41:
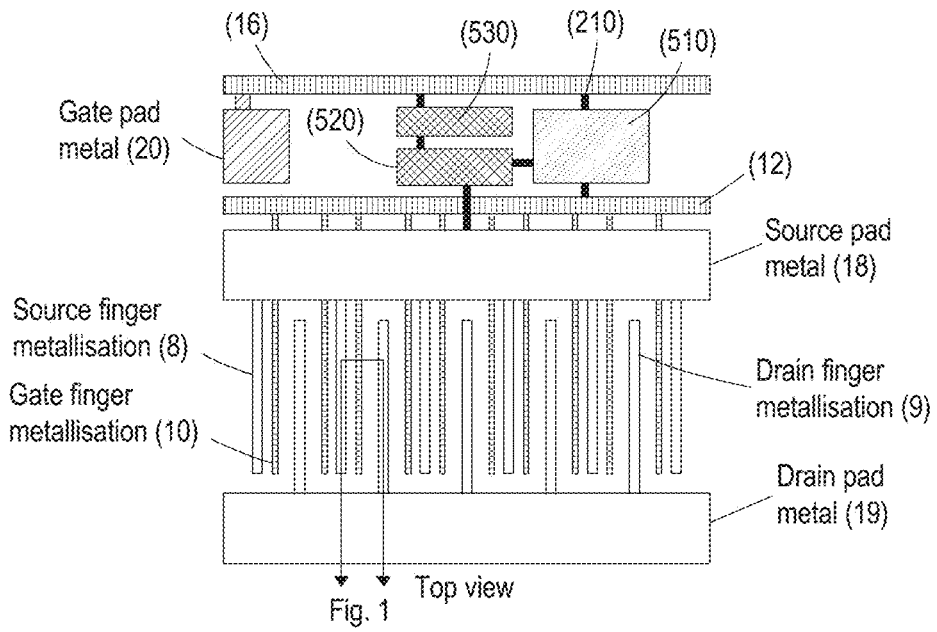

FIG. 41 illustrates an interdigitated device layout of a further embodiment of the disclosure incorporating an auxiliary gate structure with the current control block and the pull-down circuit block.

Figure 42:
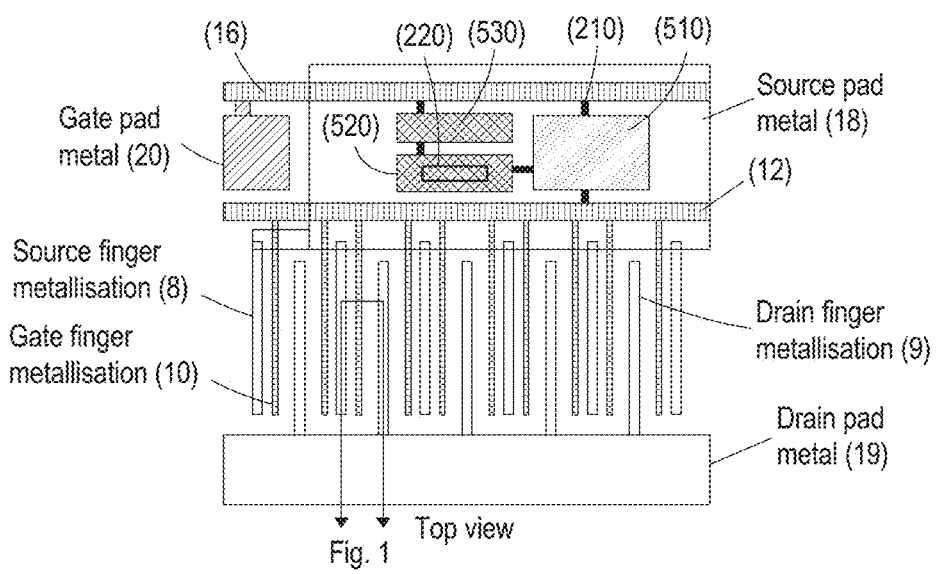

FIG. 42 illustrates an interdigitated device layout of a further embodiment of the disclosure in which the auxiliary gate with the current control block and the pull-down circuit block and terminal regions are placed below the source pad metal.

Figure 43:
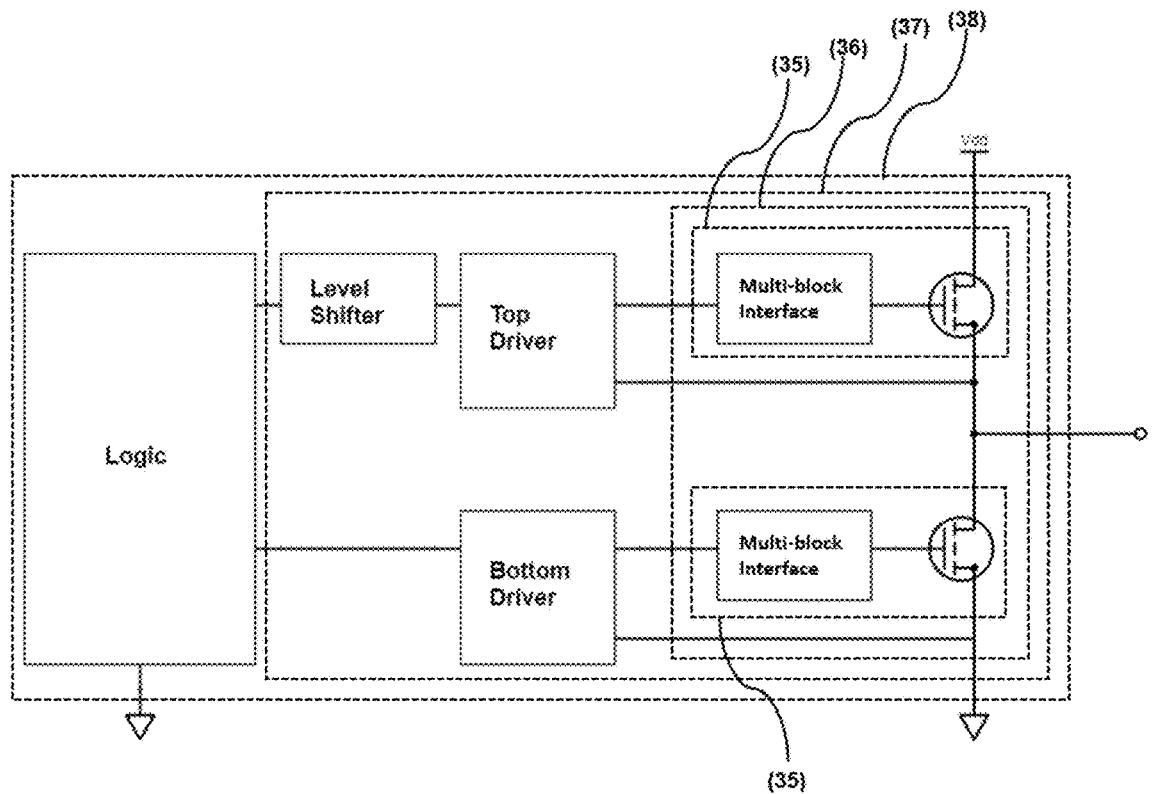

FIG. 43 shows a block diagram of a further embodiment of the proposed disclosure where any of the embodiments of the GaN chip power device according to this disclosure are placed in a half-bridge configuration.

Figure 44:
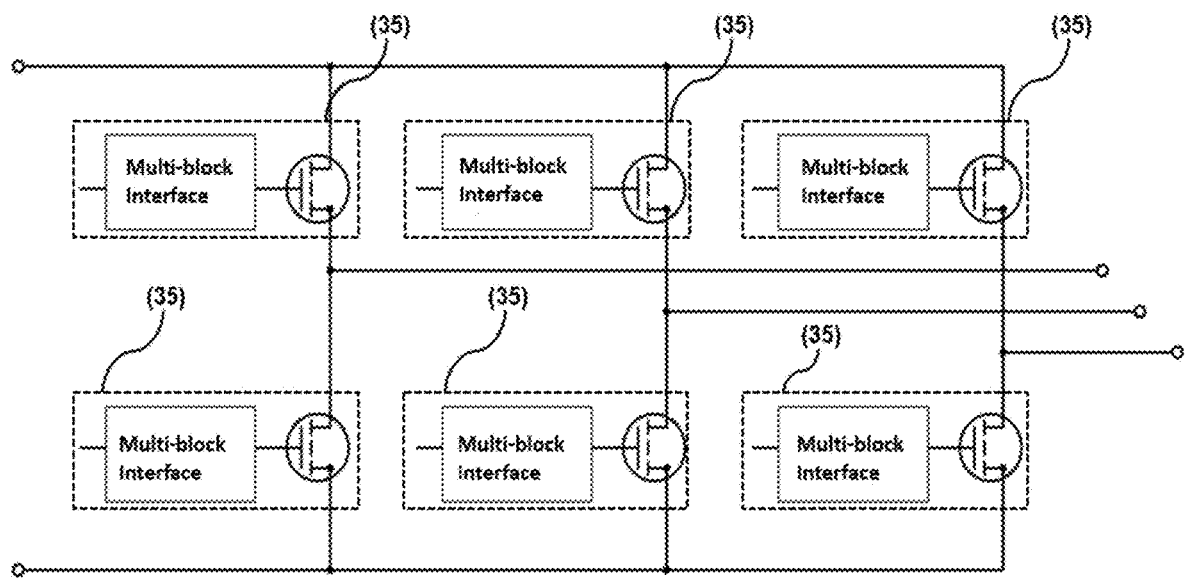

FIG. 44 shows a block diagram of a further embodiment of the proposed disclosure where any of the embodiments of the GaN chip power device according to this disclosure are placed in a three-phase half-bridge configuration.

Figure 45:
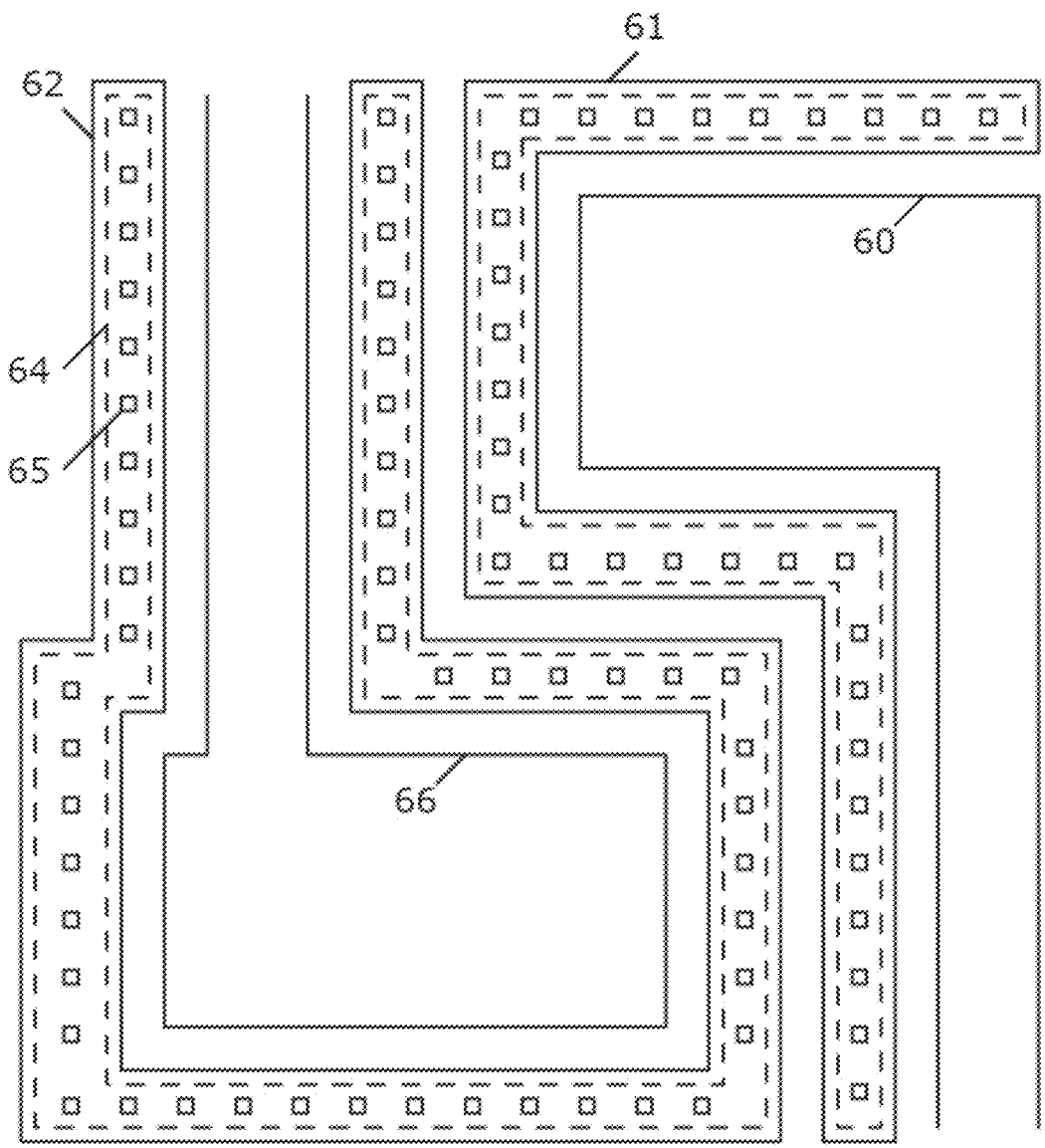

FIG. 45 shows a schematic representation of one embodiment of a shielding and decoupling structure between two structures of the chip. In this embodiment, the decoupling structures consist of 2DEG structures ohmic contacts and connections to metal layers through vias. The metal layer may be shaped similar to the 2DEG.

Figure 46:
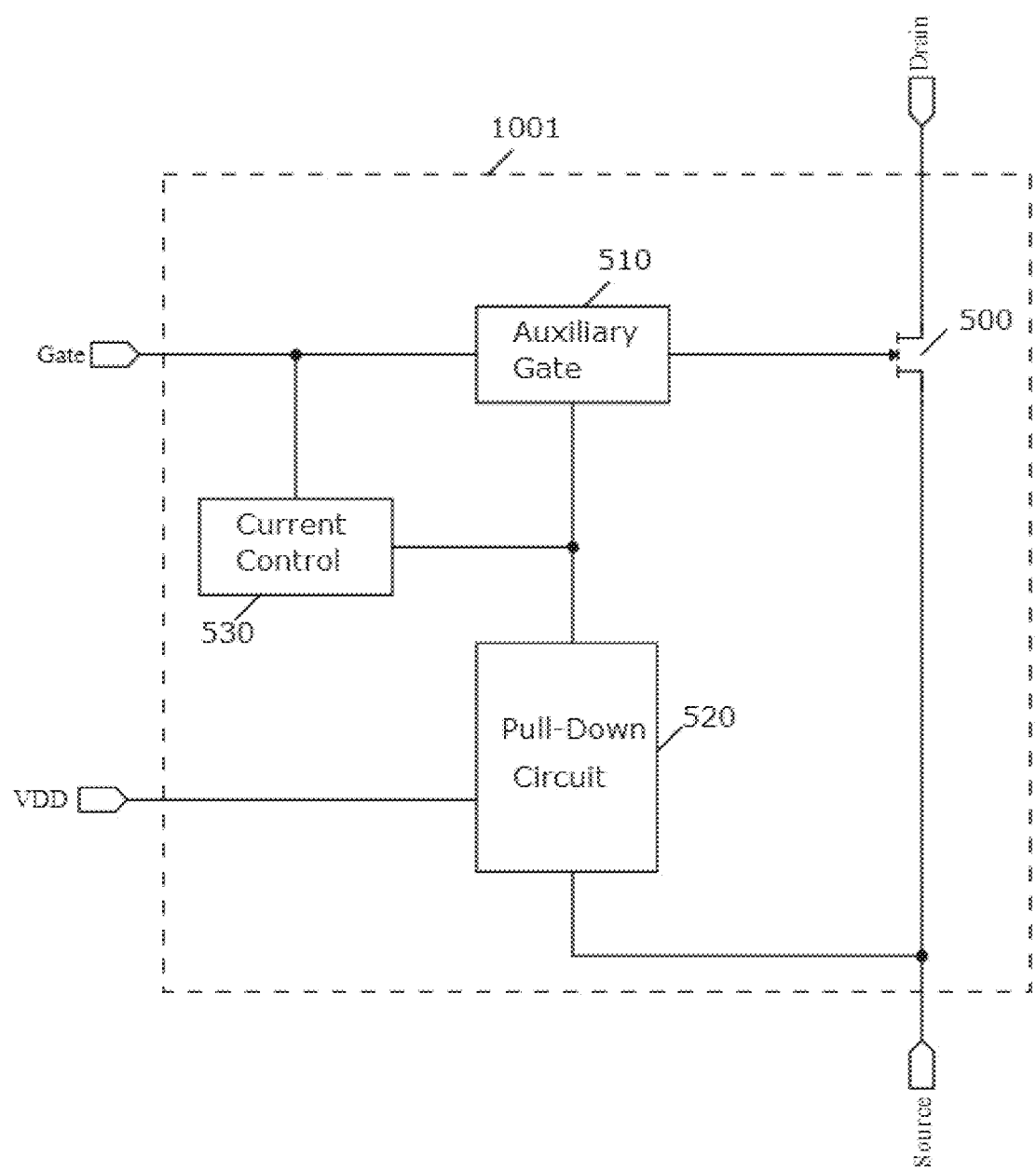

FIG. 46 shows a schematic representation of one embodiment of the invention in which the pull-down circuit comprises an additional voltage input from an external terminal.

Figure 47:
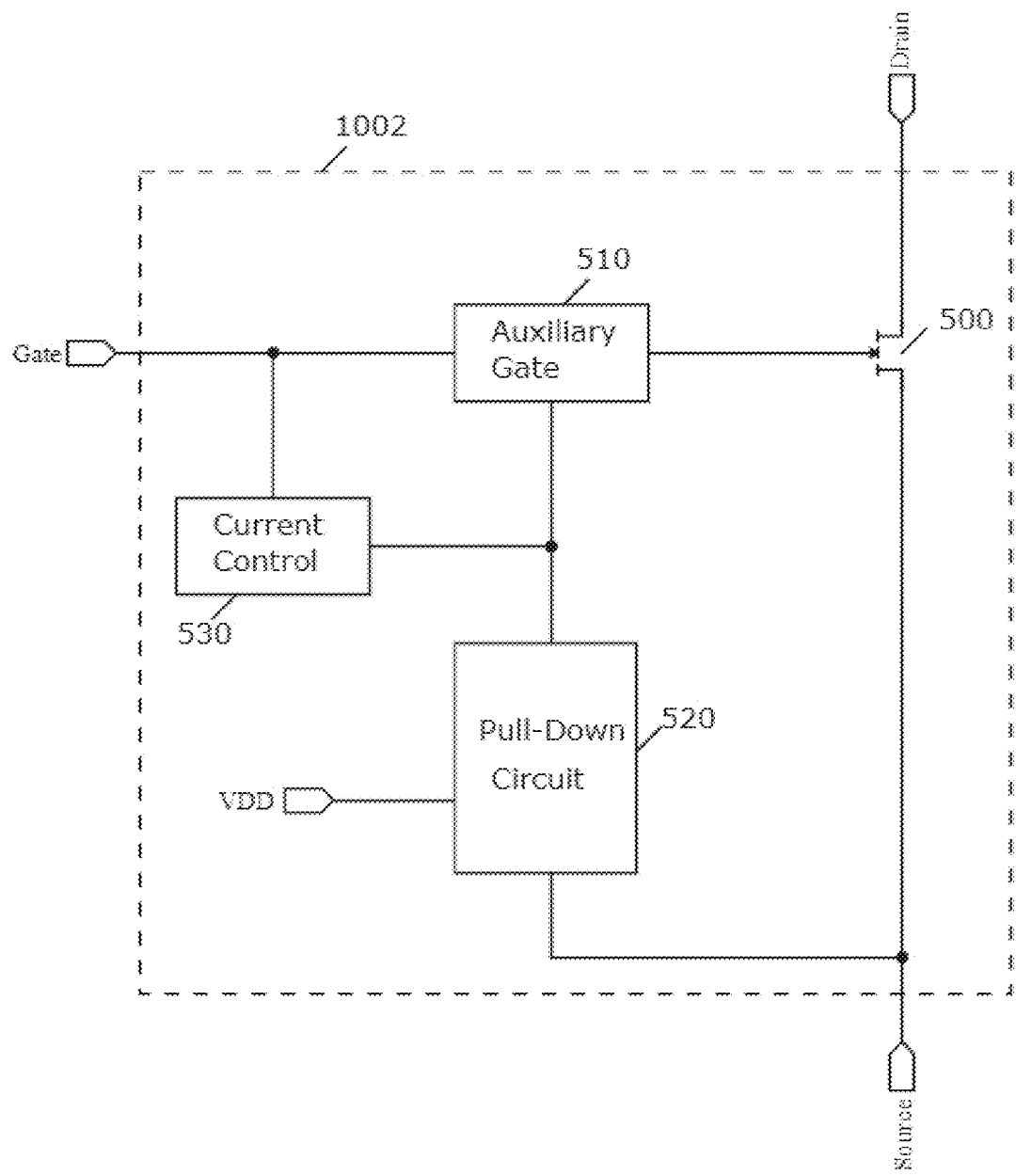

FIG. 47 shows a schematic representation of one embodiment of the invention in which the pull-down circuit comprises an additional voltage input stemming from a voltage source on the chip. This voltage source may be the output of a voltage regulator, voltage divider, charge pump or other switched voltage converter.

Figure 48:
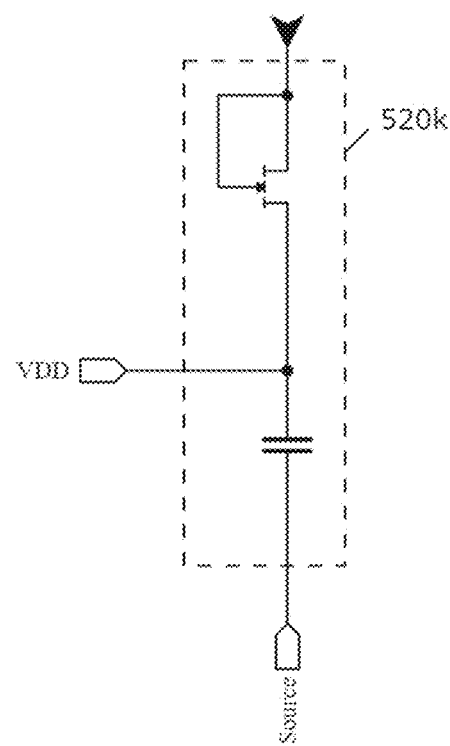

FIG. 48 shows a schematic representation of one embodiment of the pull-down circuit comprising a voltage source and capacitor in series with an enhancement HEMT with the gate terminal connected to the source terminal.

Figure 49:
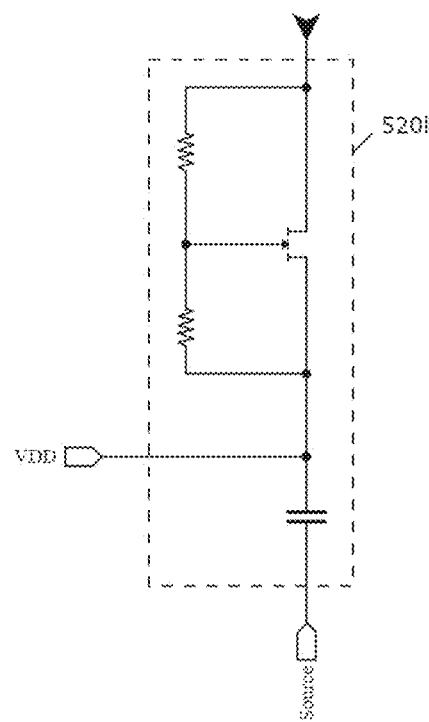

FIG. 49 shows a schematic representation of one embodiment of the pull-down circuit comprising a voltage source and capacitor in series with an enhancement HEMT in a threshold multiplier configuration.

Figure 50:
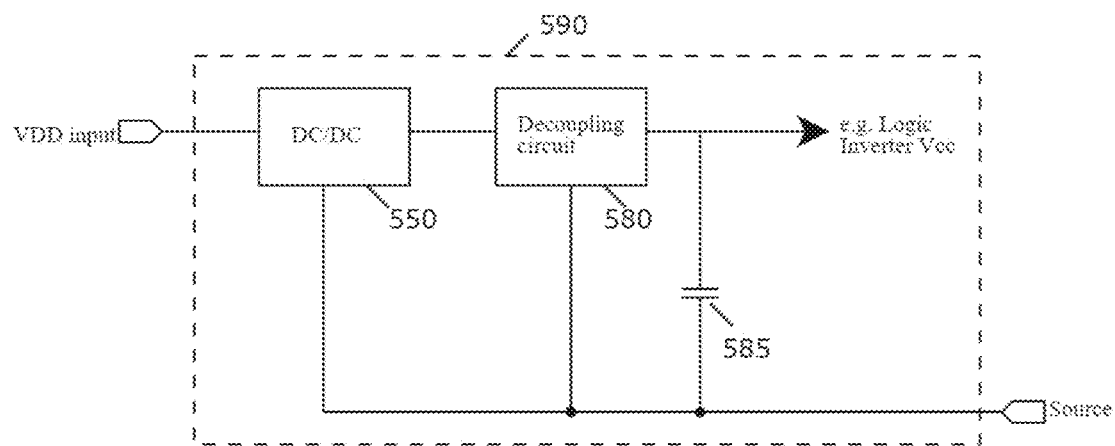

FIG. 50 shows a block diagram of a voltage regulator connected to the input of the receiving circuit (for example logic inverter) through a decoupling circuit. The decoupling circuit reduces or eliminates the impact of voltage excursions or current spikes from the voltage source to the receiving circuit.

Figure 51:
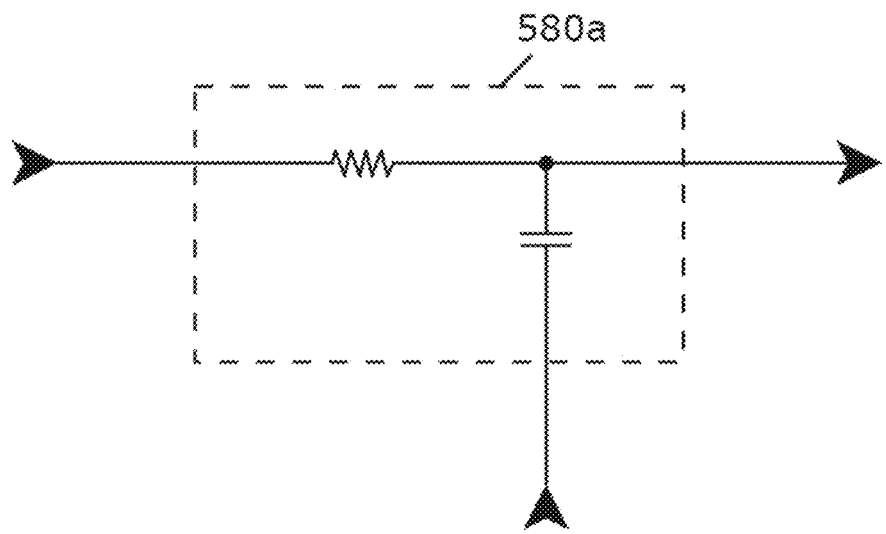

FIG. 51 shows a schematic circuit of a decoupling circuit comprising a resistive element and a capacitive element.

Figure 52:
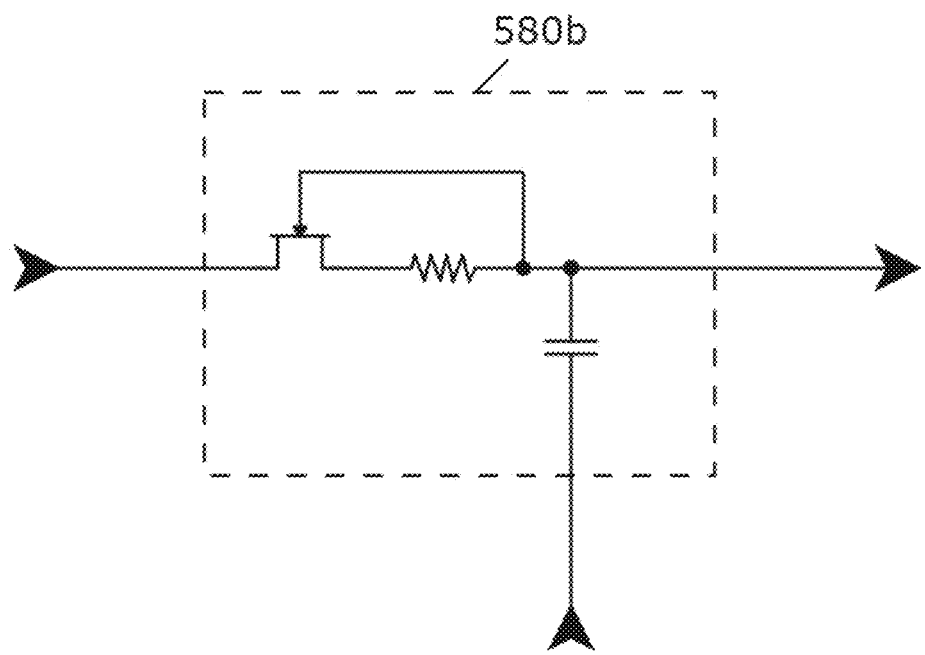

FIG. 52 shows a schematic circuit of a decoupling circuit comprising a current source and a capacitive element. The current source comprises a depletion HEMT and a resistive element.

Figure 53:
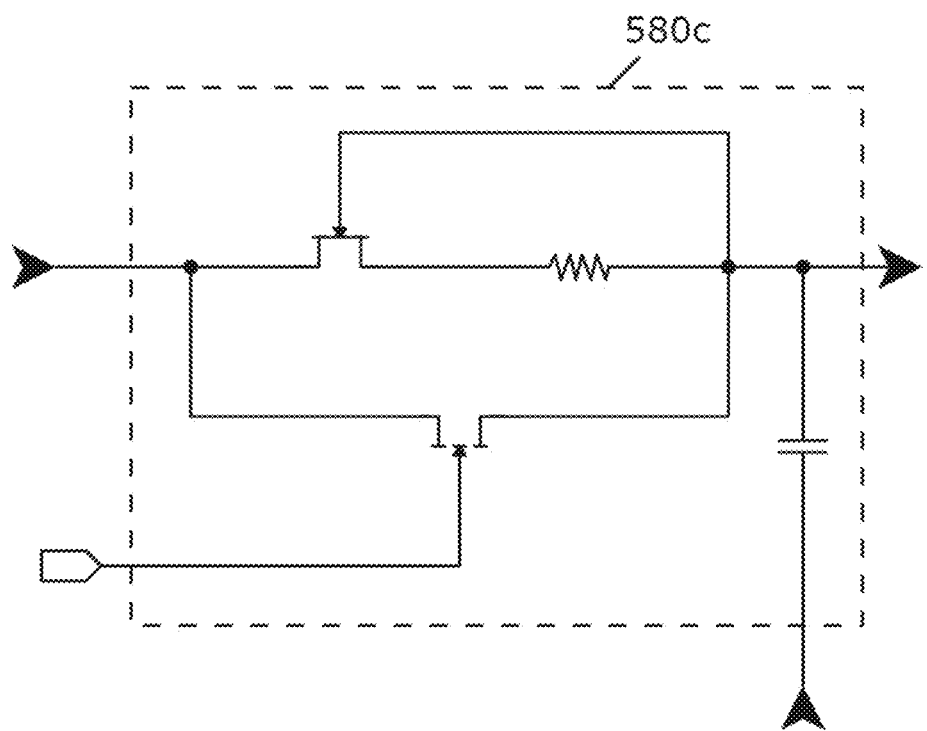

FIG. 53 shows a schematic circuit of a decoupling circuit comprising a current source and a capacitive element. The current source comprises a depletion HEMT and a resistive element. In this embodiment, an additional HEMT in parallel to the current source allows the adjustment of the current limit.

Figure 54:
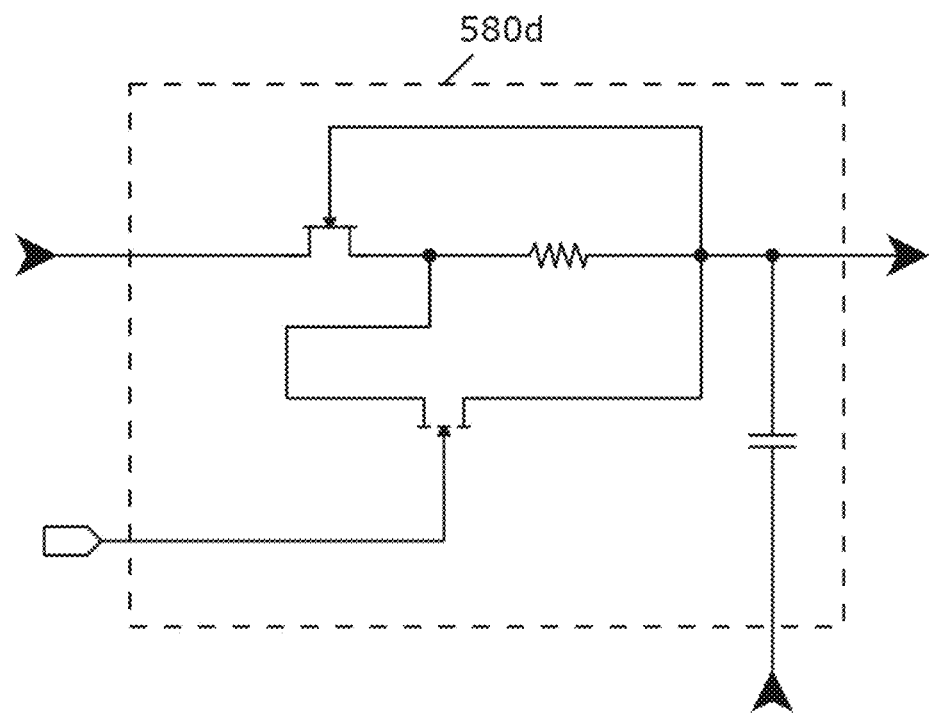

FIG. 54 shows a schematic circuit of a decoupling circuit comprising a current source and a capacitive element. The current source comprises a depletion HEMT and a resistive element. In this embodiment, an additional HEMT in parallel to the resistive element allows the adjustment of the current limit.

Figure 55:
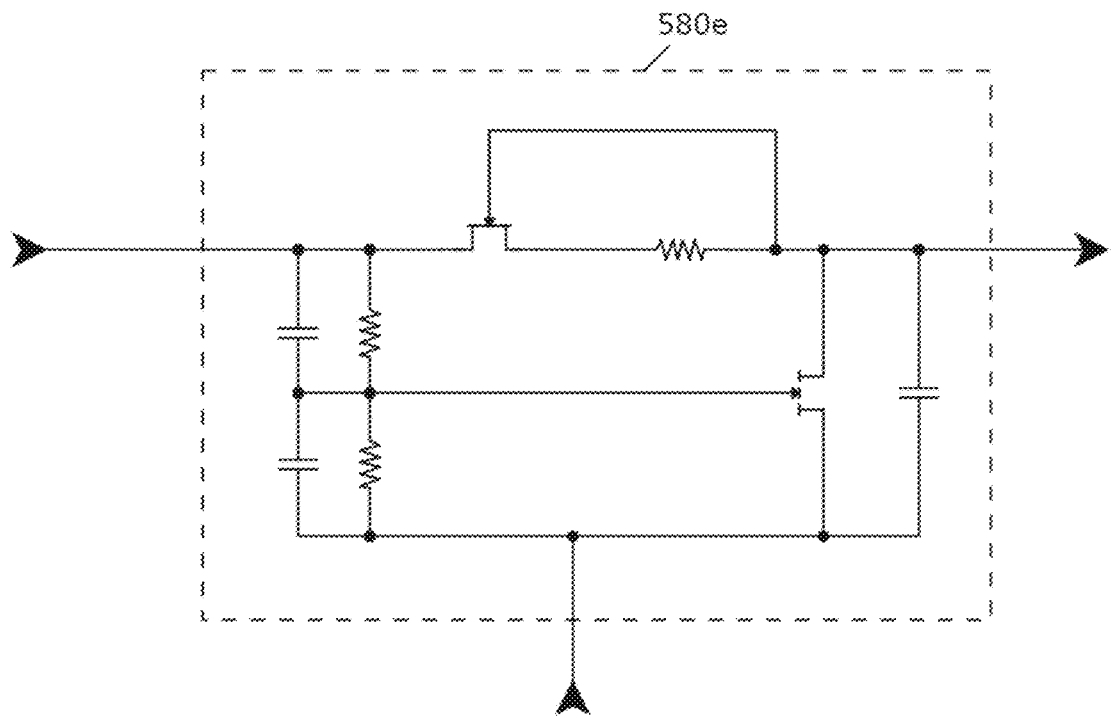

FIG. 55 shows a schematic circuit of a decoupling circuit comprising a current source and a capacitive element. The current source comprises a depletion HEMT and a resistive element. In this embodiment, an additional HEMT in parallel to the capacitive element allows sinking the current in case of a current spike. The additional HEMT is turned on by a resistive and capacitive voltage divider on the input side of the decoupling circuit.

Figure 56:
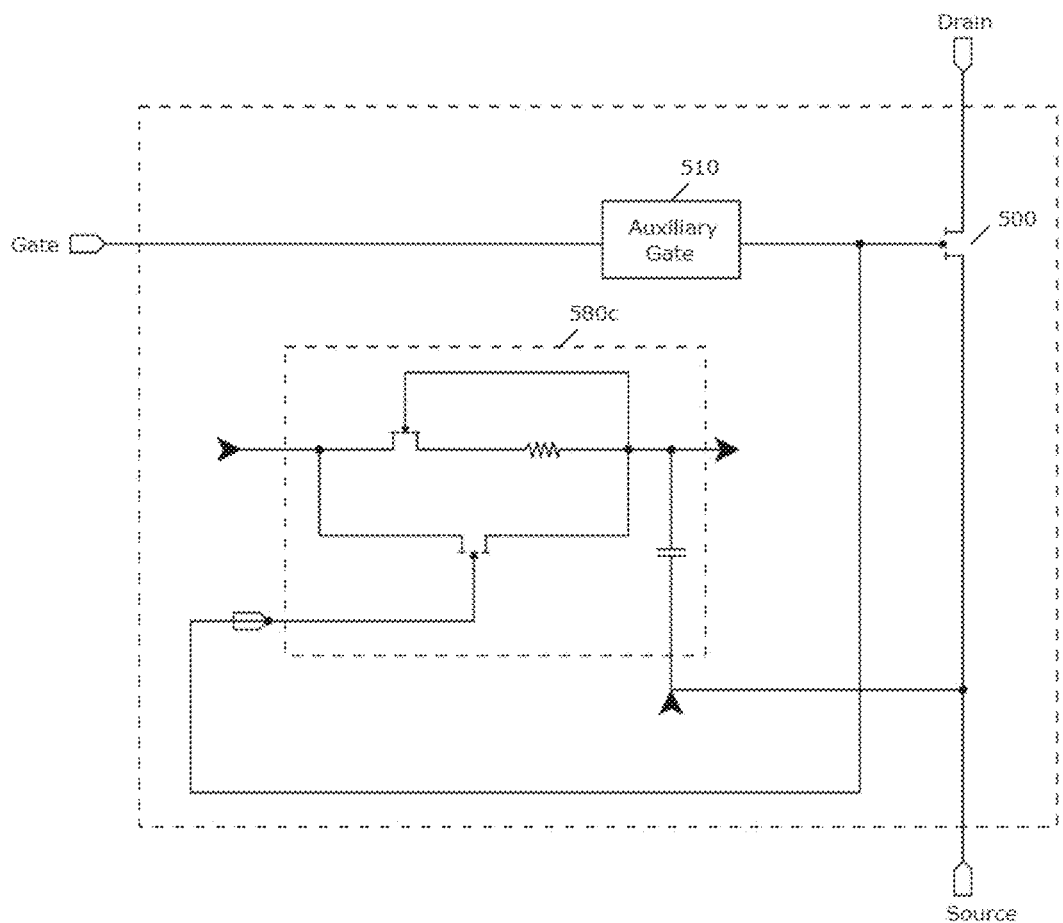

FIG. 56 shows an embodiment of FIG. 55 in which the additional HEMT in parallel with the current source is controlled by having its gate connected to the gate voltage of the active HEMT. In this embodiment, the coupling is strong when the active HEMT is in the on-state, weak when the active HEMT is off.

Figure 57:
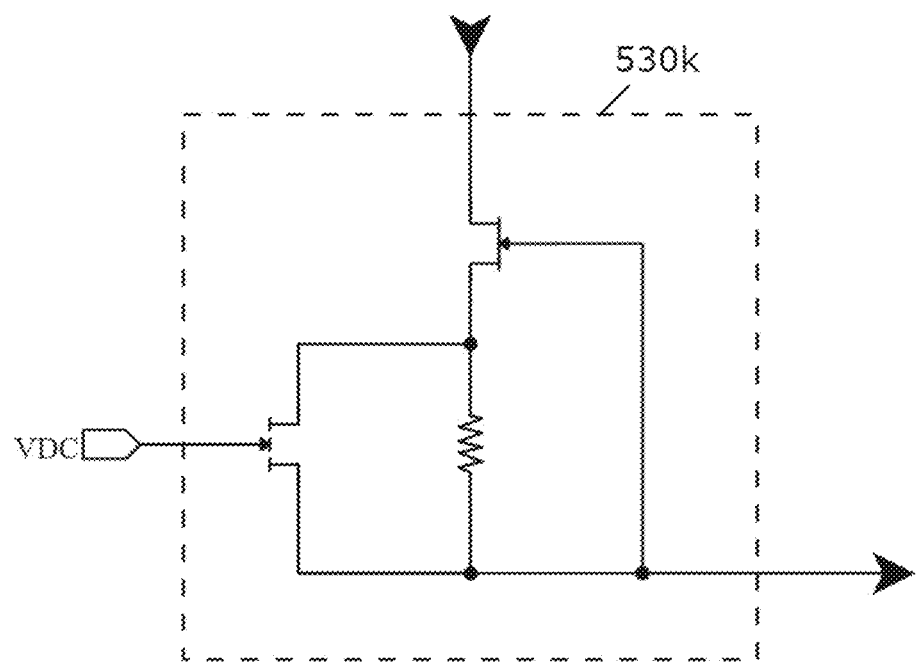

FIG. 57 shows a schematic of an embodiment of the current control block with an enhancement HEMT in parallel to the resistive element with the gate connected to a DC voltage level. As the voltage level of the source of the HEMT rises the resistance is increased and the current is reduced.

Figure 58:
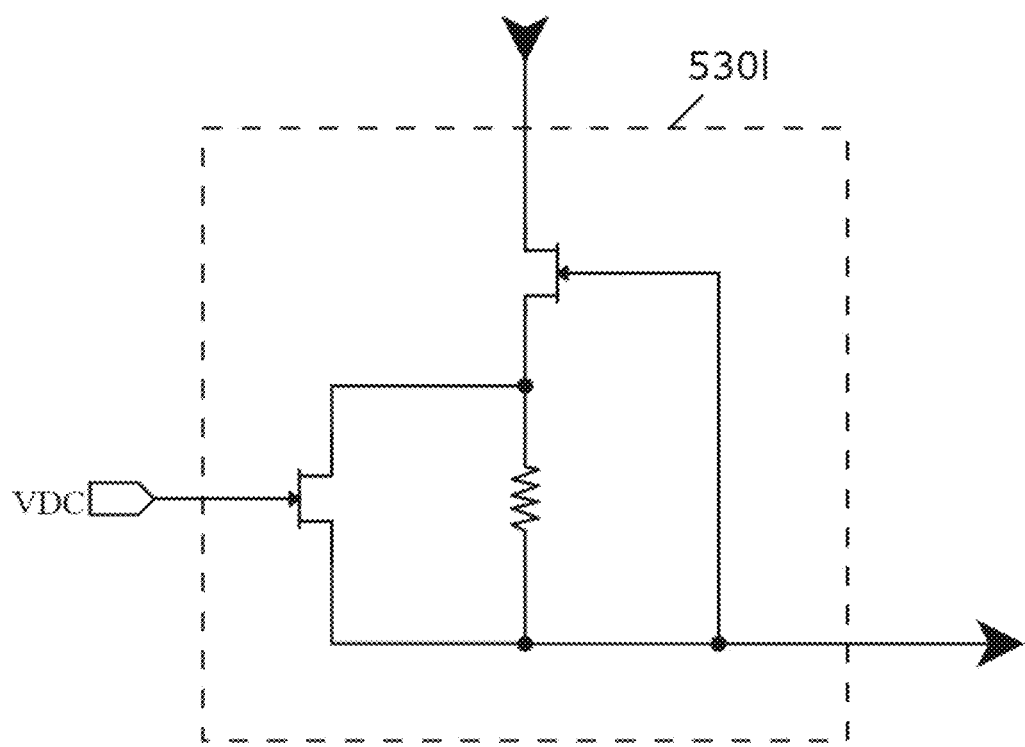

FIG. 58 shows a schematic of an embodiment of the current control block with a depletion HEMT in parallel to the resistive element with the gate connected to a DC voltage level. As the voltage level of the source of the HEMT rises the resistance is increased and the current is reduced.

Figure 59:
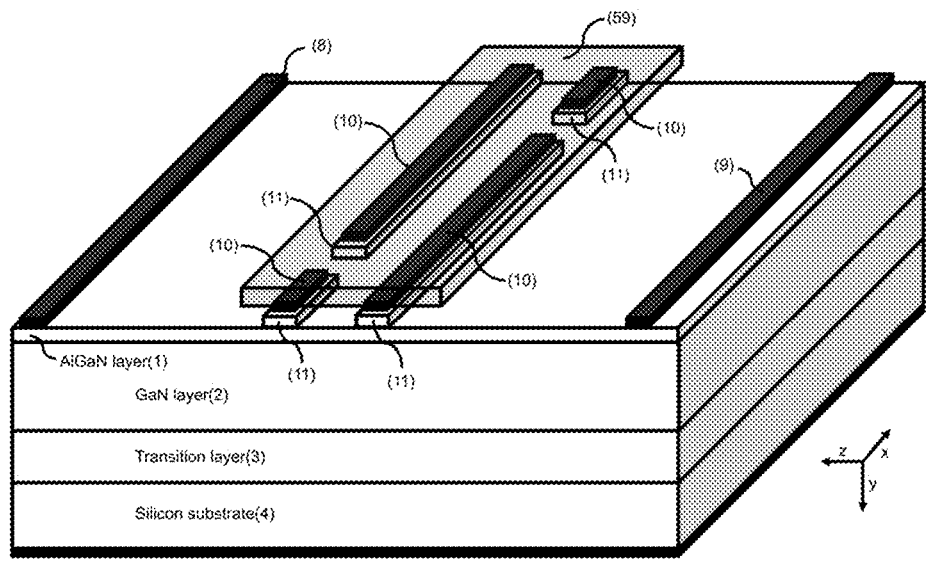

FIG. 59 shows a schematic representation of one embodiment of a D-HEMT with p-GaN islands arranged in two rows operatively connected to the gate contact. The p-GaN islands form a meander shape between them.

Figure 60:
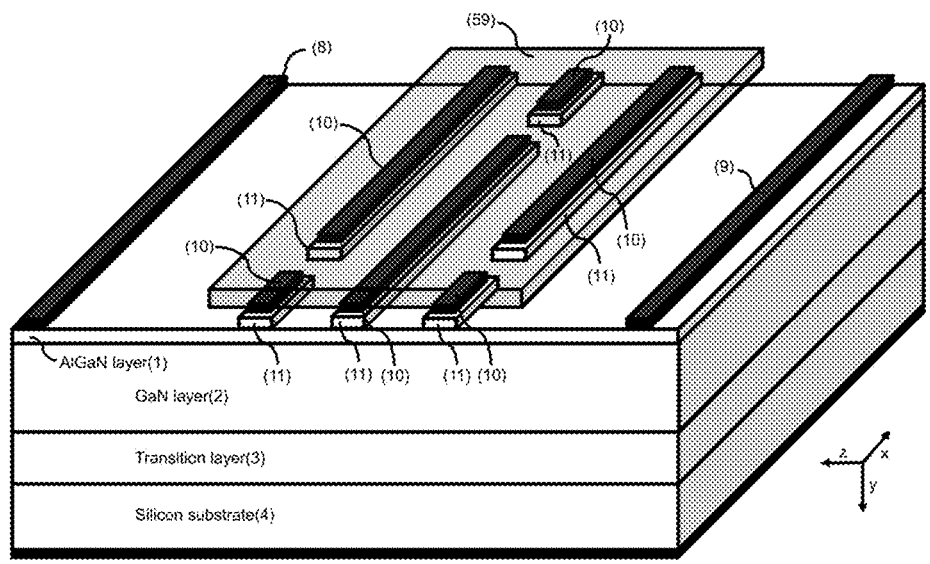

FIG. 60 shows a schematic representation of one embodiment of a D-HEMT with p-GaN islands arranged in three rows operatively connected to the gate contact. The p-GaN islands form a labyrinth shape between them.

Figure 61:
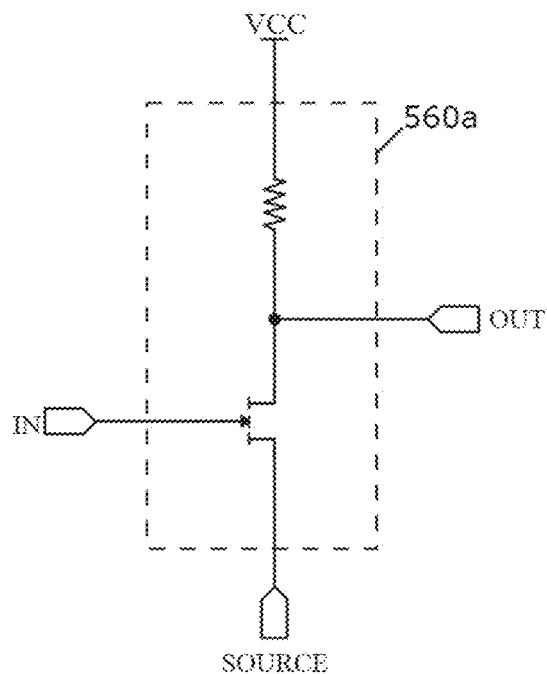

FIG. 61 shows a logic inverter circuit with an enhancement transistor on the low side and a resistive element as a pull-up circuit.

Figure 62:
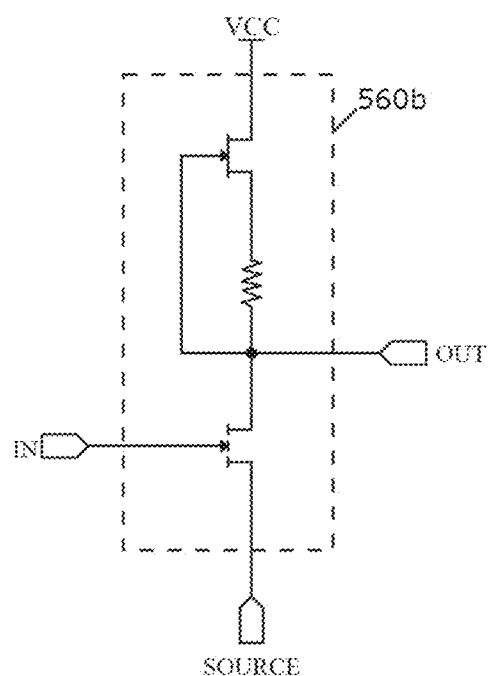

FIG. 62 shows a logic inverter circuit with an enhancement transistor on the low side and a current source as a pull-up circuit. The current source comprises a depletion transistor and a resistive element in series.

Figure 63:
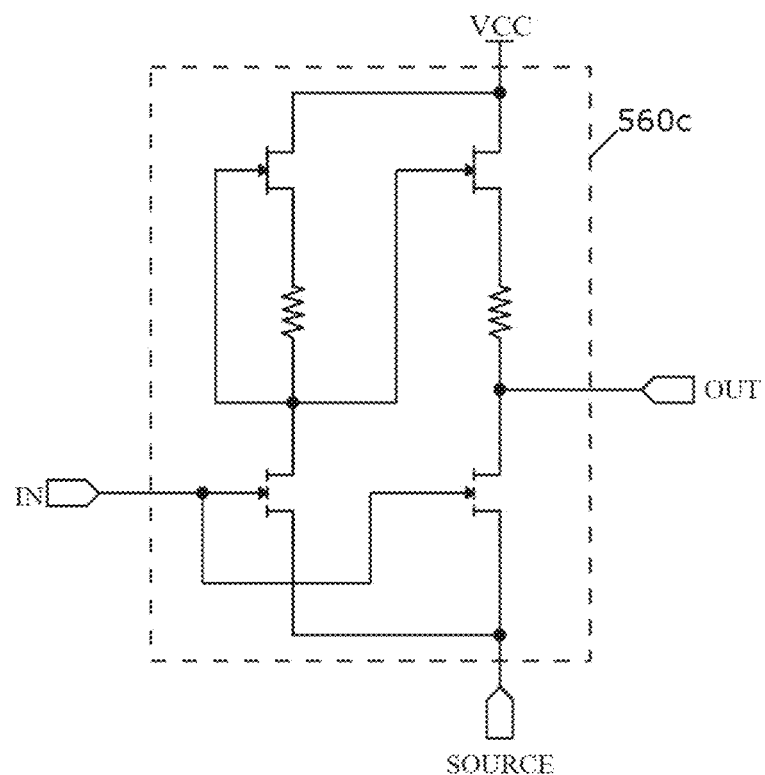

FIG. 63 shows a two-stage logic inverter circuit. Each stage has an enhancement transistor on the low side with the gate connected to the input signal. The pull up circuit of the first stage is a current source, as shown above. The pull-up circuit of the second stage comprises a depletion transistor and a resistive element in series, where the gate of the depletion transistor is connected to the output of the first stage.

Figure 64:
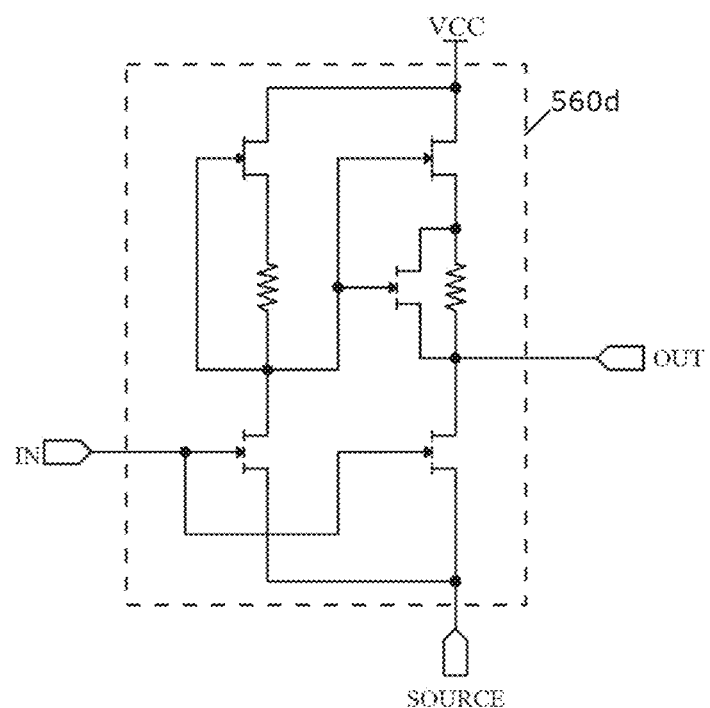

FIG. 64 shows a two-stage logic inverter circuit. Compared to the circuit in FIG. 63, an additional enhancement transistor is added to the pull-up circuit of the second stage in parallel to the resistive element.

Figure 65:
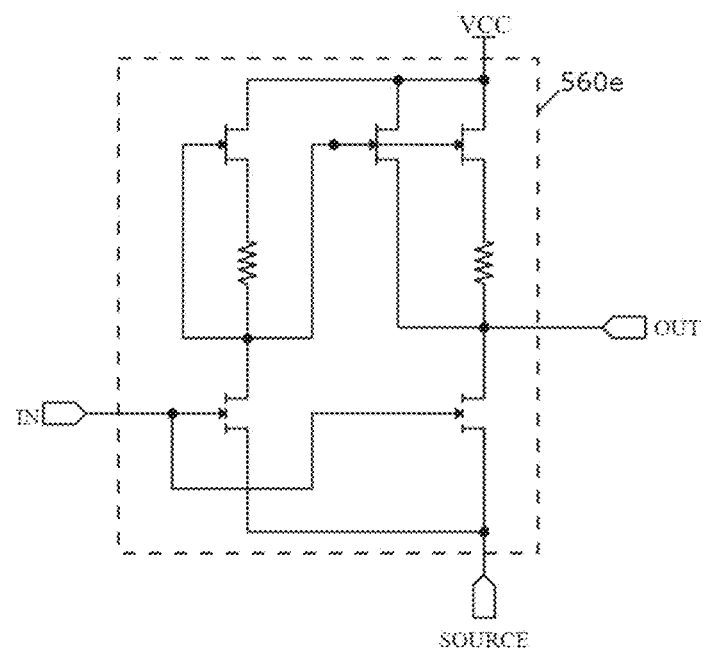

FIG. 65 shows a two-stage logic inverter circuit. Compared to the circuit in FIG. 63, an additional transistor is added to the pull-up circuit of the second stage in parallel to the series arrangement with the depletion transistor and resistive element.

Figure 66:
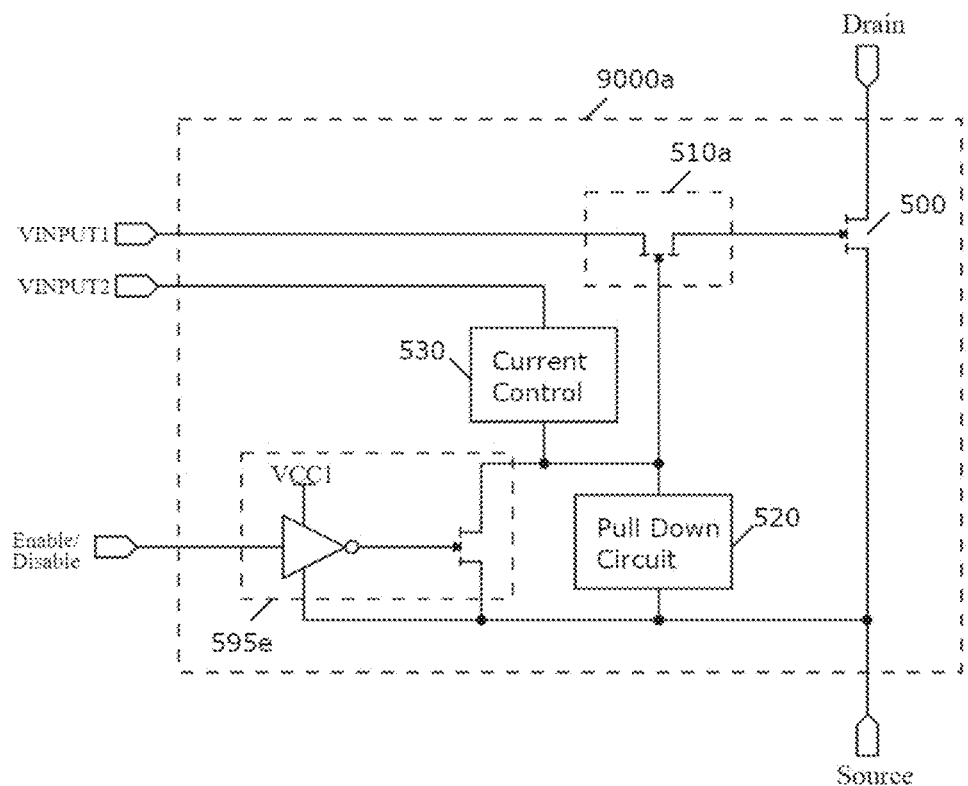

FIG. 66 shows a schematic representation of an embodiment of the invention with the current control block connected to a separate control terminal. Further, an enable and disable function is connected across the pull-down circuit. The enable and disable function comprises a logic inverter and an enhancement HEMT connected between the source of the active HEMT and the gate of the auxiliary HEMT.

Figure 67:
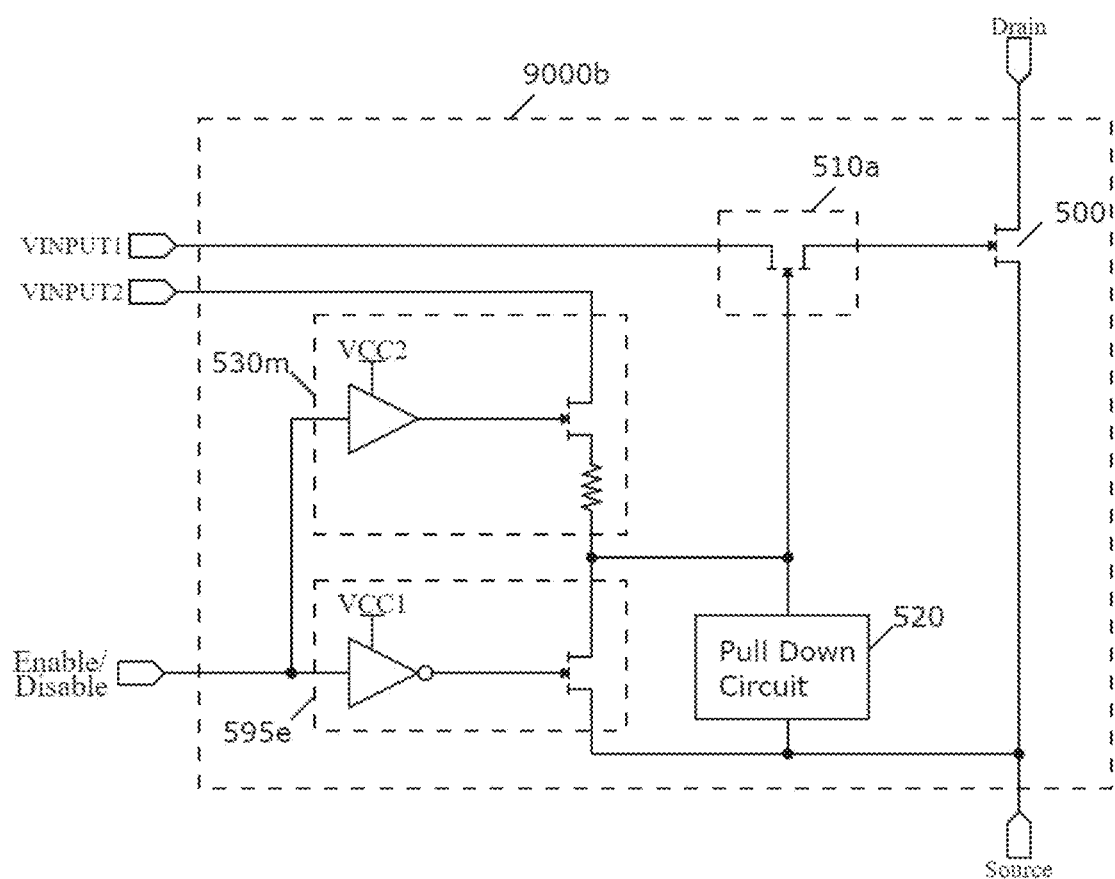

FIG. 67 shows a schematic representation of an embodiment of the invention with an actively controlled current control block. In this embodiment, the current control block comprises a resistive element that is connected to the output of a transistor switch controlled by a buffer from a control signal. Further, an enable and disable function is connected across the pull-down circuit. The enable and disable function comprises a logic inverter and an enhancement HEMT connected between the source of the active HEMT and the gate of the auxiliary HEMT.

Figure 68:
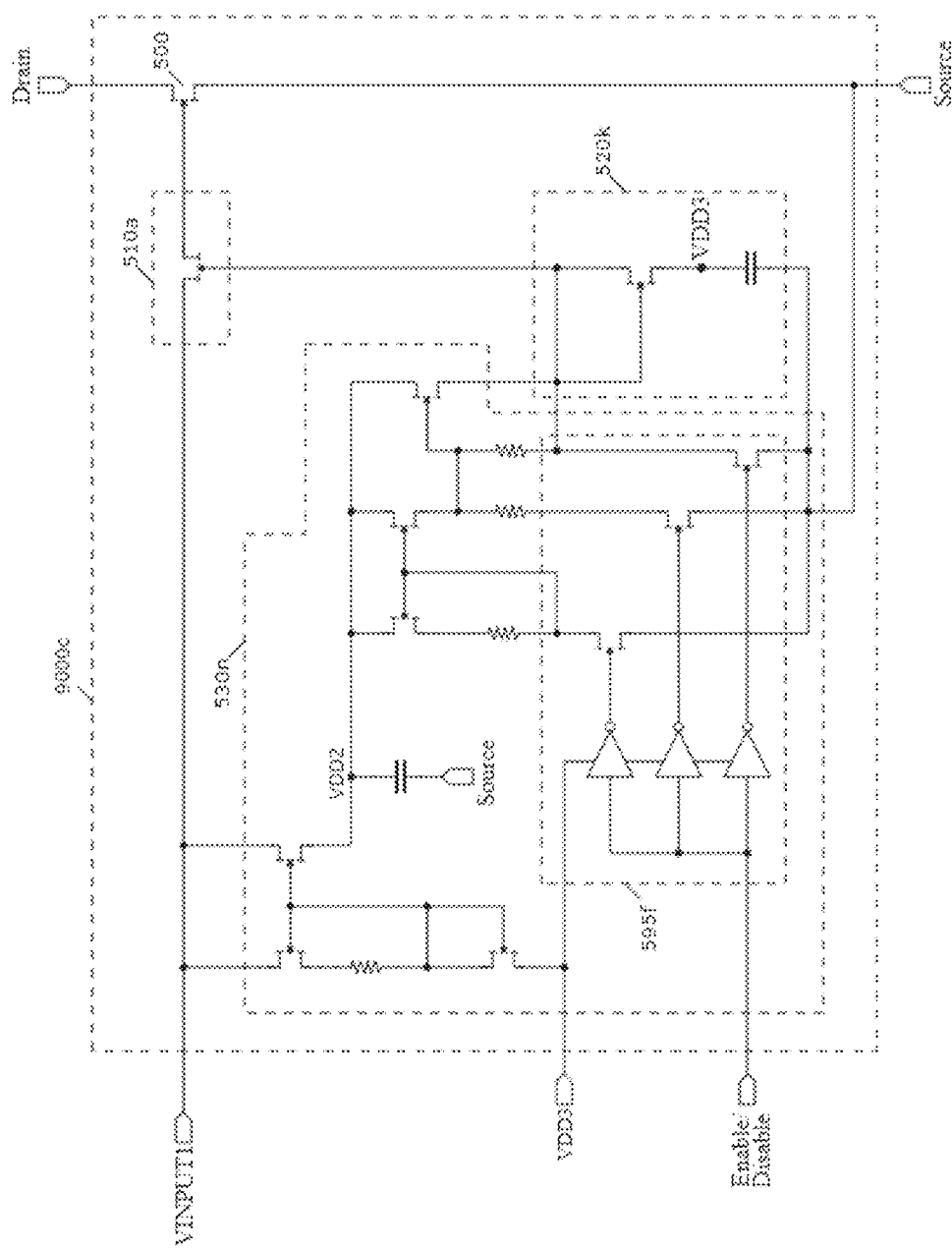

FIG. 68 shows a schematic representation of an embodiment of the invention with an actively controlled current control block, a voltage regulator between the control terminal and the current control block. Further, it comprises an enable and disable function connected to the gate of the auxiliary HEMT.

Figure 69:
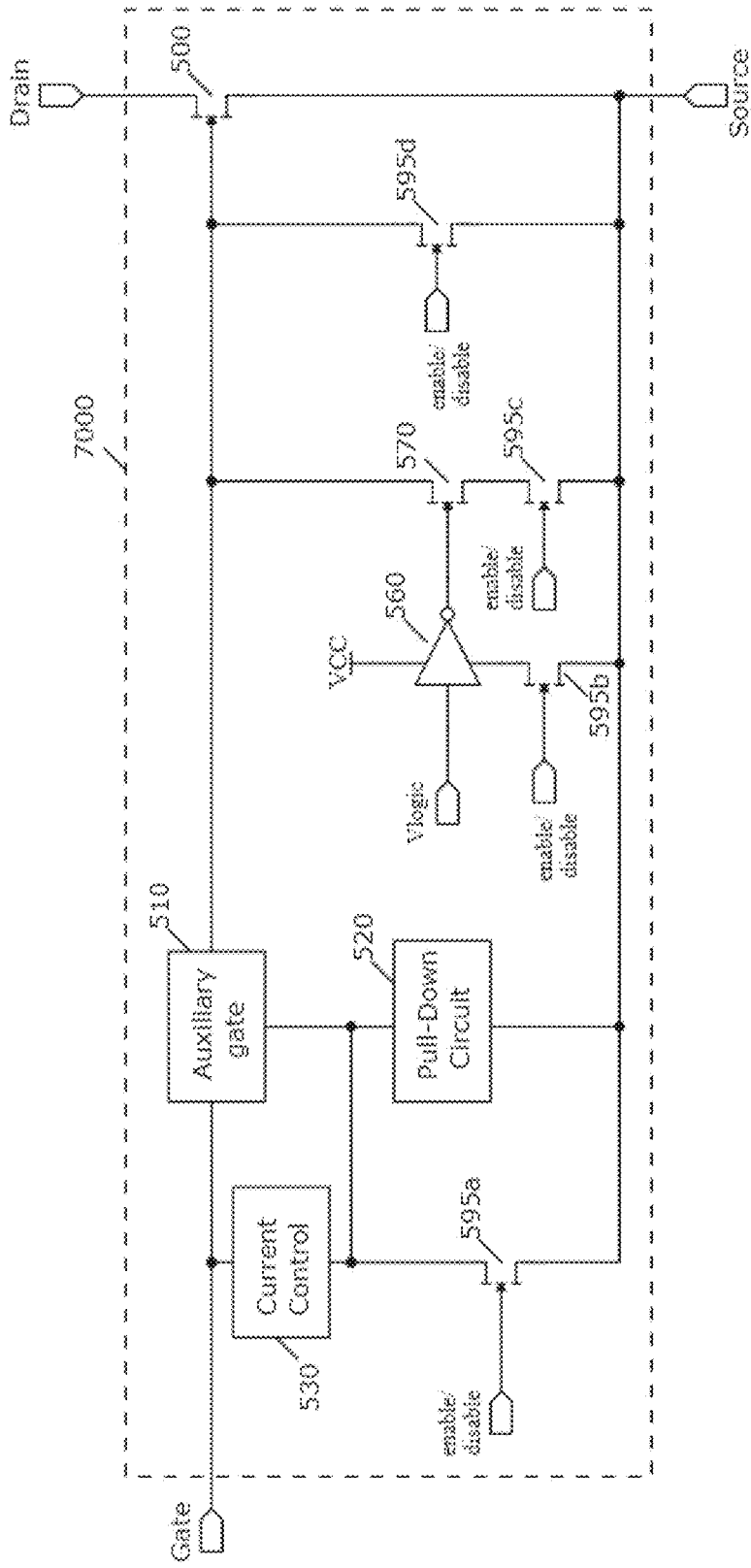

FIG. 69 shows a schematic representation of several exemplary embodiments of disable or enable functions. The disable or enable function may be integrated with the gate of the active HEMT, with the Miller clamp transistor, with the inverter circuit or with the pull-down circuit.

Figure 70:
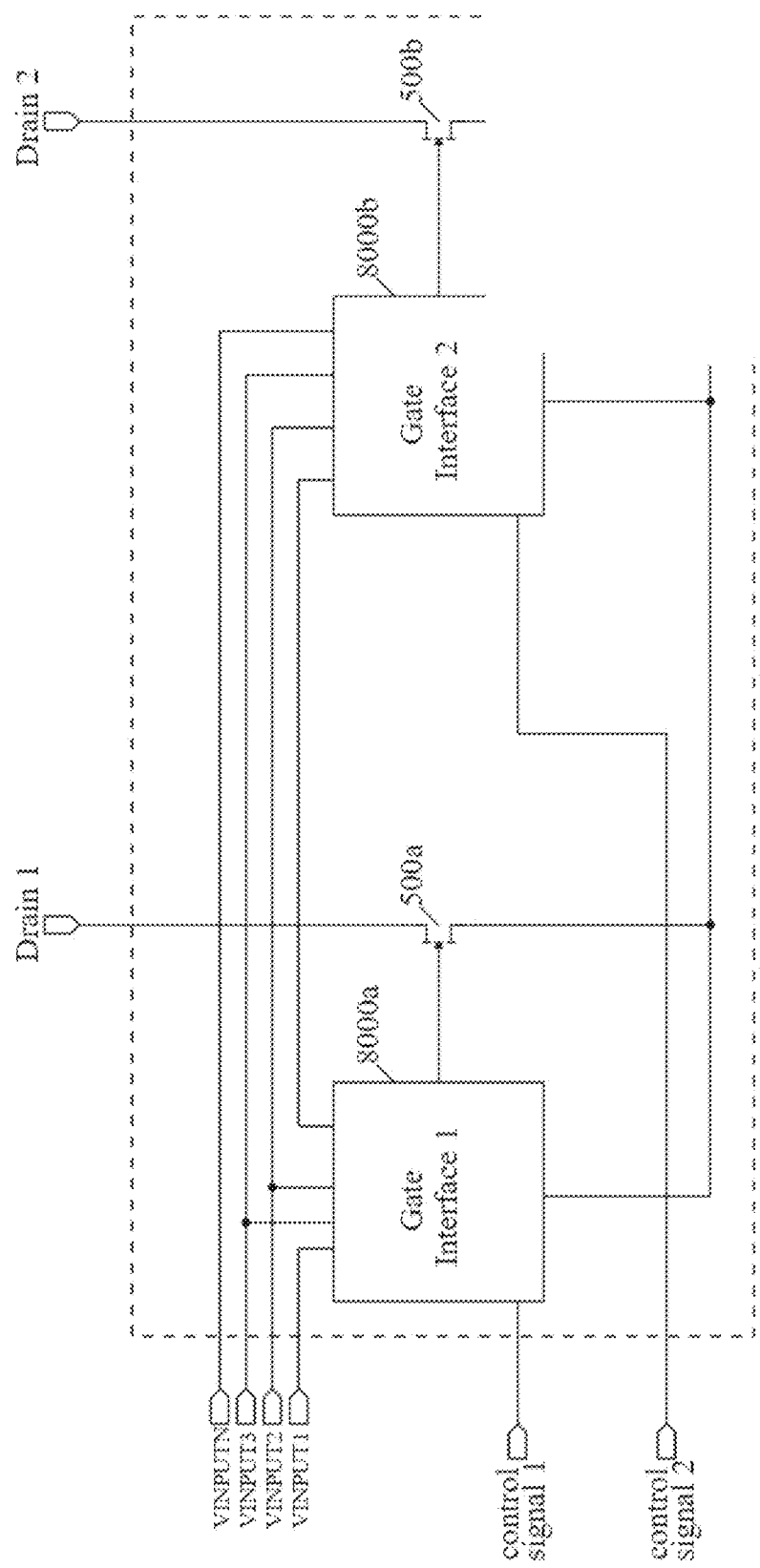

FIG. 70 shows a schematic representation of an arrangement with more than one main power device sharing the source. One or several input signals or input DC voltages may be shared between several gate interfaces. One or several signals or DC voltages generated in one gate interface circuit may be used in other gate interface circuits.

Figure 71:
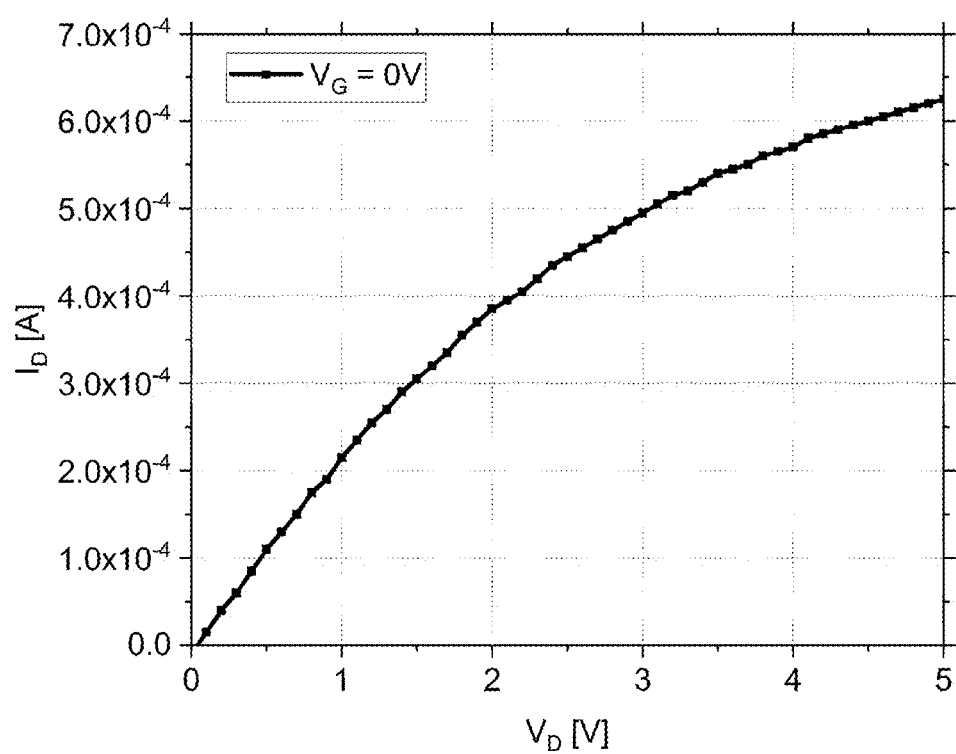

FIG. 71 shows an example of a current-voltage characteristic of the D-HEMT transistor illustrated in FIGS. 59 and 60.

Figure 72:
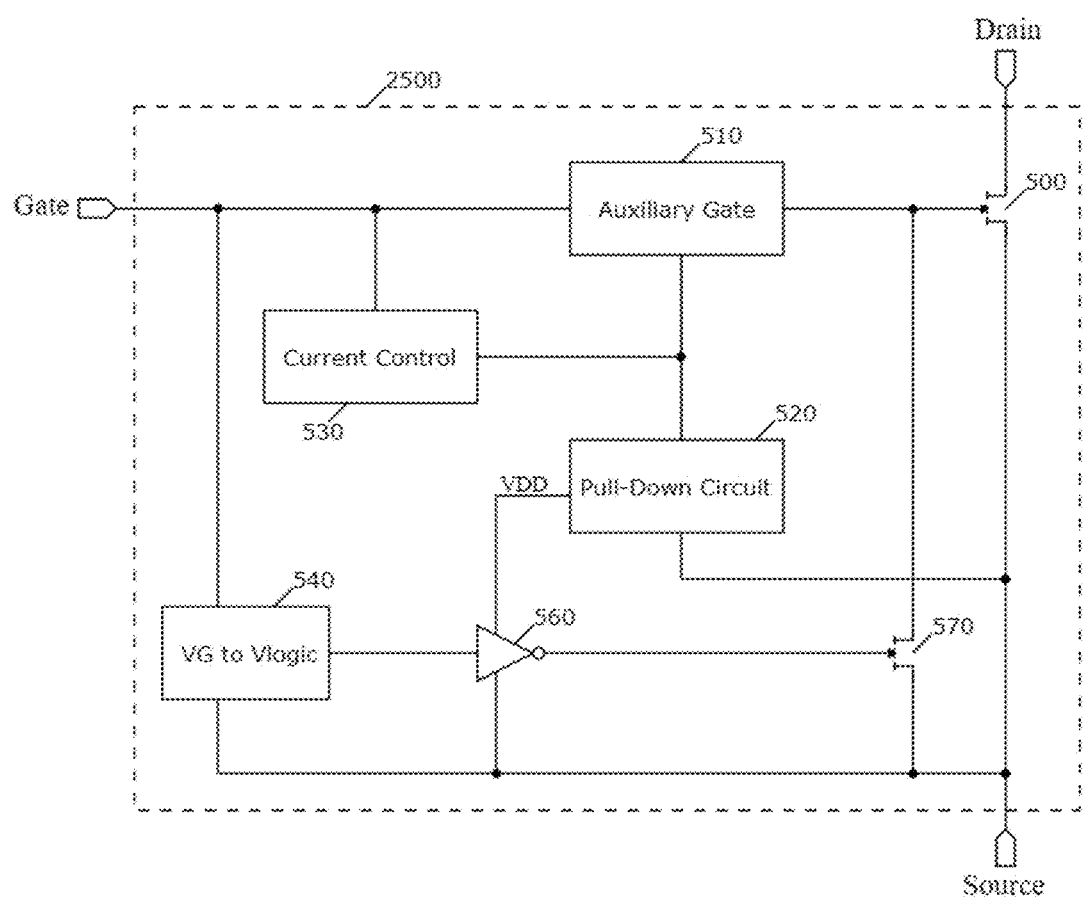

FIG. 72 shows a circuit schematic of an example GaN chip comprising a pull-down circuit with an integrated capacitor configured to provide an internal rail voltage.

Figure 73:
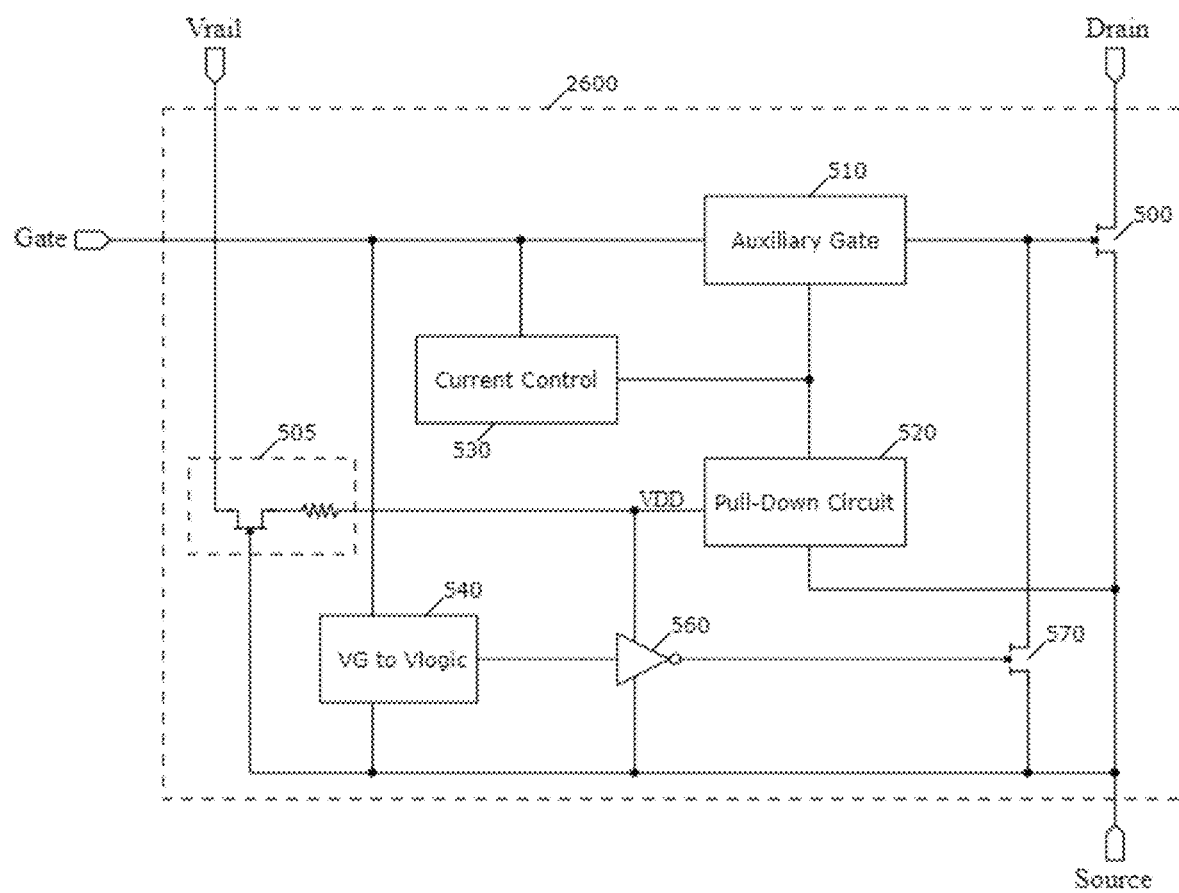

FIG. 73 shows a circuit schematic of a further example GaN chip comprising a pull-down circuit with an integrated capacitor configured to provide an internal rail voltage, where the integrated capacitor may also be charged by an external rail voltage through a depletion mode transistor.

Figure 74:
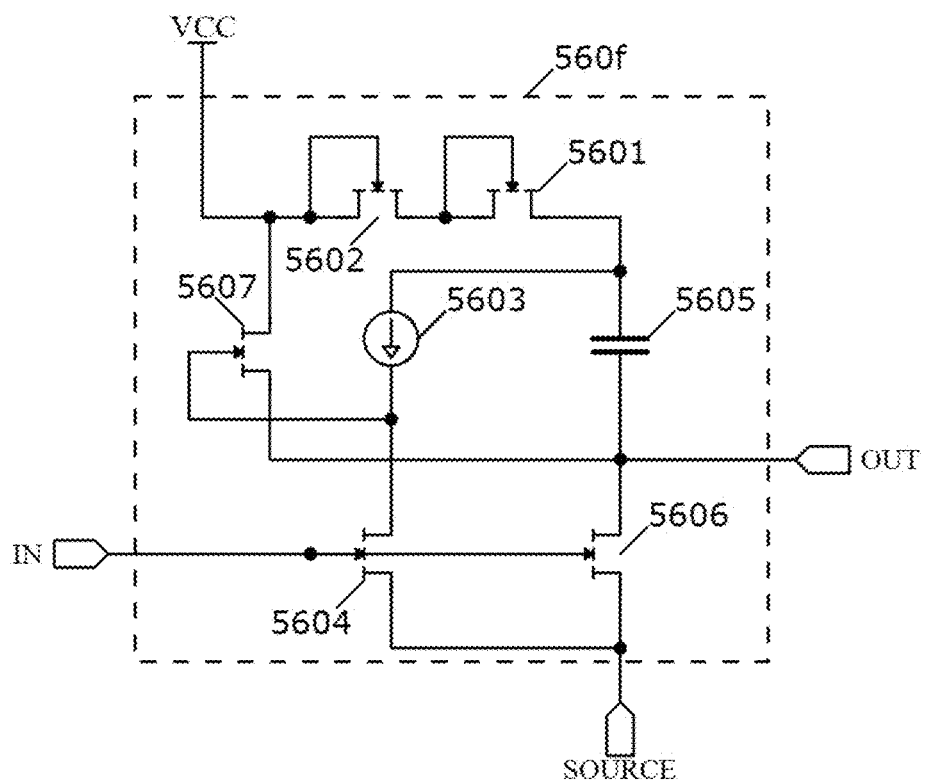

FIG. 74 shows a circuit schematic of an example multi-stage inverter.

Figure 75:
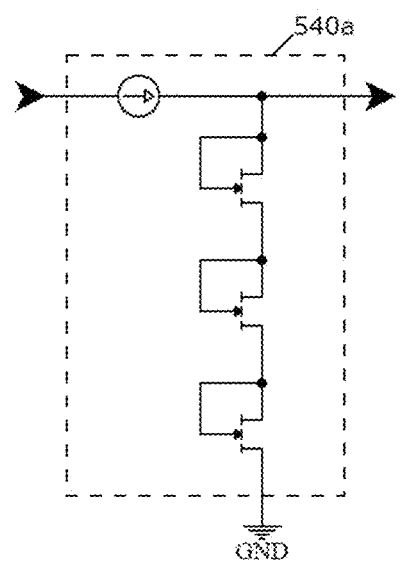

FIG. 75 shows a circuit schematic of an example Vg to Vlogic circuit block.

Figure 76:
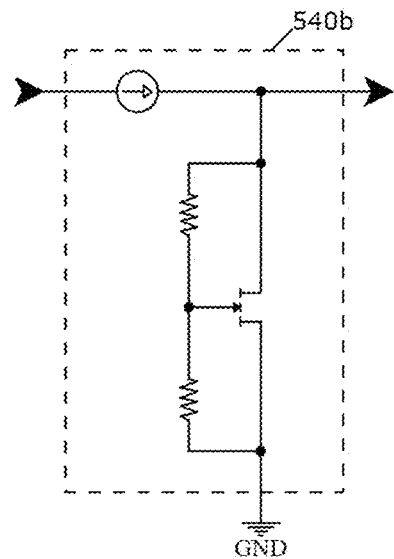

FIG. 76 shows a circuit schematic of a second example Vg to Vlogic circuit block.

Figure 77:
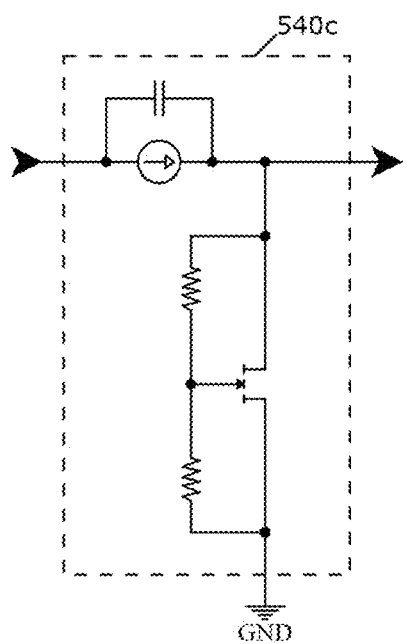

FIG. 77 shows a circuit schematic of a third example Vg to Vlogic circuit block.

Figure 78:
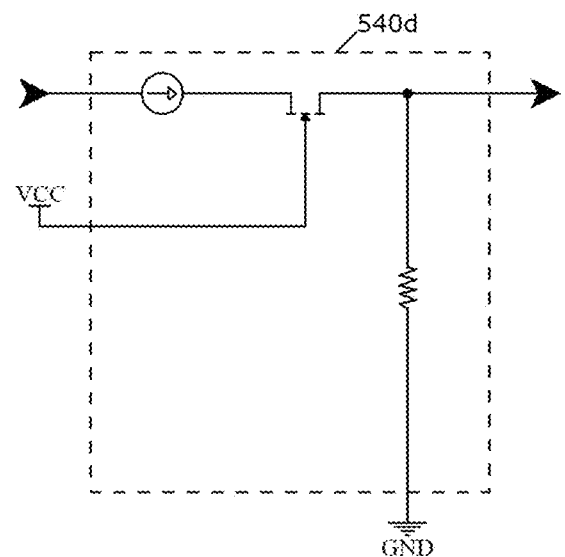

FIG. 78 shows a circuit schematic of fourth example Vg to Vlogic circuit block.

Figure 79:
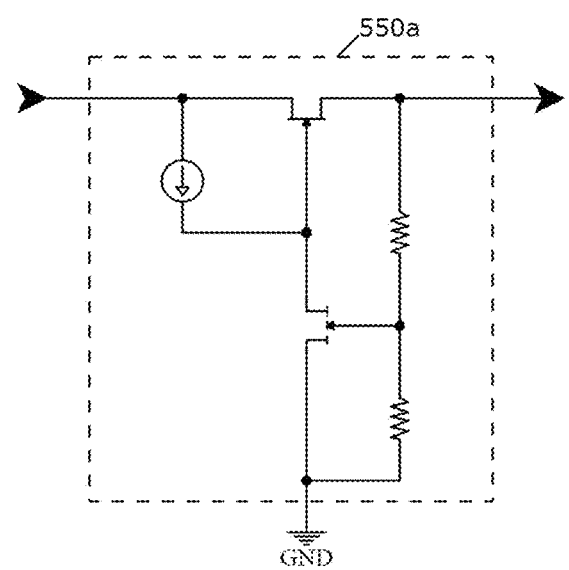

FIG. 79 shows a circuit schematic of an example DC/DC circuit block forming a linear voltage regulator.

Figure 80:
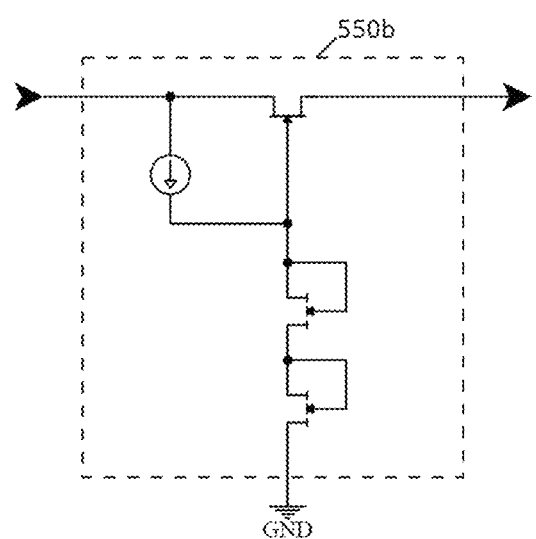

FIG. 80 shows a circuit schematic of a further example DC/DC circuit block forming a linear voltage regulator.

DETAILED DESCRIPTION OF THE PREFERRED EMBODIMENTS

Figure 1:
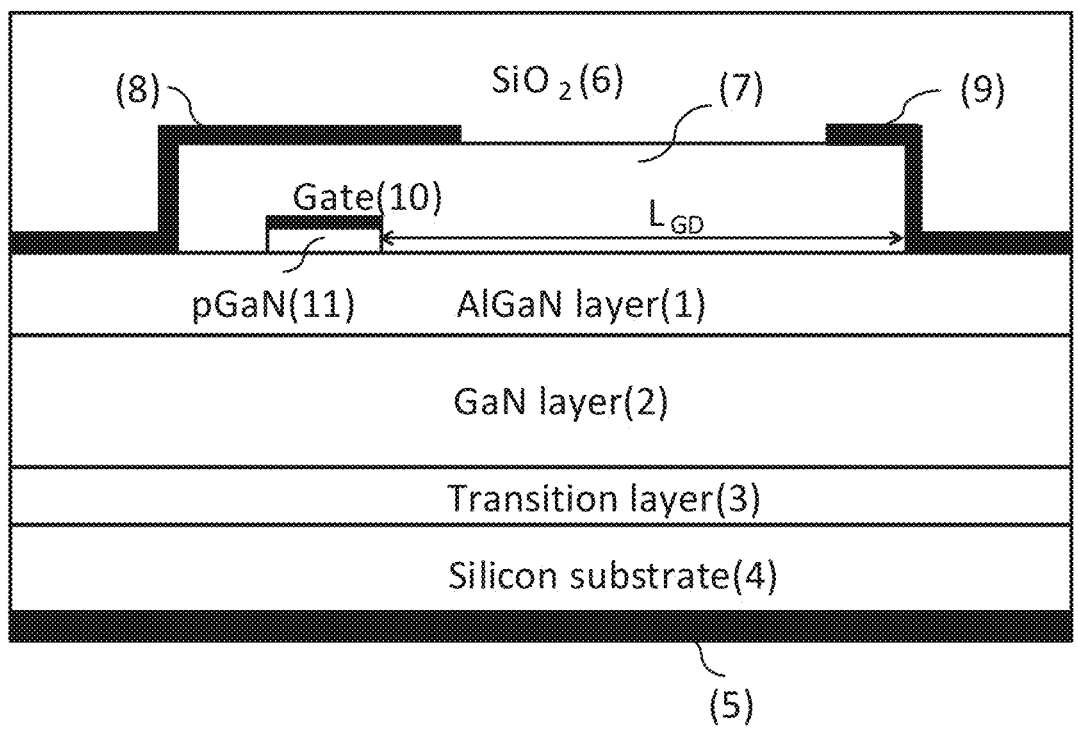
FIG. 1 shows schematically the cross section in the active area of a prior art pGaN HEMT.
Figure 2:
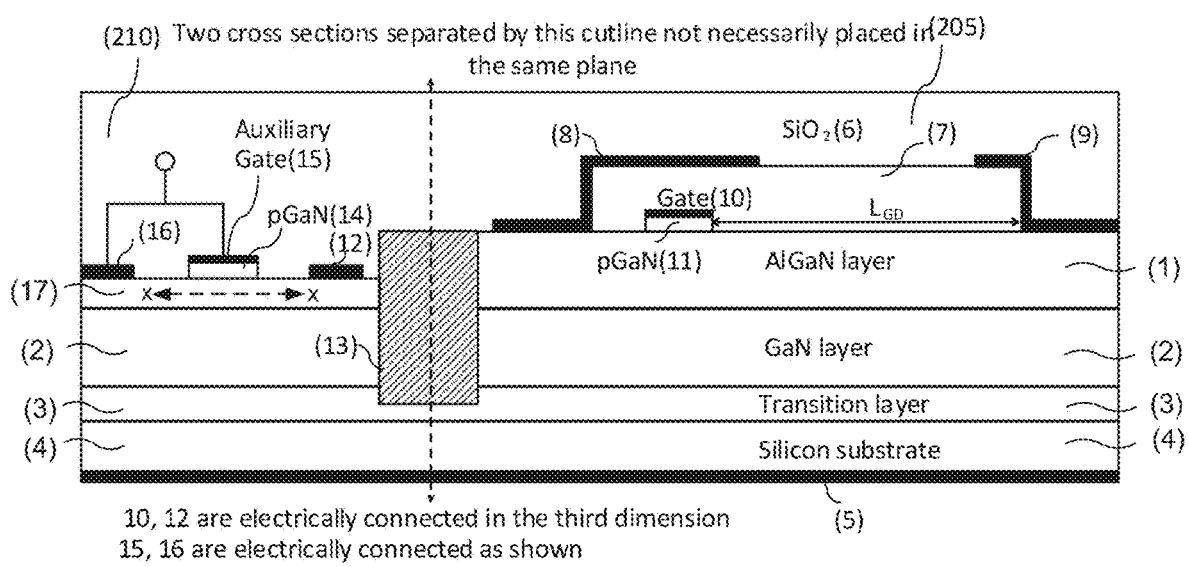
FIG. 2 illustrates a schematic representation of a cross section of the active area of the proposed disclosure according to one embodiment of the disclosure.

FIG. 2 illustrates a schematic representation of a cross section of the active area of the proposed disclosure, according to one embodiment of the disclosure. In use the current flows in the active area of the semiconductor device. In this embodiment, the device comprises a semiconductor (e.g. silicon) substrate 4 defining a major (horizontal) surface at the bottom of the device. Below the substrate 4 there is a substrate terminal 5. The device includes a first region of a transition layer 3 on top of the semiconductor substrate 4. The transition layer 3 comprises a combination of III-V semiconductor materials acting as an intermediate step to allow the subsequent growth of regions of high quality III-V semiconductor materials.

On top of the transition layer 3 there exists a second region 2. This second region 2 is of high quality III-V semiconductor (for example GaN) and comprises several layers. A third region 1 of III-V semiconductor containing a mole fraction of Aluminium is formed on top of the second region 2. The third region 1 is formed such that a hetero-structure is formed at the interface between the second 2 and third region 1 resulting in the formation of a two dimensional electron gas (2DEG).

A fourth region of highly p-doped III-V semiconductor 11 is formed in contact with the third region 1. This has the function of reducing the 2DEG carrier concentration when the device is unbiased, and is pGaN material in this embodiment. A gate control terminal 10 is configured over the fourth region 11 in order to control the carrier density of the 2DEG at the interface of the second 2 and third region 1. A high voltage drain terminal 9 is arranged in physical contact with the third region 1. The high voltage drain terminal forms an ohmic contact to the 2DEG. A low voltage source terminal 8 is also arranged in physical contact with the third region 1 and also forms an ohmic contact to the 2DEG.

A portion of surface passivation dielectric 7 is formed on top of the fourth region 1 and between the drain terminal 9 and source terminal 8. A layer of $SiO_2$ passivation 6 is formed above the surface passivation dielectric 7 and source and drain terminals 8, 9.

The device is separated into two cross sections by a vertical cutline. The two cross sections may not be necessarily placed in the same plane. The features described above are on one side (right hand side, for example) of the vertical cutline. This is termed as the active device 205. The other side of the vertical cutline (the left hand side, for example) is termed as the auxiliary device 210, which also comprises a semiconductor substrate 4, a transition layer 3, a second region 2 and a $SiO_2$ passivation region 6.

A fifth region of III-V semiconductor 17 containing a mole fraction of Aluminium is positioned above the second region 2 in the auxiliary device such that a hetero-structure is formed at the interface between this fifth region 17 and the second region 2. This results in the formation of a second two dimensional electron gas (2DEG) in a region which will be referred to as the auxiliary gate. This AlGaN layer 17 of the auxiliary device 210 can be identical or different to the AlGaN layer 1 in the active device 205. The AlGaN layer thickness and Al mole fraction are critical parameters as they affect the carrier density of electrons in the 2DEG [15].

A sixth region of highly p-doped III-V semiconductor 14 is formed on top of and in contact with the fifth region 17. This has the function of reducing the 2DEG carrier concentration when the auxiliary gate is unbiased. An auxiliary gate control terminal 15 is configured over the sixth region 14 in order to control the carrier density of the 2DEG at the interface of the fifth 17 and second region 2. The auxiliary gate pGaN layer 14 may be identical or different to the active gate pGaN layer 11. Critical parameters which could differ include, but are not limited to, pGaN doping and width along the x-axis (shown in the figure).

An isolation region 13 is formed down the vertical cutline. This cuts the electrical connection between the 2DEG formed in the active device 205 and the 2DEG formed in the auxiliary device 210.

A first additional terminal 16 is arranged on top of and in physical contact with the fifth region 17 of the auxiliary device 210. This forms an ohmic contact to the 2DEG of the auxiliary device 210 and is also electrically connected (via interconnection metal) to the auxiliary gate control terminal 15 configured over the sixth region (pGaN) 14. The first additional terminal 16 is biased at the same potential as the auxiliary gate terminal 15 of the auxiliary device. A second additional terminal 12 is also arranged on top of and in physical contact with the fifth region 17 of the auxiliary device 210. This forms an ohmic contact to the 2DEG of the auxiliary device 210 and is electrically connected (via interconnection metal) to the active gate control terminal 10 configured over the fourth region 11 of the active device 205. The interconnection between the second additional terminal 12 of the auxiliary device 210 and the active gate terminal 10 of the active device 205 can be made in the third dimension and can use different metal layers in the process. Note that this interconnection is not shown in the schematic in FIG. 2. A similar but not necessarily identical AlGaN/GaN structure is used in the auxiliary gate.

When the device is in use the auxiliary gate 14, 15 drives the active gate 10, 11. The auxiliary 2DEG layer formed between the first and second additional terminals 12, 16 with the portion under the auxiliary p-GaN gate 14 is controlled by the potential applied to the auxiliary gate terminal 15.

The portion of the auxiliary 2DEG under the auxiliary pGaN gate 14 is depleted when the auxiliary gate terminal 15 and the short-circuited first additional terminal 16 are at 0V. As the auxiliary gate bias is increased (both terminals 15, 16) the 2DEG starts forming under the pGaN gate 14 connecting to the already formed 2DEG layer which connects to the first and second additional terminals 16, 12. A 2DEG connection is now in place between the first and second additional terminals 12, 16.

As the second additional terminal 12 is connected to the active gate 10 the device can now turn on. A positive (and desirable) shift in the device threshold voltage is observed using this structure as not all of the potential applied to the auxiliary gate 15 is transferred to the active gate 10. Part of this potential is used to form the auxiliary 2DEG under the auxiliary gate 15 and only part is transferred to the second additional terminal 12 which is connected to the active gate 10.

The auxiliary gate provides the additional advantage of being able to control the gate resistance of the device more easily. This can be achieved by varying the field plate design or distance between terminals 12 and 15 or 15 and 16. This can be useful in controlling the unwanted oscillations observed due to the fast switching of these devices.

Different embodiments of the device can include terminals 10, 15 being either Schottky or Ohmic contacts or any combination of those two.

Figure 3:
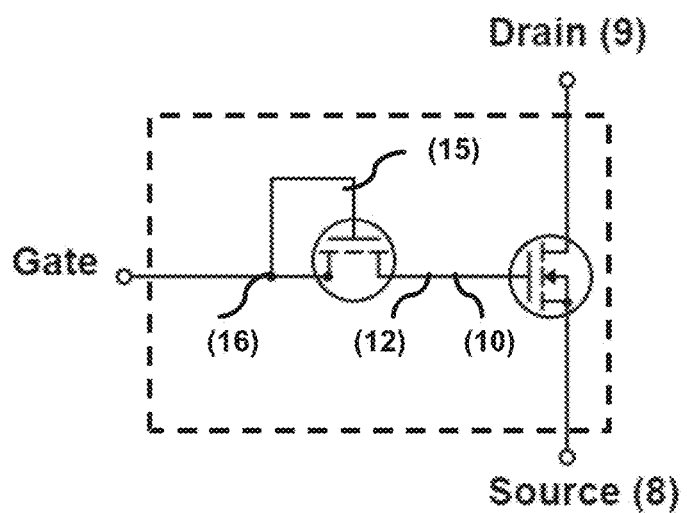
FIG. 3 shows a circuit schematic representation of one embodiment of the proposed disclosure as shown in the schematic cross section of FIG. 2.

FIG. 3 shows a circuit schematic representation of one embodiment of the proposed disclosure as shown in the schematic cross section of FIG. 2. The features shown in FIG. 3 carry the same reference numbers as the features in FIG. 2.

Figure 4A:
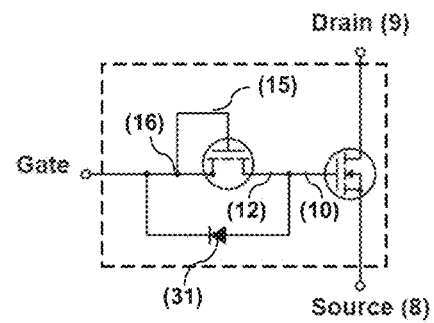
FIG. 4A shows a circuit schematic representation of a further embodiment of the proposed disclosure in which a low on-state voltage diode is connected in parallel between the drain and the source of the auxiliary transistor.
Figure 4B:
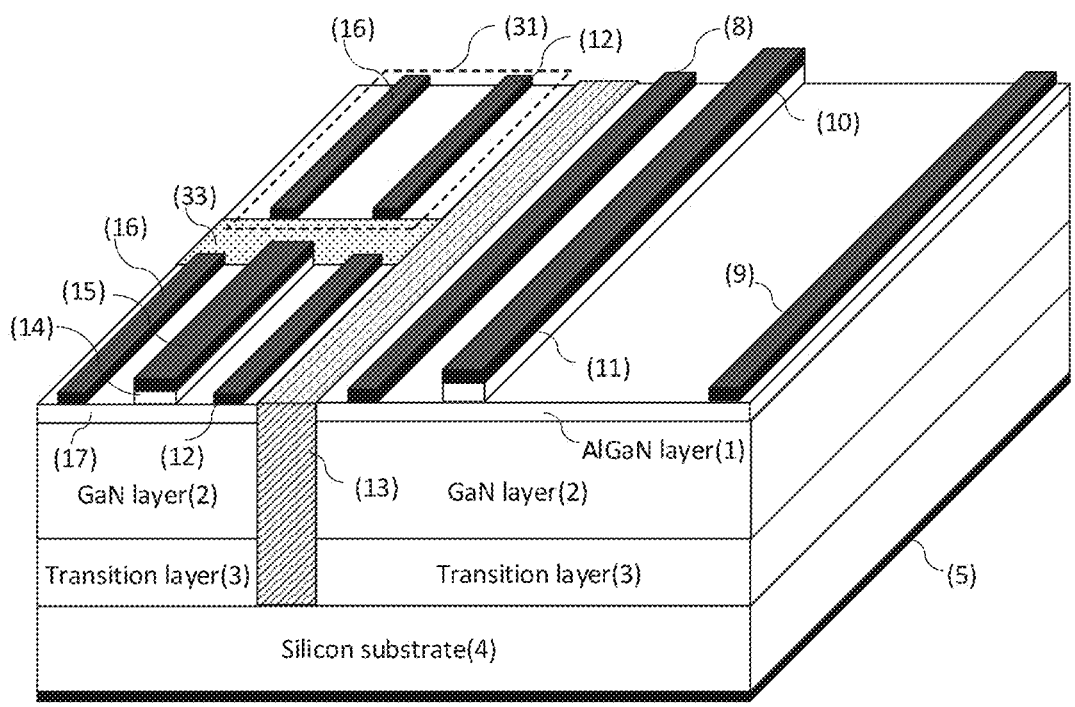
FIG. 4B illustrates a 3D schematic representation of the embodiment of FIG. 4A.
Figure 4C:
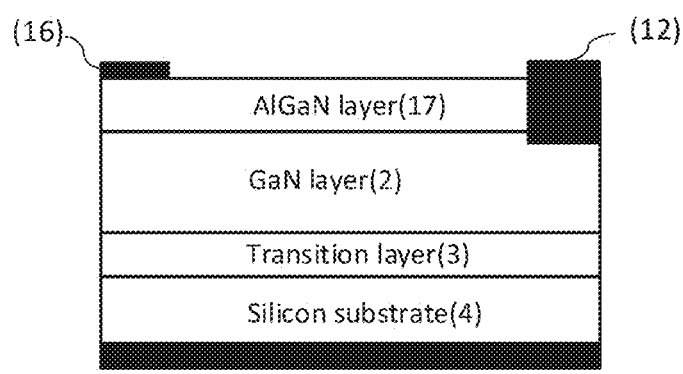
FIG. 4C shows the cross section of the low voltage diode as used in embodiment of FIG. 4A.

FIG. 4A shows a circuit schematic representation of a further embodiment of the proposed disclosure in which a low on-state voltage diode is connected in parallel between the drain and the source of the auxiliary transistor, as shown in the schematic 3D illustration in FIG. 4B. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16 and second additional terminal 12. However, in this embodiment a low on-state voltage diode 31 is connected in parallel between the drain 16 and the source 12 of the auxiliary transistor. The parallel diode 31 acts as pull-down network during the turn-off of the overall configuration connecting to ground the gate terminal 10 of the active GaN transistor. When a positive bias (known as on-state) is applied to the auxiliary gate 15, the diode 31 will be reverse-biased and zero current will flow through it, leaving unaffected the electrical behaviour of the overall high-voltage configuration. When a zero bias (off-state) will be applied to the auxiliary gate 15 the diode 31 will be forward bias and the turn-off current flowing through it will discharge the gate capacitance of the active transistor, thus enabling the switching off of the overall configuration. In off-state, the gate of the active device 10 will remain biased to a minimum voltage equal to the turn-on voltage of the diode. The diode 31 will therefore be designed in such a way that its turn-on voltage will be as low as possible, ideally few mV. FIG. 4B illustrates how the diode 31 could be included monolithically. The diode could be a simple Schottky diode or could be a normal p-n diode. The diode 31 would pull down the active gate 10 during turn-off to the diode $V_{th}$, therefore the diode needs to be designed to have as low a threshold voltage as possible. A feature which can achieve this is the use of a recessed anode such that the contact is made directly to the 2DEG as seen in FIG. 4C.

Figure 5:
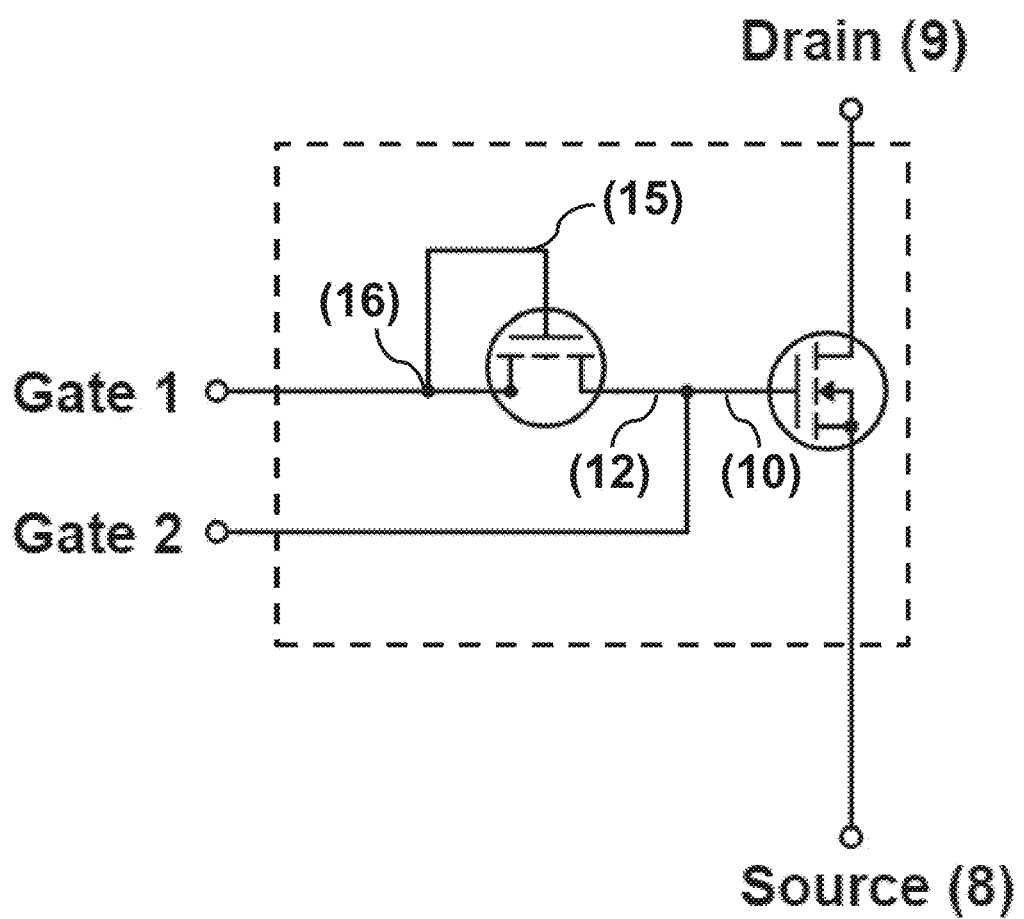
FIG. 5 shows a circuit schematic representation of a further embodiment of the proposed disclosure in which the drain (gate) terminal and the source terminal of the auxiliary transistor are available as external gate terminals.

FIG. 5 shows a circuit schematic representation of a further embodiment of the proposed disclosure in which the drain (gate) terminal 16 and the source terminal 12 of the auxiliary transistor are available as external gate terminals. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16 and second additional terminal 12. However, in this case the external gate terminal is divided into two terminals. Since the gate driver sink output pin can now be connected to the source terminal of the auxiliary transistor directly offering a pull-down path, component 31 in FIG. 4 may (or may not) be omitted.

FIG. 6 shows a circuit schematic representation of a further embodiment of the proposed disclosure where a second auxiliary transistor 34 (could be advantageously low-voltage) is connected in parallel with the first auxiliary transistor where the drain (gate) terminal 16 of the first auxiliary transistor is connected to the source terminal of the second auxiliary transistor and the source terminal 12 of the first auxiliary transistor is connected to the drain (gate) terminal of the second auxiliary transistor. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16 and second additional terminal 12. However, in this case the pull-down network during the turn-off of the overall configuration is a second auxiliary transistor 34.

FIG. 7 shows a circuit schematic representation of a further embodiment of the proposed disclosure where a resistor 41 is added between the drain terminal 12 and gate terminal 10 of the second auxiliary transistor 34. Many of the features of this embodiment are similar to those of FIG. 6 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16, second additional terminal 12 and second auxiliary transistor 34. In this embodiment, the resistor 41 acts to reduce the active gate capacitance discharge time through the pull-down network during the turn-off of the active device. The additional resistor performs this function by creating an increased potential, during turn-off, of the second auxiliary transistor gate terminal 10 compared to the second auxiliary transistor drain terminal 12.

FIG. 8 shows a circuit schematic representation of a further embodiment of the proposed disclosure where an additional resistor 42 is added between the source terminal of the auxiliary transistor (drain terminal 12 of the second auxiliary transistor) and source terminal 8 of the active device. Many of the features of this embodiment are similar to those of FIG. 7 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16, second additional terminal 12, second auxiliary transistor 34 and resistive element 41. In this embodiment, the additional resistive element 42 acts as an additional pull-down network during the active device turn-off. During the active device turn-on and on-state the additional resistance 42 can act as a voltage limiting component to protect the gate terminal of the active device.

FIG. 9 shows a circuit schematic representation of a further embodiment of the proposed disclosure where a third auxiliary transistor 58 is added between the drain terminal 12 and gate terminal 10 of the second auxiliary transistor 34. Many of the features of this embodiment are similar to those of FIG. 8 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16, second additional terminal 12, second auxiliary transistor 34 and additional resistive element 42. In this embodiment, the third auxiliary transistor acts to reduce the active gate capacitance discharge time through the pull-down network during the turn-off of the heterojunction power device. The third auxiliary transistor 58 performs this function by creating an increased potential, during turn-off, of the second auxiliary transistor gate terminal 10 compared to the second auxiliary transistor drain terminal 12. The third auxiliary transistor is a depletion mode device. The gate terminal of the third auxiliary transistor is connected to the source terminal of the third auxiliary transistor.

FIG. 10 shows a circuit schematic representation of a further embodiment of the proposed disclosure where a third auxiliary transistor 59 is added between the drain terminal 12 and gate terminal 10 of the second auxiliary transistor 34. Many of the features of this embodiment are similar to those of FIG. 8 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16, second additional terminal 12, second auxiliary transistor 34 and additional resistive element 42. In this embodiment, the third auxiliary transistor acts to reduce the active gate capacitance discharge time through the pull-down network during the turn-off of the heterojunction power device. The third auxiliary transistor 59 performs this function by creating an increased potential, during turn-off, of the second auxiliary transistor gate terminal 10 compared to the second auxiliary transistor drain terminal 12. The third auxiliary transistor is a depletion mode device. The gate terminal of the third auxiliary transistor is connected to the drain terminal of the third auxiliary transistor.

FIG. 11 shows a circuit schematic representation of a further embodiment of the proposed disclosure where a voltage limiting circuit is implemented composed of a resistor 44, a resistor 45 (forming a potential divider) and an actively switched low voltage enhancement mode transistor 43. Many of the features of this embodiment are similar to those of FIG. 6 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16, second additional terminal 12 and second auxiliary transistor 34. In this embodiment, the enhancement mode transistor 43 can turn-on, and thus adjust the resistance between the active device gate terminal 10 and the active device source terminal 8, when the potential of the first additional terminal 16 (or the drain (gate) terminal 16) of the first auxiliary heterojunction transistor is raised above a certain value which can be controlled by the choice of resistors (44, 45) in the potential divider described. This function can protect the active gate terminal from over-voltage events.

FIG. 12 shows a circuit schematic representation of a further embodiment of the proposed disclosure where a voltage limiting circuit is implemented comprising a resistor 44, a resistor 45 (forming a potential divider) and an actively switched low voltage depletion mode transistor 46. Many of the features of this embodiment are similar to those of FIG. 6 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16, second additional terminal 12 and second auxiliary transistor 34. In this embodiment, the resistance of the depletion mode transistor 46 can be reduced, and thus adjust the resistance between the active device gate terminal 10 and the active device source terminal 8, when the potential of the first additional terminal 16 (or the drain (gate) terminal 16) of the first auxiliary heterojunction transistor is increased. The potential divider formed by the two resistors (44, 45) determines the potential on the gate terminal of the depletion mode transistor 46. The circuit described can protect the active gate terminal from over-voltage events.

FIG. 13 shows a circuit schematic representation of a further embodiment of the proposed disclosure where an over-current protection circuit is implemented composed of a current sensing resistor 48 and an actively switched low voltage enhancement mode transistor 49. Many of the features of this embodiment are similar to those of FIG. 6 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16, second additional terminal 12 and second auxiliary transistor 34. In this embodiment, the active area of the active (high voltage) transistor is divided into two regions forming two transistors in parallel. The drain and gate terminals of the two transistors are electrically connected. The two transistors in parallel are a low resistance (main power) transistor 55 and a high resistance (current sensing) transistor 54 comparatively. The first terminal of the current sensing resistor 48 is connected to the source terminal of the high resistance transistor 54. The potential at the gate terminal of the enhancement mode transistor 49 is increased as the current through the current sensing resistor 48 is increased. When the current through resistive element 48 reaches a critical value the enhancement mode transistor 49 turns on providing a reduction in the resistance of the path between the gate 10 and source 8 of the active (high voltage) device thus limiting the potential on the active gate terminal 10. The circuit described can protect the circuit from an over-current event.

FIG. 14 shows a circuit schematic representation of a further embodiment of the proposed disclosure where an over-current protection circuit is implemented composed of a current sensing resistor 48 and an actively switched low voltage depletion mode transistor 47. Many of the features of this embodiment are similar to those of FIG. 6 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16, second additional terminal 12 and second auxiliary transistor 34. In this embodiment, the active area of the active (high voltage) transistor is divided into two isolated regions forming two transistors in parallel. The drain and gate terminals of the two transistors are electrically connected. The two transistors in parallel are a low resistance (main power) transistor 55 and a high resistance (current sensing) transistor 54 comparatively. The first terminal of the current sensing resistor 48 is connected to the source terminal of the high resistance transistor 54. The potential at the gate terminal of the depletion mode transistor 47 is increased as the current through the resistive element 48 is increased. As the current through resistive element 48 increases the resistance of the depletion mode transistor 49 can decrease providing a reduction in the resistance of the path between the gate 10 and source 8 of the active (high voltage) device thus limiting the potential on the active gate terminal 10. The circuit described can protect the circuit from an over-current event.

FIG. 15 shows a circuit schematic representation of a further embodiment of the proposed disclosure where an active Miller clamp circuit is implemented composed of a resistor 52, an actively switched low voltage enhancement mode transistor 50 and an actively switched depletion mode transistor 51. Many of the features of this embodiment are similar to those of FIG. 6 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16, second additional terminal 12 and second auxiliary transistor 34. In this embodiment, the active Miller clamp circuit is implemented to offer an additional pull-down network for the active device gate terminal 10 during the device turn-off transient.

FIG. 16 shows a circuit schematic representation of a further embodiment of the proposed disclosure where an active Miller clamp circuit is implemented composed of a resistor 52, an actively switched low voltage enhancement mode transistor 50 and an actively switched enhancement mode transistor 53. Many of the features of this embodiment are similar to those of FIG. 6 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16, second additional terminal 12 and second auxiliary transistor 34. In this embodiment, the active Miller clamp circuit is implemented to offer an additional pull-down network for the active device gate terminal 10 during the device turn-off transient.

FIG. 17 illustrates a schematic representation of a cross section of the active area of a proposed depletion mode device in prior art which can be used as the actively switched transistor in locations 46, 47, 51, 58, 59, 60.

FIG. 18 illustrates a three dimensional schematic representation of the active area of a proposed depletion mode device with pGaN islands (not found in prior art) which can be used as the actively switched transistor in locations 46, 47, 51, 58, 59, 60.

FIG. 19 illustrates a three dimensional schematic representation of the active area of the depletion mode device with pGaN islands shown in FIG. 18 operated in diode mode and can be used in locations 34 58 59.

FIGS. 59 and 60 show schematic representations of two further embodiments of a transistor with p-GaN islands 11. In FIG. 59, they are arranged in such a way that an S-shaped meander is formed between the islands 11. The p-GaN islands are operatively connected through a contact layer 10 to the common gate terminal 59. FIG. 60 is a similar embodiment with three rows of p-GaN islands 11 arranged to form a labyrinth shaped 2DEG between the islands.

FIG. 71 shows an example of a current-voltage characteristic of the D-HEMT transistor illustrated in FIGS. 59 and 60.

The D-HEMT with p-GaN islands illustrated in FIGS. 59 and 60, when in the high resistance mode (gate bias with respect to source bias is between the first and second threshold voltage level), may feature a saturation current behaviour limiting the current at strong forward bias. The extent to which the current saturates may be affected by the distance between the pGaN islands where the smaller the distance between the pGaN islands, the stronger the current saturation observed. An example of this saturation is illustrated in FIG. 71.

FIG. 20 shows the transfer characteristic of the proposed depletion mode device shown in FIG. 18.

FIG. 21 illustrates the cross-section of an additional embodiment according to a second aspect of the proposed invention. The features shown in FIG. 21 carry the same reference numerals as those shown in FIG. 2. In this embodiment, the first additional terminal 16 and the auxiliary gate terminal 15 are not operatively connected.

FIG. 22 shows a schematic illustration of the structure of FIG. 21, and corresponding features of this figure use the same reference numerals. In this embodiment, a range of components may be added between the auxiliary gate terminal 15 and the first additional terminal 16. Merely for example, these components may include, but are not limited to, any one or more of resistive elements, passive elements and current sources. Further illustrative examples of such embodiments are presented herein.

In FIG. 23 a Gallium Nitride (GaN) chip 1000 (also referred to as a smart GaN power device or a GaN power or high voltage integrated circuit) is shown according to an embodiment of the second aspect of this invention. The GaN chip may comprise at least three terminals. These at least three terminals may include one or more of a high voltage terminal, a low voltage terminal and a control terminal. The chip 1000 may further comprise one or more main power heterojunction transistors 500 with an internal gate.

The source and drain terminals of transistor 500 may be connected to the low voltage and high voltage terminals of the GaN chip respectively. Chip 1000 may further comprise a current control circuit 530, a pull-down circuit 520 and/or an auxiliary gate circuit 510. The auxiliary gate circuit 510 may contain at least one low-voltage heterojunction transistor (also referred to as an auxiliary transistor) with an internal gate.

The auxiliary gate circuit 510 may be operatively connected to at least the internal gate of the one main power heterojunction transistor 500 by a first connection, and may further comprise a second connection to operatively connect the auxiliary gate 510 to the control terminal. A third connection of the auxiliary gate circuit 510 may operatively connect the internal gate of the low-voltage heterojunction transistor of auxiliary gate circuit 510 to the pull down circuit 520.

In addition to the at least one connection to the auxiliary gate circuit, pull-down circuit 520 may comprise at least one connection to the current control circuit and at least one connection to the source terminal of the main power heterojunction transistor 500.

Current control circuit 530 may comprise at least one connection to each of the control terminal, auxiliary gate circuit 510 and pull down circuit 520.

The auxiliary gate 510 may partly control the voltage and the current levels into the internal gate of the main power heterojunction transistor 500. The current control circuit 530 may control the current level into pull down circuit 520 and in conjunction with the pull down circuit may further determine the voltage level applied to the internal gate of the low-voltage heterojunction transistor of auxiliary gate 510. The pull-down circuit in turn may actively pull down the gate voltage of the low-voltage heterojunction transistor in order to clamp the voltage of the internal gate of the main power heterojunction transistor.

With reference to FIGS. 22 and 23, in some embodiments the auxiliary gate terminal 15 of auxiliary gate block 510 may be connected through or via current control block 530 to the first additional terminal 16 of auxiliary gate block 510. Auxiliary gate terminal 15 may be further connected through or via the pull-down circuit block 520 to the source terminal 8 of active device block 500.

The portion of the auxiliary 2DEG under the auxiliary pGaN gate 14 may be depleted when the auxiliary gate terminal 15 is at or close to 0V. As the first additional terminal bias is increased, the potential on both terminals 15, 16 may increase and the 2DEG may begin forming under pGaN gate 14. The 2DEG formed under pGaN gate 14 may connect to the (already formed) 2DEG layers under the first and second additional terminals 16, 12. By connecting these 2DEG layers, a 2DEG connection may be formed between the first and second additional terminals 12, 16.

As the second additional terminal 12 is connected to the active gate 10 the device can now turn on. A positive shift in the device threshold voltage is observed using this structure as not all of the potential applied to the first additional terminal 16 is transferred to the active gate (internal gate) 10. Part of this potential is dropped across the auxiliary gate 510 and only part is transferred to the second additional terminal 12 which is connected to the active gate (internal gate) 10. Advantageously, this enables an increase in the threshold voltage without compromising the on-state resistance of the device, as discussed below.

FIG. 24 shows an example of the relationship between the external gate voltage bias (GaN chip control terminal bias) 2501 and the active gate voltage (internal gate voltage) 2502 according to one embodiment of the invention. When the external gate voltage signal rises initially (up to auxiliary gate transistor Vth) the auxiliary gate transistor has a high resistance. The majority of the potential applied is dropped across the auxiliary gate transistor and the potential of the active gate terminal remains close to 0V. When the external gate voltage signal reaches the auxiliary gate transistor Vth the auxiliary transistor becomes less resistive and the potential of the active gate terminal starts rising.

A threshold voltage increase is therefore achieved in the GaN chip multi-block HEMT without any compromise in the on-state resistance of the device. A positive shift (as shown in graph 2500) in the device threshold voltage is observed using this structure as not all of the potential applied to the external gate is transferred to the active gate (part of this potential is used to form the auxiliary 2DEG under the auxiliary gate) and only part is transferred to the terminal 12 which is connected to the active gate 10.

When the external gate 16 bias voltage reaches a pre-designed level, pull-down circuit block 520 becomes operational and pulls the gate 15 of the auxiliary transistor towards the active transistor source terminal 8 potential. The auxiliary transistor has a high resistance in this condition, therefore any additional external gate potential is dropped across the auxiliary transistor and the active gate terminal potential remains approximately constant with the external gate voltage signal rising, for example to at least approximately 20V.

The design of the current control block 530 and pull-down circuit block 520 determines the potential where the active gate terminal is clamped.

Several illustrative examples are included herein with different implementations of the functional blocks 510, 520, 530. Note that the list of examples presented is not exhaustive and any combination of the different implementations for each block can be considered under the scope of this invention. This includes the several examples of the auxiliary gate presented above. Furthermore, any or all of the protection and control circuits (over-voltage, overcurrent, miller clamp) presented above may also be combined with the functional blocks presented in FIG. 23.

FIG. 25 shows a schematic representation of one embodiment the GaN chip 1000*a* of the proposed invention. Auxiliary gate block 510*a* comprises an enhancement mode low voltage HEMT, current control block 530*a* comprises a resistor and the pull-down circuit 520*a* comprises a HEMT in threshold multiplier configuration. The threshold multiplier configuration in this embodiment comprises a potential divider and a pull-down enhancement mode HEMT where the midpoint of the potential divider is connected to the gate terminal of the pull-down HEMT. In this embodiment, the top of the potential divider is connected to the drain of the pull-down enhancement mode HEMT and the gate terminal of the auxiliary gate block HEMT.

FIG. 26 shows a schematic representation of a further embodiment of the GaN chip 1000*b* of the proposed invention where the auxiliary gate block 510*b* comprises an enhancement mode low voltage HEMT. The current control block 530*b* comprises a resistor in parallel with an RC circuit. The RC circuit in parallel can improve the device dynamic characteristic during turn-on and turn-off transients. The pull-down circuit 520*b* comprises a HEMT in threshold multiplier configuration with a passive element in parallel.

The passive element can improve the device dynamic characteristic during turn-on and turn-off transients.

FIG. 27 shows a schematic representation of a further embodiment of the GaN chip 1000*c* of the proposed invention. The auxiliary gate block 510*c* comprises an enhancement mode low voltage HEMT and a Schottky or p-n diode in parallel. In this embodiment, a low on-state voltage diode is connected in parallel between the drain 16 and the source 12 of the auxiliary transistor. The parallel diode acts as pull-down network during the turn-off of the overall configuration connecting to ground the gate terminal 10 of the active GaN transistor. When a positive bias (known as on-state) is applied to the external gate terminal 16, the diode will be reverse-biased and zero current will flow through it, leaving unaffected the electrical behaviour of the overall high-voltage configuration. When a zero bias (off-state) is applied to the auxiliary gate 15 the diode is forward biased and the turn-off current flowing through it will discharge the gate capacitance of the active transistor, thus enabling the switching off of the overall configuration. In off-state, the gate of the active device 10 will remain biased to a minimum voltage equal to the turn-on voltage of the diode. The diode will therefore be designed in such a way that its turn-on voltage will be as low as possible, ideally few mV. The current control block 530c comprises a current source using a low voltage depletion mode HEMT and a resistor. The resistor value can be adjusted to set the maximum current level that can flow through the current source. The pull-down circuit 520c comprises a HEMT in threshold multiplier configuration.

FIG. 28 shows a schematic representation of a further embodiment of the GaN chip 1000d of the proposed invention where the auxiliary gate block 510d comprises an enhancement mode low voltage HEMT. The current control block 530d comprises a current source using a low voltage depletion mode HEMT and a resistor. The pull-down circuit 520d comprises a HEMT in threshold multiplier configuration.

FIG. 29 shows a schematic representation of a further embodiment the GaN chip 1000e of the proposed invention where the auxiliary gate block 510e comprises an enhancement mode low voltage HEMT. Furthermore, in this embodiment, a second auxiliary transistor (could be advantageously low-voltage) is connected in parallel with the first auxiliary transistor in the auxiliary gate block where the drain terminal 16 of the first auxiliary transistor is connected to the drain terminal of the second auxiliary transistor and the source terminal 12 of the first auxiliary transistor is connected to the source (gate) terminal of the second auxiliary transistor. In this embodiment, the pull-down network during the turn-off of the overall configuration is a second auxiliary transistor. This is similar to the embodiment shown in FIG. 27 but utilises a second auxiliary transistor rather than a diode. The current control block 530e comprises a current source using a low voltage depletion mode HEMT and resistor. The pull-down circuit 520e comprises a HEMT in threshold multiplier configuration.

FIG. 30 shows a schematic representation of a further embodiment the GaN chip 1000f of the proposed invention where the auxiliary gate block 510f comprises an enhancement mode low voltage HEMT. Furthermore, in this embodiment, a second auxiliary transistor is connected in parallel with the first auxiliary transistor as outlined in the embodiment in FIG. 29. The current control block 530f comprises a current source using a low voltage depletion mode HEMT and resistor. The pull-down circuit 520f comprises a HEMT in threshold multiplier configuration. In this embodiment, the threshold multiplier further comprises a current source in parallel with one of the resistors in the potential divider of the threshold multiplier circuit. The inclusion of the current source provides stability in temperature in the value of the clamped voltage achieved on the active gate of the high voltage transistor 500 when the voltage signal on the external gate terminal is high.

FIG. 31 shows a schematic representation of a further embodiment the GaN chip 1000j of the proposed invention where the auxiliary gate block 510j comprises an enhancement mode low voltage HEMT. The current control block 530j comprises a current source using a low voltage depletion mode HEMT and resistor. The pull-down circuit 520j comprises a HEMT in threshold multiplier configuration similar to previous embodiments which comprise a potential divider and an enhancement mode pull-down HEMT. However, in this embodiment, the resistor at the top of the potential divider, which in previous embodiments was connected to the drain terminal of the enhancement mode pull-down HEMT, is alternatively connected to the source terminal of the depletion mode HEMT used in the current source of the control block.

FIGS. 46 and 47 show further embodiments of the invention with the pull-down circuit comprising a second input. This second input may be a supply or regulated voltage stemming from an external terminal or generated on the chip. The second input may be used as a reference voltage.

FIG. 48 shows a schematic representation of a further embodiment of the pull-down circuit 520k. The pull-down circuit block comprises a voltage source and a capacitor in series with a HEMT in a diode configuration. In this embodiment, the resulting voltage drop across the pull-down circuit is the sum of the voltage level of the voltage source and the voltage drop across the HEMT at the current level defined by the current control block. When zero volts, or a small voltage (for example below 1V) or a negative voltage is applied to the external gate terminal 16 (off-state), the HEMT in diode configuration will be reversed biased. FIG. 49 shows a similar embodiment of the pull-down circuit where the HEMT is not in diode configuration but rather in a threshold multiplier configuration using two resistive elements. Other examples include the use of non-linear elements in the threshold multiplier configuration.

FIG. 32 shows a block diagram schematic representation of a further embodiment of the proposed invention. In this embodiment, some additional functional blocks are included compared to the embodiment shown in FIG. 23. In this embodiment, the auxiliary gate block, current control block and pull-down circuit block are included as in previous embodiments. An integrated active Miller clamp is also included.

FIG. 61 shows the schematics of an embodiment of a logic inverter 560a comprising a resistive element as a pull-up circuit and an enhancement mode transistor on the low side, similar to those shown in FIGS. 15 and 16 driving the Miller clamp transistor.

FIG. 62 shows a further embodiment of the logic inverter 560b comprising a current source circuit rather than a resistive element in series with an enhancement mode transistor in which the current source consists of a depletion mode transistor and a resistive element.

In FIG. 63, an embodiment of the logic inverter 560c is shown that consists of two stages. In a multi-stage inverter, all stages comprise an enhancement transistor on the low side with the gate connected to the input signal. Both stages comprise a pull-up circuit, the one of the second stage is controlled by the output of the first stage. In this embodiment of a two-stage inverter, the pull-up circuit of the first stage comprises a current source as described above. The pull-up circuit of the second stage comprises a resistive element and a depletion-mode transistor in series where the gate of the depletion-mode transistor is connected to the output of the first stage. In this embodiment the capacitance of the output of the first stage may be very small, leading to a fast switching time even at a small current consumption. Therefore, the gate of the depletion-mode transistor of the second stage will rise faster than in a current source arrangement. Therefore, this arrangement may lead to a faster switching time at a given load and a given current consumption.

A further embodiment of a two-stage inverter 560*d* is shown in FIG. 64. An additional enhancement transistor is connected to the pull-up circuit of the second stage. This transistor has the gate connected to the output of a previous stage and is connected in parallel to the resistive element of the pull-up circuit. During switching to high, the output of the first stage is at a higher voltage compared to the output of the second stage. Therefore, the gate of the additional pull-up circuit transistor being positively biased compared to its source terminal reduces its resistance and increases the current into the output signal. Before and after switching, the output of the first stage and second stage are the same, and the gate of the additional pull-up circuit transistor has zero bias compared to its source bias. The increased current during switching leads to a faster switching time for a given load, such as the actively switched transistor of a Miller clamp, without compromising current consumption in the high or low state.

In FIG. 65, a further embodiment of a two-stage inverter 560*e* is shown. Compared to FIG. 63, the additional pull-up circuit enhancement transistor is connected between the dc voltage rail and the output and works similarly as described in FIG. 64.

The active Miller clamp circuit (for example in FIG. 32) is implemented to offer an additional pull-down network for the active device gate terminal 10 during the device turn-off transient. The active Miller clamp circuit may comprise a monolithically integrated Miller clamp transistor 570, a logic inverter 560, an external gate signal to logic signal conversion 540 and/or a DC to DC block 550 to produce an appropriate inverter VDD rail.

The transistor 570 may include a low voltage enhancement mode HEMT as illustrated in this embodiment. The logic inverter 560 may include a low voltage enhancement mode HEMT and a resistor (similar to the inverter circuit illustrated in FIG. 16). However, this is merely provided as an example configuration, and other logic inverter designs (as illustrated in FIGS. 61, 62, 63, 64 and 65) could be utilised in place of or in addition to this.

The enhancement mode device used in the inverter may be formed in the same process step as the active high voltage transistor. Therefore, the upper limit of the voltage signal that can be applied to the gate of the inverter transistor might be lower than the external gate signal. The Vg to logic block 540 may be used to reduce the external gate voltage signal to a voltage signal appropriate for use with a p-GaN technology enhancement mode HEMT.

The integrated Miller clamp transistor may receive a signal close to VDD to its gate terminal when the output of the inverter is high. Therefore, if the VDD rail available is higher than the peak gate voltage that the integrated clamp resistor can tolerate then a DC/DC step 550 may be integrated into the GaN chip multi-block power device to reduce the VDD rail to a desirable level.

FIG. 50 shows the block diagram of a voltage regulator (or DC/DC block) 550 connected to the input of the receiving circuit (for example the logic inverter) through a decoupling circuit 580. An embodiment with a decoupling circuit may protect the inverter from current spikes or voltage excursions induced from the voltage source. These current spikes or voltage excursions may be a result of electromagnetic coupling of the circuit to other elements of the chip or the system, in particular, fast voltage and current slopes and may originate from the input to the DC/DC block, or within the DC/DC block. Overvoltage of the DC voltage may destroy the inverter, under voltage may lead to malfunction.

In FIG. 51, an exemplary embodiment of the decoupling circuit is shown where the decoupling circuit 580*a* consists of a series resistive element and a capacitor across the input voltage of the inverter. In another embodiment, shown in FIG. 52, the resistive element may be replaced with a current source formed of a depletion HEMT and a resistive element. FIGS. 53 and 54 show exemplary embodiments, where a transistor is added to the current source in parallel to the current source or in parallel to the resistive element to adjust the current limit through the current source. When the additional transistor is in a low resistive state the coupling is strong for high current supply. When the additional transistor is in a high resistive state, the coupling is weak (good decoupling) but only a low current can be supplied through the decoupling circuit. The additional HEMT allows adjusting coupling and current limit to varying operating status.

FIG. 55 shows the decoupling circuit 580*e* comprising a current source as in FIG. 52 and an additional HEMT in parallel to the capacitive element. This additional HEMT allows sinking the current in case of a current spike and may be effective against overvoltage. In this exemplary embodiment, the additional HEMT is turned on by a resistive and capacitive voltage divider on the input side of the decoupling circuit. When the input voltage rises to a certain level or exceeds a certain rate the gate of the additional HEMT is increased to turn the HEMT on and to sink excess current.

FIG. 56 shows an additional embodiment of a decoupling circuit 580*c* (similar to the decoupling circuit 580*e* shown in FIG. 55) in which the additional HEMT in parallel with the current source is controlled by having its gate connected to the gate voltage of the active HEMT 500. In this embodiment, the coupling is strong when the active HEMT is in the on-state, weak when the active HEMT is off.

The described decoupling circuits may be applied not just for the input of the inverter but for any dc signal or dc supply voltage on the chip.

FIG. 33 shows a schematic representation of a further embodiment the GaN chip 3000*a* of the proposed invention where the auxiliary gate block 610*a* comprises a depletion mode low voltage HEMT. The current control block 630*a* comprises a resistive element. The pull-down circuit 620*a* comprises a HEMT in threshold multiplier configuration. The operation of the GaN chip multi-block power device illustrated in this embodiment is similar to the operation of the device illustrated in FIG. 25 in achieving a clamped voltage signal on the active gate terminal (internal gate terminal) of the high voltage HEMT (the main power heterojunction transistor) 500 when the external voltage signal exceeds a pre-determined (by design) level. The use of a depletion mode transistor in the auxiliary gate block in this embodiment might not be as effective in providing an increased threshold voltage for the GaN chip power device 3000*a*, compared to the GaN chip power device 1000*a*. The low voltage depletion mode HEMT may be more effective in providing a turn-off path as part of the turn-off network of the device as the channel in the depletion-mode transistor is present when the potential on the active gate is high and the potential at the external gate terminal is low.

FIG. 34 shows a schematic representation of a further embodiment of the GaN chip 3000*b* of the proposed invention where the auxiliary gate block 610b comprises a depletion mode low voltage HEMT. In this embodiment, a second auxiliary transistor (which may advantageously be a low-voltage transistor) is connected in parallel with the first auxiliary transistor in the auxiliary gate block where the drain terminal 16 of the first auxiliary transistor is connected to the drain terminal of the second auxiliary transistor and the source terminal 12 of the first auxiliary transistor is connected to the source (gate) terminal of the second auxiliary transistor. In this embodiment, the second auxiliary transistor is included as an additional pull-down network during the turn-off of the high voltage transistor 500. The current control block 630e comprises a current source using a low voltage depletion mode HEMT and resistor. The pull-down circuit 620e comprises a HEMT in threshold multiplier configuration.

FIG. 35 shows a schematic representation of a further embodiment the GaN chip 3000d of the proposed invention where the auxiliary gate block 610d comprises a depletion mode low voltage HEMT. Furthermore, in this embodiment, a second depletion mode auxiliary transistor (could be advantageously low-voltage) is connected in parallel with the first auxiliary transistor in the auxiliary gate block where the drain terminal 16 of the first auxiliary transistor is connected to the drain terminal of the second auxiliary transistor and the source terminal 12 of the first auxiliary transistor is connected to the source terminal of the second auxiliary transistor. The gate terminal of the second auxiliary transistor is connected to the source terminal of the high voltage transistor 500. In this embodiment, the second depletion mode auxiliary transistor is included as an additional current path during the turn-on of the high voltage transistor 500. When the external gate signal goes high the second depletion-mode transistor is in saturation mode and provides an additional conduction path for charging the gate-source capacitance of the high voltage transistor 500. As the voltage of the active gate terminal rises above the threshold voltage of the second depletion mode transistor that conduction path becomes very resistive. The current control block 630e comprises a current source using a low voltage depletion mode HEMT and resistor. The pull-down circuit 620e comprises a HEMT in threshold multiplier configuration.

FIG. 36 shows a schematic representation of a further embodiment the GaN chip 5000b of the proposed invention where the auxiliary gate block 810b comprises an enhancement mode low voltage HEMT. The current control block 830b comprises a current source using a low voltage depletion mode HEMT and resistor. The pull-down circuit 820b comprises a HEMT in threshold multiplier configuration which comprises a potential divider and a pull-down enhancement mode HEMT where the midpoint of the potential divider is connected to the gate terminal of the pull-down HEMT. In this embodiment, the top of the potential divider is connected to the active gate terminal rather than the drain of the pull-down enhancement mode HEMT as in previous embodiments.

In FIG. 37 the top of the potential divider is connected to the active gate terminal, the potential divider comprises a number of source-gate connected E-HEMTs in series 821c with the resistors shown in previous embodiments. While FIG. 37 shows two HEMT in series, a different number may be used. These HEMTs are one possible method to adjust the voltage level that is required to be reached on the active gate terminal before the pull-down enhancement mode HEMT becomes operational.

FIG. 38 shows another method for adjusting the voltage level required to be reached on the active gate terminal before the pull-down enhancement mode HEMT becomes operational. FIG. 38 utilises an additional HEMT in threshold multiplier configuration 821d.

FIG. 39 shows a schematic representation of a further embodiment the GaN chip 6000a of the proposed invention where the auxiliary gate block 910a comprises an enhancement mode low voltage HEMT. The current control block 930a comprises a current source using a low voltage depletion mode HEMT and resistor. The pull-down circuit 920a comprises a HEMT in threshold multiplier configuration which comprises a potential divider where the midpoint of the potential divider is connected to the gate terminal of the pull-down HEMT similar to previous embodiments. However, in this embodiment, the potential divider is connected to the external gate terminal rather than the gate terminal of the auxiliary transistor. In addition, a further HEMT in threshold multiplier configuration may be included between the gate and source terminal of the enhancement mode pull-down HEMT. This additional threshold multiplier acts to limit voltage on the gate terminal of the pull-down transistor. This additional threshold multiplier may alternatively be implemented using one or more diodes in series.

FIG. 40 shows a schematic representation of a further embodiment the GaN chip 6000b of the proposed invention where the auxiliary gate block 910b comprises an enhancement mode low voltage HEMT. The current control block 930b comprises a current source using a low voltage depletion mode HEMT and resistor. The pull-down circuit 920b comprises a pull-down enhancement mode HEMT with the gate connected to the output of a voltage divider similar to other embodiments. In this embodiment, the voltage divider is connected to the external gate terminal and consists of a current source and a HEMT in threshold multiplier configuration. The current source is implemented using a low voltage depletion mode HEMT and a resistor. The output of the voltage (potential) divider is the gate of the additional low-voltage HEMT.

In further embodiments, the gate of the pull-down HEMT may be controlled by an additional external signal, preferably through a VG to Vlogic regulator as described above, or by the output of an additional circuit integrated on the GaN device providing functions such as over-current protection, under-voltage lock-out, supply-voltage over-voltage protection, logic inverter or others.

In further embodiments, the exemplary GaN chip circuit 7000 illustrated in FIG. 69 may comprise one or several enable or disable functions to permanently or temporarily enable or disable the active HEMT, independent of the control signal applied. In FIG. 69, several exemplary embodiments are shown of enable or disable functions. With HEMT 595a, the disable function is realised as a HEMT across the pull-down circuit 520 limiting the voltage of the gate of the auxiliary gate.

HEMT 595b is integrated with the inverter driving the Miller clamp transistor 570. The inverter and HEMT 595b are forming a logic NAND function.

A third exemplary embodiment is shown in FIG. 69 where HEMT 595c is in series with the Miller clamp in a logic NAND connection, meaning that both the Miller clamp transistor and the disable transistor must be off to enable the gate voltage of the active GaN HEMT 500 to rise.

In a fourth exemplary embodiment, HEMT 595d is connected in parallel to the Miller clamp in a logic NOR connection, meaning that either the Miller clamp or the disable HEMT 595*d* may reduce the gate voltage of the active GaN HEMT 500.

A further embodiment of the invention is shown in FIG. 66 comprising a current control circuit 530 that is connected to a separate input (VINPUT2) than the auxiliary gate transistor. Further, in the same figure, the integration of a disable function 595*e* is shown in parallel to the pull-down circuit 520. While the disable function is active, the gate of the active GaN HEMT 500 is not affected by the input signal on the first additional terminal (VINPUT1). In this exemplary embodiment, the disable block 595*e* consists of an enhancement HEMT and a logic inverter allowing the application of a high signal to enable the turn-on of the device. The disable function 595*e* does not actively reduce (turn off) the gate of the active GaN HEMT 500. To do this, a Miller clamp transistor 570 as shown in FIG. 32 may be integrated. With the Miller clamp arrangement and disable function shown here, a gate driver functionality is realised in which the voltage on the first additional terminal (VINPUT1) may be kept constant and the disable and Miller clamp may control the gate of the active GaN HEMT 500.

A further embodiment of the invention is shown in FIG. 67 in which the current control block 530*m* is actively switched. In this embodiment, the control signal to the current control block stems from the enable and disable input. Compared to the arrangement in FIG. 66, the current is reduced when the disable function is active, reducing the current consumption when the device is disabled.

Another exemplary embodiment is presented in FIG. 68. The pull-down circuit 520*k* consists of a voltage source VDD3 and an enhancement HEMT with drain connected to the gate, as described earlier in this invention. An enable/disable circuit 595*f* is in parallel to the pull-down circuit as in FIG. 67. The current control block 530*n* in this embodiment contains an additional voltage drop where a voltage VDD2 is generated from the voltage at the first additional terminal (VINPUT1). The voltage drop between VINPUT1 and VDD2 is achieved through a voltage regulator 530*na* based on an embodiment of the gate interface circuit described in this invention. The current control block is actively controlled with a signal from the enable or disable terminal. The active control may be realised using a logic inverter driving the gate of a depletion HEMT 531 forming the current source. A logic inverter with more than one stage, as described earlier in this invention, may be used to drive the depletion HEMT 531. Additionally, an enhancement HEMT 532 is connected in parallel to the current source with the gate of the enhancement HEMT connected to an internal node of the current control block. This additional enhancement HEMT may provide an additional current path during the switching event when the disable function is released.

FIG. 41 illustrates an interdigitated device layout of a further embodiment of the disclosure incorporating an auxiliary gate structure. Many features of this embodiment are similar to those shown in FIG. 21 and therefore carry the same reference numerals, i.e., active gate terminal 10, low voltage source terminal 8, high voltage drain terminal 9, first additional terminal 16 and second additional terminal 12. Also shown in this illustration are the source pad metal 18, drain pad metal 19, and gate pad metal 20. However, in this embodiment, rather than the gate pad metal 20 being contacted to the gate fingers 10 directly as in a prior art device, it is connected to the auxiliary gate terminal 16. The gate fingers in the interdigitated structure are directly connected to the second additional terminal 12. Note that in this layout, as in the cross-sections in previous embodiments, an isolation layer exists between the 2DEG in the auxiliary gate and the active device. The additional operational blocks in this device are also illustrated: auxiliary gate block 510, pull-down circuit block 520, current control block 530. The connections of the different blocks can be made using interconnection metal layers 210.

FIG. 42 illustrates an interdigitated device layout of a further embodiment of the disclosure in which the auxiliary gate and terminal regions are placed below the source pad metal. Similarly, these circuits could be placed under the gate pad or the drain pad (not shown). Many features of this embodiment are similar to those shown in FIG. 41 and therefore carry the same reference numerals, i.e., active gate terminal 10, low voltage source terminal 8, high voltage drain terminal 9, first additional terminal 16, second additional terminal 12, source pad metal 18, drain pad metal 19, gate pad metal 20, auxiliary gate block 510, pull-down circuit block 520, current control block 530, interconnection metal 210. However, in this embodiment, the auxiliary gate block, current control block and pull-down circuit block are placed below the source pad metal 18. Intermetal vias 220 can connect blocks at different metal layers in the process. Less additional wafer area would be needed to include the additional blocks compared to a prior art design. Note that in this illustration the additional blocks are placed under the source pad metal however this disclosure is intended to include designs where the additional blocks may be placed under other pads present in the integrated circuit layout.

FIG. 43 shows a block diagram of a further embodiment of the proposed disclosure where any of the embodiments of the GaN chip power device 35 are placed in a half-bridge configuration, where the external gates of the two power devices (both high and low side) are connected to gate driving blocks which are in turn connected to logic blocks. The different components and blocks included in the figure can be discrete components or connected monolithically. This demonstrates different examples of possible monolithic integration 36, 37, 38 while utilising the concept of the auxiliary gate.

FIG. 44 shows a circuit schematic representation of a further embodiment of the proposed disclosure where the GaN chip power device 35 according to this disclosure is connected in a standard three-phase half-bridge configuration.

FIG. 57 shows a schematic representation of an embodiment of the current control block 530*k* with a current reduction feature. To a conventional current source consisting of a depletion HEMT and resistive element, an additional enhancement mode HEMT is added, in parallel to the resistive element. Note that during off-state of the active GaN HEMT 500, the output of the current control block is at a low voltage, and in the on-state it is at a higher voltage. The gate of the additional enhancement mode HEMT is at a fixed voltage. Therefore, the resistance of the additional enhancement mode HEMT is higher in on-state than in off-state. This leads to the desired reduction of the current in the current control block during on-state of the active GaN HEMT 500. In addition, the gate of the additional HEMT can be actively controlled to further modulate the current level through the current control block. Further, the additional enhancement HEMT may be connected in parallel to the entire current source rather than only the resistive element.

FIG. 58 shows a similar embodiment of a current control block with a current reduction feature but using an additional depletion HEMT instead of an additional enhancement HEMT.

FIG. 45 shows a schematic representation of an embodiment of a shielding and/or decoupling structure. The purpose of shielding and/or decoupling structure is to reduce or eliminate the influence of one part of the chip, e.g. the active GaN device (main power HEMT), on a different part of the chip, e.g. the pull-down circuit, via electro-magnetic coupling. The shielding and/or decoupling structures can be below, above, on the sides or in the vicinity of either or both of the two parts of the chip. FIG. 45 shows an example shielding and/or decoupling structure 61, 62 situated laterally between two parts, or structures, 60, 66 of the chip. In this example, the decoupling structure comprises a plurality of 2DEG structures 61, 62. These 2DEG structures 61, 62 are connected to a controlled potential, e.g. to the first terminal of the active GaN device, through an ohmic contact layer 64 and operatively connected through vias 65 to other metal layers. Areas 60 and 66 may comprise arrangements of HEMTs, capacitive and resistive elements and electrical connections. Areas 60 and 66 may further be fully or partially shielded by layers above or below.

FIG. 70 shows a block diagram of a further embodiment of the disclosure with several GaN chip power devices. In this embodiment, the power devices 500a, 500b and the gate interfaces 8000a, 8000b share the low-voltage terminal (source). FIG. 70 shows how some of the external control or supply signals are connected to only one gate interface. Other control or supply signals are connected between several gate interfaces. This is the result of the blocks auxiliary gate circuit, pull-down circuit and current control-circuit or parts thereof being shared among the several main power devices for more compact solutions. For example, a voltage regulated on one gate interface block may be used directly in another gate interface block. This avoids duplication of sub-circuits and saves chip area.

FIG. 72 shows an example GaN chip 2500. In implementations of the pull-down circuits 520k and 5201 as shown in FIG. 48 and FIG. 49, the voltage VDD may not be a regulated voltage which is generated internally on the chip or applied externally. In some cases, the voltage VDD may be provided by the pull-down circuit itself.

When the gate terminal is high, a capacitor in the pull-down circuit may be charged from the gate terminal via a charging path (e.g. through the current control circuit 530). The magnitude of VDD may be set through the design of a threshold multiplier (e.g. as in pull-down circuit 520a) included in parallel to the pull-down circuit 520k illustrated in FIG. 48. As the gate terminal is not kept constantly high, but rather switches from high to low according to the required operation of the power HEMT 500, it may take a number of switching cycles to fully charge the capacitor in the pull-down circuit.

The VDD circuit generated may be used to power other blocks of the integrated circuit, for example inverter 560. This may remove the need for the VDD supply provided to the power integrated circuit (which in previous implementations has generally been provided externally or generated in other parts of the power integrated circuit). Alternatively, this internally generated VDD circuit may complement (in terms of the current) or replace an external VDD supply, and/or provide an alternative internal VDD rail for use if, for example, the external VDD rail is under a certain voltage value, which could cause the malfunction of the GaN chip 2500, and/or if the external VDD pin is not connected (i.e. it is floating).

The maximum voltage across the capacitor may be limited by the maximum voltage across the pull-down circuit.

In further implementation shown by GaN chip 2600 of FIG. 73, the internal voltage VDD may be additionally charged from an external high voltage node Vrail. The circuit 505 forms a second charging path for charging the capacitor of the pull down circuit 520, and comprises a high voltage depletion mode HEMT which can draw current from the high voltage node Vrail. The source of the depletion mode HEMT in circuit 505 is connected to VDD voltage node and the gate of the depletion mode HEMT is connected to the source of the power HEMT. When the capacitor of the pull down circuit 520 is charged via only the second charging path, the voltage across the capacitor is limited by an absolute value of a threshold voltage of the depletion mode HEMT.

An integrated resistor may be connected in series with the source as shown to control the maximum allowable current. This resistor may be e.g. a 2DEG resistor, and/or part of the depletion mode HEMT transistor itself.

When the gate is switching during normal operations, (in which the capacitor in the pull-down circuit is charged through the gate via the charging path) the voltage VDD may be designed to be at a value which is greater than the threshold voltage of the depletion mode HEMT. Under this condition, the Vgs for the depletion mode HEMT is more negative than its threshold voltage, and therefore the depletion mode HEMT is in the off-state and draws a negligible current.

When the gate is not switching or otherwise operating under normal conditions (e.g. during start-up, operating under no-load conditions, or in a standby mode), the voltage VDD that the capacitor is charged at, will drop until it reaches a value which is approximately equal to the threshold value of the depletion mode HEMT. Under this condition, the depletion mode HEMT will be in saturation and current can be drawn from the high voltage supply to power the circuit blocks which are connected to VDD (in this example the Miller clamp).

As the current is drawn from the high voltage supply, the load connected during this condition draws very little current, such that the power dissipation while these conditions are in place remain within any limits required by the intended use or design requirements.

The Vrail can be connected to a high voltage rail in the system (not shown) or alternatively could be connected to the drain terminal (Drain) of the power HEMT. In the latter case, there is no need for an additional pin or terminal connection for the Vrail.

The depletion mode HEMT may have a Schottky gate, or may have a p-GaN island gate as described in this application.

It may be desirable to maintain the operation of the Miller clamp during all conditions of the power integrated circuit so as to protect power HEMT 500 and the overall system, where the power integrated circuit is used from fast dV/dt transients.

FIG. 74 shows an example multi-stage inverter 560f. The first stage of the inverter comprises a current source 5603 and an enhancement mode HEMT 5604 similar to those implementations described above. The current source 5603 is not connected to voltage VCC but rather is connected to a level shifted version of VCC, as shown. The level shift may be achieved using source-gate connected HEMTs 5601, 5602.

The output of the first inverter stage is connected to the gate terminal of enhancement mode transistor 5607. The second stage of the inverter comprises an enhancement mode HEMT 5606, a capacitor 5605 and the enhancement mode HEMT 5607.

When the input to the multi-stage inverter is high the output of the first stage is low. HEMT 5606 is conductive under this condition, and so the output node of the inverter is low. HEMT 5607 is not conductive under this condition as Vgs=0V for this device. Capacitor 5605 is therefore charged through the source-gate connected HEMTs 5601 5602 to approximately VCC−2*Vth.

With the absence of p-channel devices, it is challenging to achieve a fast transition of the output from low to high (i.e. pull-up) while minimising the power dissipation of the inverter in all conditions. Thus, in this implementation, a fast pull-up is achieved through capacitor 5605.

When the input to the multi-stage inverter 560f is low the output of the first stage is high. As the first stage output is connected to the gate of enhancement mode HEMT 5607 making it conductive, the output node of the inverter is held up through HEMT 5607.

FIG. 75 shows a circuit schematic of an implementation of a Vg to Vlogic circuit block 540a. Circuit block 540a comprises a current source and a group of enhancement mode transistors connected in series. The block 540a can receive a switching signal as an input (e.g. 12V, 0V) and output a switching signal which is limited in magnitude (e.g. 6V, 0V). The limit in the output magnitude of this circuit block may be designed or controlled by selecting the appropriate number of source-gate connected transistors (or drain-gate connected transistors).

FIG. 76 shows a circuit schematic of a further implementation of a Vg to Vlogic circuit block 540b. Circuit block 540b comprises a current source and a threshold multiplier. The block 540b can receive a switching signal as an input (e.g. 12V, 0V) and output a switching signal which is limited in magnitude (e.g. 6V, 0V). The limit in the output magnitude of this circuit block may be designed or controlled by selecting the appropriate ratio of the resistors in the potential divider of the threshold multiplier.

FIG. 77 shows a Vg to Vlogic circuit block 540c. This implementation is similar to circuit block 540b, but comprises an additional capacitor to enhance the speed of the circuit.

FIG. 78 shows a circuit schematic of another example Vg to Vlogic circuit block 540d. Circuit block 540d comprises a current source, an enhancement mode HEMT and a resistor. The gate of the enhancement mode HEMT is connected to fixed voltage VCC. The fixed voltage may be provided externally or be generated internally on the chip (e.g. as a VDD described above). The voltage output of block 540d is limited to a value of approximately VCC-Vth, the threshold voltage being the threshold voltage of the enhancement voltage HEMT. If the voltage on the output of the Vg to Vlogic circuit 540d exceeds this limit (i.e. is greater than VCC-Vth), then the enhancement mode HEMT will be in the off-state and the majority of the additional voltage applied across the input of the Vg to Vlogic circuit 540d will be dropped across the enhancement mode HEMT.

FIG. 79 shows a circuit schematic of an example DC/DC circuit block 550a. The DC/DC block 550a is formed of a linear voltage regulator which comprises a depletion mode HEMT connected in series between the input and the output of the linear voltage regulator. The circuit further comprises a current source and threshold multiplier. The threshold multiplier comprises an enhancement mode HEMT and a potential divider, where the midpoint of the potential divider is connected to the gate terminal of the enhancement mode HEMT. The top of the potential divider is connected to the output of the linear voltage regulator. Alternatively, the top of the potential divider could be connected to the gate of the depletion mode HEMT.

In another example (not shown) the depletion mode HEMT connected between the input and output of the linear voltage regulator may be replaced by an enhancement mode HEMT.

FIG. 80 shows a circuit schematic of a further example DC/DC circuit block 550b. The threshold multiplier in block 550a is replaced by a number of source-gate connected (or drain-gate connected) enhancement mode HEMTs connected in series.

It will be appreciated that the auxiliary transistor described above in relation to all the embodiments can be a low voltage transistor or a high voltage transistor.

It will also be appreciated that terms such as "top" and "bottom", "above" and "below", "lateral" and "vertical", and "under" and "over", "front" and "behind", "underlying", etc. may be used in this specification by convention and that no particular physical orientation of the device as a whole is implied.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in the disclosure, whether alone or in any appropriate combination with any other feature disclosed or illustrated herein.

REFERENCES

[1] U. K. Mishra et al., GaN—Based RF power devices and amplifiers, Proc. IEEE, vol 96, no 2, pp 287-305, 2008.
[2] M. H. Kwan et al, CMOS-Compatible GaN-on-Si Field-Effect Transistors for High Voltage Power Applications, IEDM, San Fran., December 2014, pp 17.6.1-17.6.4
[3] S. Lenci et al., Au—free AlGan/GaN power diode 8-in Si substrate with gated edge termination, Elec. Dev. Lett., vol 34, no 8, pp 1035, 2013.
[4] T. Oka and T. Nozawa, IEEE Electron Device Lett., 29, 668 (2008).
[5] Y. Cai, Y. Zhou, K. J. Chen, and K. M. Lau, IEEE Electron Device Lett., 26, 435 (2005)
[6] W. Saito, Y. Takada, M. Kuraguchi, K. Tsuda, and I. Omura, IEEE Trans. Electron Devices, 53, 356, (2006).
[7] Y. Uemoto, M. Hikita, H. Ueno, H. Matsuo, H. Ishida, M. Yanagihara, T. Ueda, T. Tanaka, and D. Ueda, IEEE Trans. Electron Devices, 54, 3393 (2007).
[8] I. Hwang, H. Choi, J. Lee, H. S. Choi, J. Kim, J. Ha, C. Y. Um, S. K. Hwang, J. Oh, J. Y. Kim, J. K. Shin, Y. Park, U. I. Chung, I. K. Yoo, and K. Kim, Proc. ISPSD, Bruges, Belgium, p. 41 (2012).
[9] M. J. Uren, J. Moreke, and M. Kuball, IEEE Trans. Electron Devices, 59, 3327 (2012).
[10] L. Efthymiou et al, On the physical operation and optimization of the p-GaN gate in normally-off GaN HEMT devices, Appl. Phys. Lett., 110, 123502 (2017)

[11] GS66504B, GaN Systems, Ottawa, Canada.
[12] Infineon 650V CoolMOS C7 Power Transistor IPL65R130C7.
[13] L. Efthymiou et al, On the Source of Oscillatory Behaviour during Switching of Power Enhancement Mode GaN HEMTs, Energies, vol. 10, no. 3, 2017
[14] F. Lee, L. Y. Su, C. H. Wang, Y. R. Wu, and J. Huang, "Impact of gate metal on the performance of p-GaN/AlGaN/GaN High electron mobility transistors," IEEE Electron Device Lett., vol. 36, no. 3, pp. 232-234, 2015.
[15] O. Ambacher, J. Smart, J. R. Shealy, N. G. Weimann, K. Chu, M. Murphy, W. J. Schaff, L. F. Eastman, R. Dimitrov, L. Wittmer, M. Stutzmann, W. Rieger, and J. Hilsenbeck, "Two-dimensional electron gases induced by spontaneous and piezoelectric polarization charges in N- and Ga-face AlGaN/GaN heterostructures," J. Appl. Phys., vol. 85, no. 6, p. 3222, 1999.
[16] Okita, H., Hikita, M., Nishio, A., Sato, T., Matsunaga, K., Matsuo, H., Mannoh, M. and Uemoto, Y., 2016, June. Through recessed and regrowth gate technology for realizing process stability of GaN-GITs. In Power Semiconductor Devices and ICs (ISPSD), 2016 28th International Symposium on (pp. 23-26). IEEE.
[17] Lu, B., Saadat, O. I. and Palacios, T., 2010. High-performance integrated dual-gate AlGaN/GaN enhancement-mode transistor. IEEE Electron Device Letters, 31(9), pp. 990-992.
[18] Yu, G., Wang, Y., Cai, Y., Dong, Z., Zeng, C. and Zhang, B., 2013. Dynamic characterizations of AlGaN/GaN HEMTs with field plates using a double-gate structure. IEEE Electron Device Letters, 34(2), pp. 217-219
[19] Feng, P., Teo, K. H., Oishi, T., Yamanaka, K. and Ma, R., 2013, May. Design of enhancement mode single-gate and doublegate multi-channel GaN HEMT with vertical polarity inversion heterostructure. In Power Semiconductor Devices and ICs (ISPSD), 2013 25th International Symposium on (pp. 203-206). IEEE
[20] Xiaobin, X. I. N., Pophristic, M. and Shur, M., Power Integrations, Inc., 2013. Enhancement-mode HFET circuit arrangement having high power and high threshold voltage. U.S. Pat. No. 8,368,121.
[21] GaN Systems, GN001 Application Guide Design with GaN Enhancement mode HEMT,

The invention claimed is:

1. A heterojunction device having at least three terminals, the at least three terminals comprising a high voltage terminal, a low voltage terminal and a control terminal, wherein the heterojunction device further comprises;
  at least one main power heterojunction transistor, wherein the at least one main power heterojunction transistor comprises an internal gate terminal, a source terminal and a drain terminal, wherein the source terminal of the at least one main power heterojunction transistor is operatively connected to the low voltage terminal and the drain terminal of the at least one main power heterojunction transistor is operatively connected to the high voltage terminal;
  an auxiliary gate circuit comprising at least one first low-voltage heterojunction transistor, wherein the auxiliary gate circuit is operatively connected to the internal gate terminal of the at least one main power heterojunction transistor and to the control terminal;
  a pull-down circuit operatively connected to an internal gate terminal of the at least one first low-voltage heterojunction transistor and to the source terminal of the at least one main power heterojunction transistor, the pull-down circuit comprising:
    a capacitor; and
    a charging path for the capacitor;
  the heterojunction device further comprising at least one monolithically integrated component, wherein the capacitor is configured to provide an internal rail voltage for the at least one monolithically integrated component.

2. The heterojunction device of claim 1, wherein the pull-down circuit comprises at least one non-linear element and at least one second low-voltage heterojunction transistor, the non-linear element comprising a potential divider for driving the gate terminal of the at least one second low-voltage heterojunction transistor.

3. The heterojunction device of claim 1, wherein the pull-down circuit comprises at least one source-gate connected or drain-gate connected low voltage enhancement mode heterojunction transistor.

4. The heterojunction device of claim 1, wherein the capacitor is operatively connected to the control terminal by the charging path, and wherein the charging path comprises at least one of a current source and a resistor.

5. The heterojunction device of claim 1 wherein the capacitor is operatively connected to the drain terminal of the at least one main power heterojunction transistor by the charging path, and wherein the charging path comprises at least one depletion mode transistor.

6. The heterojunction device of claim 1, wherein the internal rail voltage is controlled by a voltage across the capacitor.

7. The heterojunction device of claim 6, wherein the voltage across the capacitor is limited by the pull-down circuit.

8. The heterojunction device of claim 6, wherein the capacitor is operatively connected to the high voltage terminal by a second charging path, and wherein the second charging path comprises at least one depletion mode transistor; and
  wherein if charging only occurs through the second charging path, the voltage across the capacitor is limited by an absolute value of a threshold voltage of the depletion mode transistor.

9. The heterojunction device of claim 1, further comprising an external rail voltage terminal wherein a rail voltage may be provided.

10. The heterojunction device of claim 1, further comprising a gate voltage to logic signal clamping circuit configured to receive an input signal and provide a magnitude limited output signal, wherein a magnitude of the output signal is limited to a set maximum voltage, and wherein the logic signal clamping circuit comprises:
  a current source operatively connected in series between an input source and the output; and
  one or more enhancement mode transistors operatively connected in series between the current source and a ground terminal, wherein the set maximum voltage of the output signal is based on a number of the one or more enhancement mode transistors.

11. The heterojunction device of claim 1, further comprising a gate voltage to logic signal clamping circuit configured to receive an input signal and provide a magnitude limited output signal, wherein a magnitude of the output signal is limited to a set maximum voltage, and wherein the logic signal clamping circuit comprises:
  a current source operatively connected in series between an input source and the output; and
  a threshold multiplier circuit operatively connected between the current source and a ground terminal, and wherein the set maximum voltage of the output signal is based on a ratio of resistors forming the threshold multiplier circuit.

12. The heterojunction device of claim 11, further comprising a second capacitor operatively connected in parallel to the current source.

13. The heterojunction device of claim 1, further comprising a gate voltage to logic signal clamping circuit configured to receive an input signal and provide a magnitude limited output signal, and wherein the logic signal clamping circuit comprises:
a current source operatively connected in series between an input source and the output; and
an enhancement mode transistor comprising a second source terminal connected to the current source and a second gate terminal connected to a fixed voltage source; and
a resistor operatively connected between a second drain terminal of the enhancement mode transistor and a ground terminal;
wherein the gate voltage to logic signal clamping circuit is configured such that the magnitude of a difference between the output signal voltage and the fixed voltage cannot be greater than an absolute value of a threshold voltage of the enhancement mode transistor.

14. The heterojunction device of claim 1, further comprising a DC to DC converter circuit forming a linear voltage regulator, the DC to DC converter block comprising:
an input terminal;
an output terminal;
a first transistor;
a current source connected between the input terminal and a second drain terminal of the first transistor;
a potential divider circuit, wherein a midpoint of the potential divider is connected to a second gate terminal of the first transistor; and
a second transistor connected in series between the input terminal and the output terminal, wherein a third gate terminal of the second transistor is connected to the second drain terminal of the first transistor.

15. The heterojunction device of claim 14, wherein at least one of the first and second transistors is an enhancement mode transistor.

16. The heterojunction device of claim 14, wherein at least one of the first and second transistors is a depletion mode transistor.

17. The heterojunction device of claim 1, further comprising a DC to DC converter circuit forming a linear voltage regulator, the DC to DC converter block comprising:
an input terminal;
an output terminal;
one or more first enhancement mode transistors connected in series and configured to form a voltage multiplier structure;
a current source connected between the input terminal and a second drain terminal of the first enhancement mode transistors;
a second transistor connected in series between the input terminal and the output terminal, wherein a third gate terminal of the second transistor is connected to the second drain terminal of the one or more first enhancement mode transistors.

18. The heterojunction device of claim 1, further comprising a multi-stage inverter, wherein the multi-stage inverter comprises:
a first stage configured to receive the internal rail voltage as an input voltage, the first stage comprising:
a first stage enhancement mode transistor; and
a current source operatively connected between a source terminal of the enhancement mode transistor and a fixed voltage source; and
a second stage comprising:
a second stage enhancement mode transistor, wherein a gate terminal of the enhancement mode transistor is connected to an output of the first stage;
a second stage capacitor; and
a further second stage transistor, wherein the capacitor and the further second stage transistor are connected in parallel to the first stage, and wherein a gate terminal of the first stage enhancement mode transistor and a gate terminal of the further second stage transistor are operably connected;
the inverter further comprising one or more source-gate connected transistors in series between the voltage source and the current source, the one or more transistors configured to level shift a voltage from the voltage source.

19. A GaN chip or GaN integrated circuit comprising the heterojunction device of claim 1.

20. A heterojunction chip having at least three terminals, the at least three terminals comprising a high voltage terminal, a low voltage terminal and a control terminal, wherein the heterojunction chip further comprises;
at least one main power heterojunction transistor, wherein the at least one main power heterojunction transistor comprises an internal gate terminal, a source terminal and a drain terminal, wherein the source terminal of the at least one main power heterojunction transistor is operatively connected to the low voltage terminal and the drain terminal of the at least one main power heterojunction transistor is operatively connected to the high voltage terminal;
an auxiliary gate circuit comprising at least one first low-voltage heterojunction transistor, wherein the auxiliary gate circuit is operatively connected to the internal gate terminal of the at least one main power heterojunction transistor and to the control terminal;
a pull-down circuit comprising at least one non-linear element and at least one second low-voltage heterojunction transistor, the non-linear element comprising a potential divider for driving the gate terminal of the at least one second low-voltage heterojunction transistor, wherein the pull-down circuit is operatively connected to an internal gate terminal of the at least one first low-voltage heterojunction transistor and to the source terminal of the at least one main power heterojunction transistor;
a current control circuit comprising at least one resistor, wherein the current control circuit is operatively connected to the control terminal and to the pull-down circuit; and
wherein the auxiliary gate and current control circuits at least partially control a voltage and a current into the internal gate of the at least one main power heterojunction transistor; and
at least one monolithically integrated component, the at least one monolithically integrated component being one or more of a DC to DC converter circuit, a voltage regulator, and a gate voltage to logic signal clamping circuit;
wherein the gate voltage to logic signal clamping circuit is configured to receive an input signal and provide a magnitude limited output signal, wherein a magnitude of the output signal is limited to a set maximum voltage, and wherein the gate voltage to logic signal clamping circuit comprises a current source operatively connected in series between an input source and the output; and wherein the current control circuit at least partially controls a current into the pull down circuit and at least partially determines a control terminal voltage level at which the pull-down circuit actively pulls down a gate voltage of the at least one first low-voltage heterojunction transistor to clamp a voltage of the internal gate of the at least one main power heterojunction transistor.

* * * * *